US010283467B2

(12) United States Patent
Wu

(10) Patent No.: US 10,283,467 B2
(45) Date of Patent: May 7, 2019

(54) SEMICONDUCTOR PACKAGE

(71) Applicant: Chengwei Wu, New Taipei (TW)

(72) Inventor: Chengwei Wu, New Taipei (TW)

( * ) Notice: Subject to any disclaimer, the term of this patent is extended or adjusted under 35 U.S.C. 154(b) by 0 days.

(21) Appl. No.: 15/676,019

(22) Filed: Aug. 14, 2017

(65) Prior Publication Data

US 2018/0061787 A1 Mar. 1, 2018

Related U.S. Application Data

(60) Provisional application No. 62/380,997, filed on Aug. 29, 2016, provisional application No. 62/384,177, filed on Sep. 6, 2016.

(51) Int. Cl.

| | |
|---|---|
| ***H01L 23/00*** | (2006.01) |
| ***H01L 23/31*** | (2006.01) |
| ***H01L 23/498*** | (2006.01) |
| ***H01L 25/18*** | (2006.01) |
| ***H01L 23/13*** | (2006.01) |

(52) U.S. Cl.

CPC .............. *H01L 24/02* (2013.01); *H01L 23/13* (2013.01); *H01L 23/3128* (2013.01); *H01L 23/49816* (2013.01); *H01L 23/49827* (2013.01); *H01L 24/13* (2013.01); *H01L 24/17* (2013.01); *H01L 25/18* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01); *H01L 2224/0401* (2013.01); *H01L 2224/13022* (2013.01); *H01L 2224/13024* (2013.01); *H01L 2224/13101* (2013.01); *H01L 2224/16225* (2013.01); *H01L 2224/73204* (2013.01); *H01L 2924/15311* (2013.01)

(58) Field of Classification Search

CPC ............... H01L 24/02; H01L 23/49816; H01L 23/49827; H01L 24/13; H01L 25/18; H01L 23/3128; H01L 2224/73204; H01L 2224/0401; H01L 2224/13022; H01L 2224/02379; H01L 2224/02381; H01L 2224/13024; H01L 2224/02331; H01L 2224/02375; H01L 2224/02373

See application file for complete search history.

(56) References Cited

U.S. PATENT DOCUMENTS

2012/0074586 A1* 3/2012 Seo ......................... H01L 25/16 257/774
2017/0069532 A1* 3/2017 Lee ..................... H01L 23/5389
2017/0133309 A1* 5/2017 Kim .................. H01L 23/49811

* cited by examiner

*Primary Examiner* — Cuong B Nguyen

(74) *Attorney, Agent, or Firm* — WPAT, PC

(57) ABSTRACT

A semiconductor device is disclosed. The semiconductor device comprises a redistribution structure, a processor die, and a metal post. The metal post has a first end, and a second end. The metal post is connected to the redistribution structure at the first end. The first end has a first width. The second end has a second width. The metal post has a waist width. The first width is greater than the waist width. The second width is greater than the waist width. The metal post has a side surface. The side surface is inwardly curved or outwardly curved.

17 Claims, 50 Drawing Sheets

1900

SEMICONDUCTOR PACKAGE

FIELD OF THE INVENTION

The invention relates to semiconductor packages. More particularly, it relates to wafer level chip scale packages (WLCSP).

BACKGROUND OF THE INVENTION

In the semiconductor industry, the integration density within a die is growing rapidly. A die can include a huge amount of active and passive electronic devices so that a lot of functions can be performed within the die. The electronic devices are formed by semiconductor manufacturing processes on a silicon wafer. After the manufacturing processes of the electronic devices are finished, the wafer can be separated into many dies. Each die may then go through packaging processes so that a protection package is formed outside the die. The package for a die can also be an interface for connections between the die and a printed circuit board. Typical applications for integrated circuits include mobile phone systems, television systems, personal computer systems, and networking systems.

Many types of package have been developed, such as dual in-line pin package (DIP), quad flat package (QFP), ball grid array (BGA), and wafer level chip scale package (WLCSP). A DIP has connection pins on two parallel sides. DIPs usually use through-hole-mounting or sockets to be placed on printed circuit boards. DIPs usually comprise insulating materials filled around a metal lead frame.

A QFP usually has wing-like leads extending from four sides of the package. A QFP has connections only from the peripheral area of the package, so its pin count is limited. A BGA can use a whole surface to form an array of connections so that it can provide higher ball count. The length between the array of connections and the die is shorter, which is better for high speed signal transmission. A WLCSP can have a packaged device which is nearly the same size of a die. A WLCSP is generally smaller than a BGA package.

SUMMARY OF THE INVENTION

One objective of the invention is to provide a semiconductor device having a metal post with wider connection areas at both ends.

Another objective of the invention is to provide a semiconductor device having a metal post capable of connecting to a DRAM module through a molding material.

Still another objective of the invention is to provide a semiconductor device having a metal post with a wider connection area at an end connecting to a redistribution structure.

According to one aspect of the invention, a semiconductor device is disclosed. The semiconductor device comprises a redistribution structure, a processor die, and a metal post. The processor die has an active side and a back side. The active side faces a first direction. The active side of the processor die is connected to the redistribution structure.

The metal post has a first end, a second end and a waist. The metal post is connected to the redistribution structure at the first end. The first end faces the first direction. The first end has a first width. The second end has a second width. The waist has a waist width. The first width is greater than the waist width. The second width is greater than the waist width. The metal post has a side surface. The side surface is inwardly curved.

According to another aspect of the invention, a semiconductor device is disclosed. The semiconductor device comprises a redistribution structure, a processor die, and a metal post. The processor die has an active side and a back side. The active side faces a first direction. The active side of the processor die is connected to the redistribution structure.

The metal post has a first end, a second end and a waist. The metal post is connected to the redistribution structure at the first end. The first end faces the first direction. The first end has a first width. The second end has a second width. The waist has a waist width. The first width is greater than the second width. The second width is greater than the waist width. The metal post has a side surface. The side surface is inwardly curved.

DETAILED DESCRIPTION OF THE INVENTION

Figure 1:
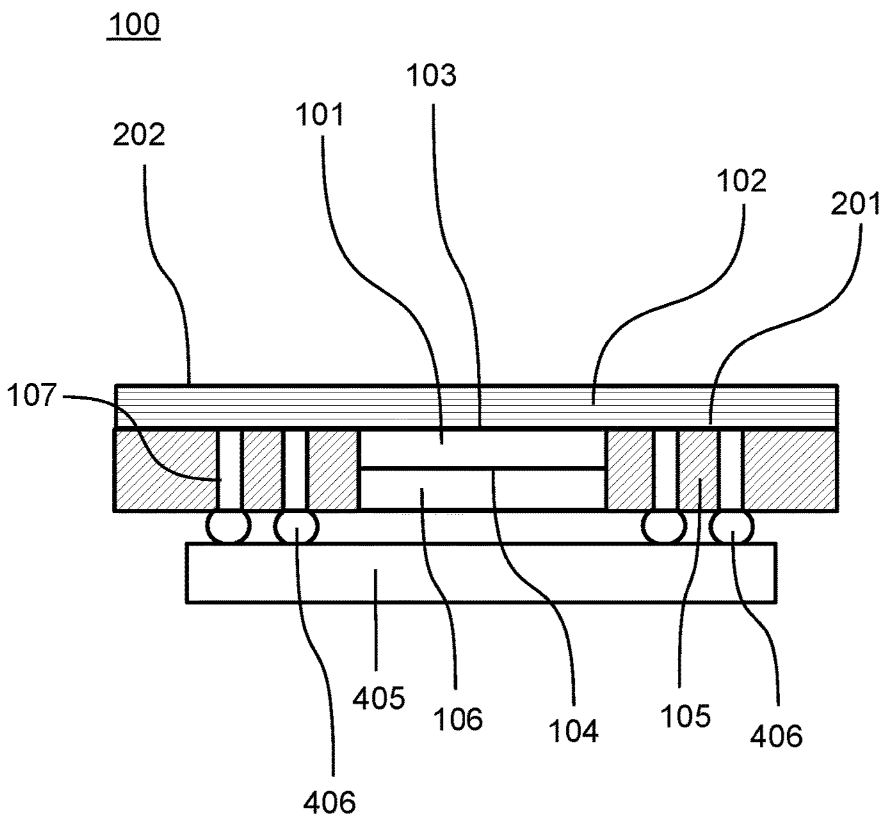
FIG. 1 shows an embodiment of a semiconductor device.
Figure 2:
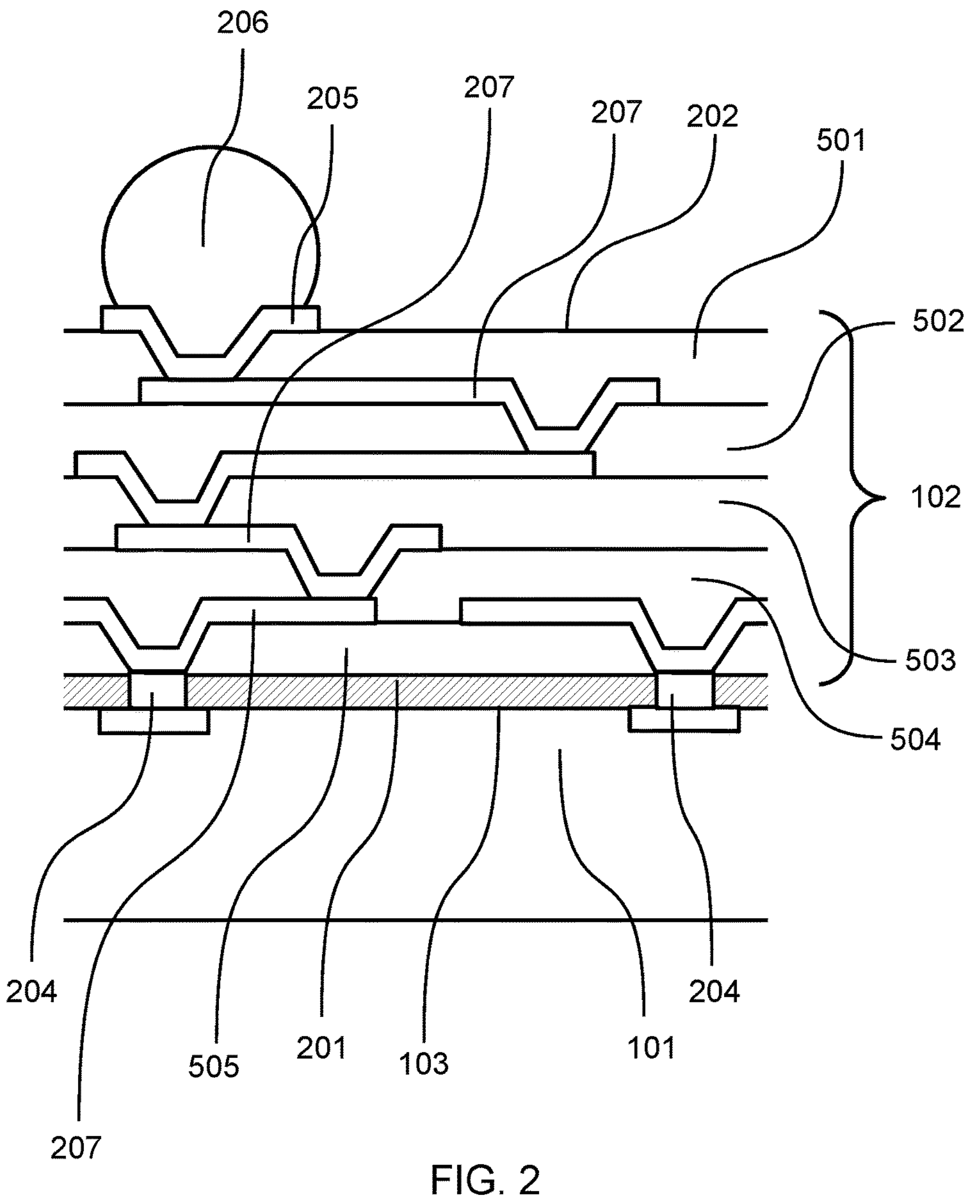
FIG. 2 shows a cross-sectional view of a redistribution structure.
Figure 3:
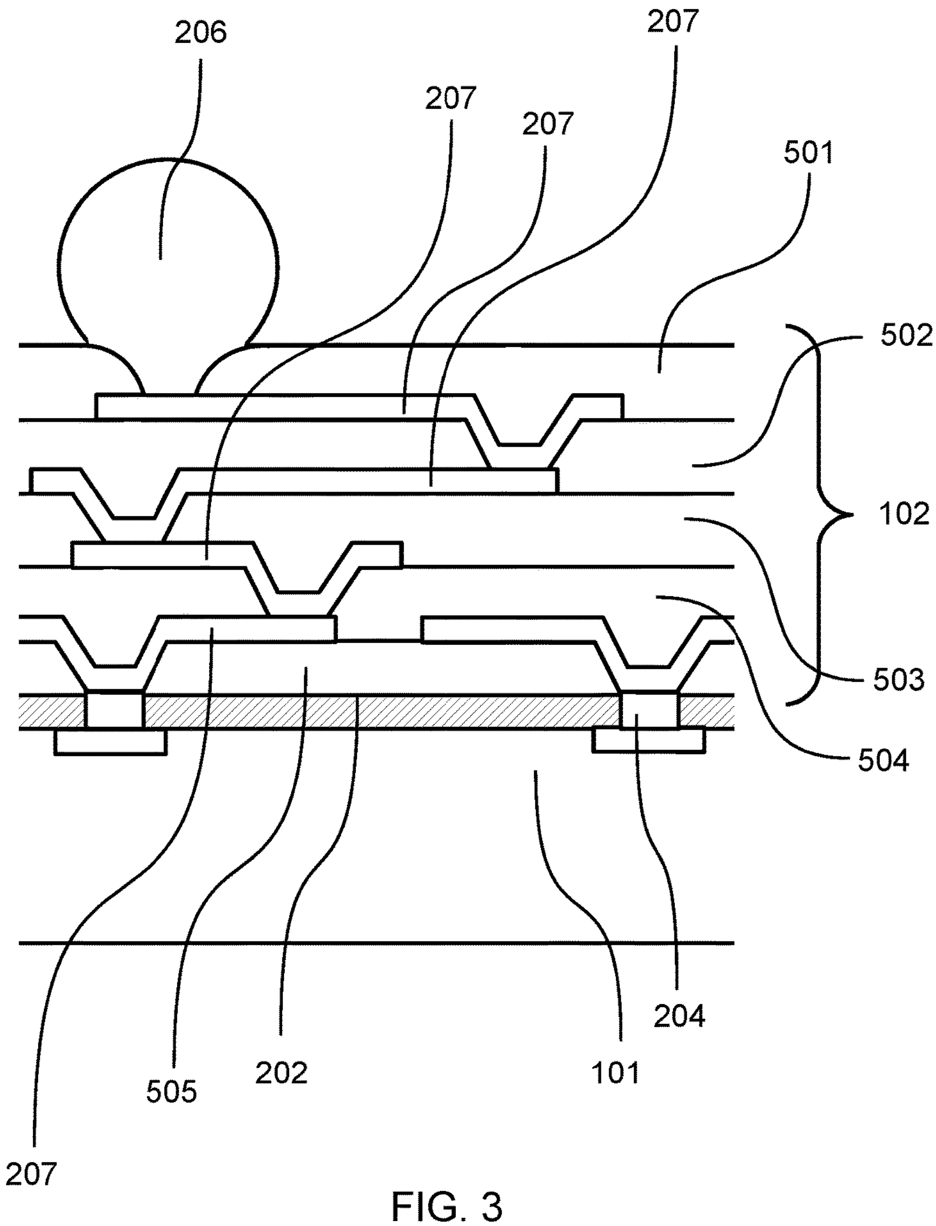
FIG. 3 shows a cross-sectional view of another redistribution structure.
Figure 4:
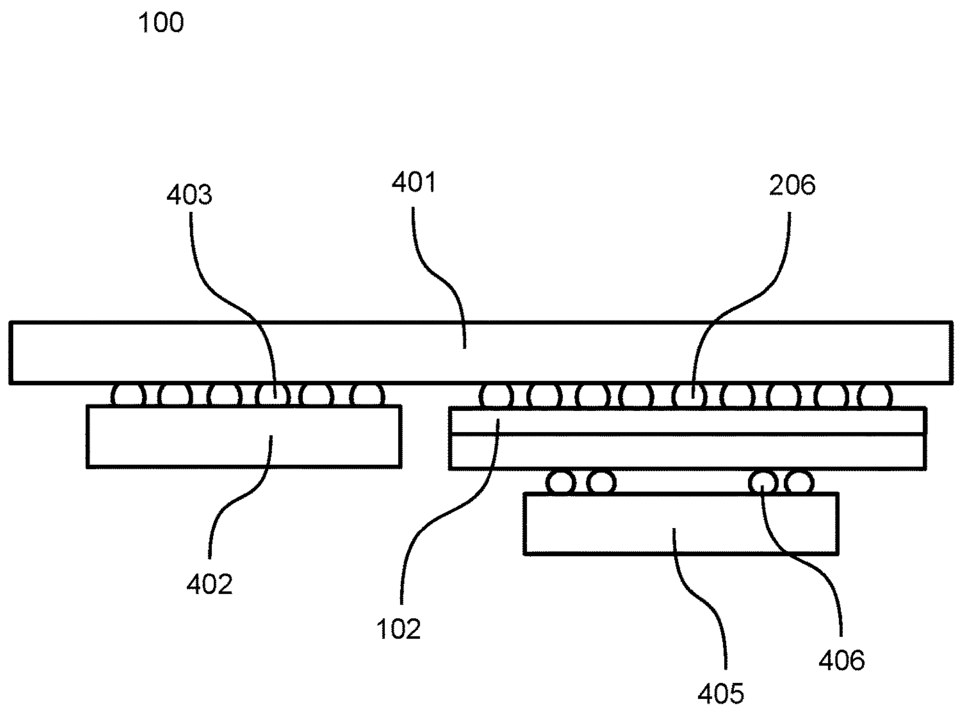
FIG. 4 shows an embodiment of a semiconductor device.
Figure 5:
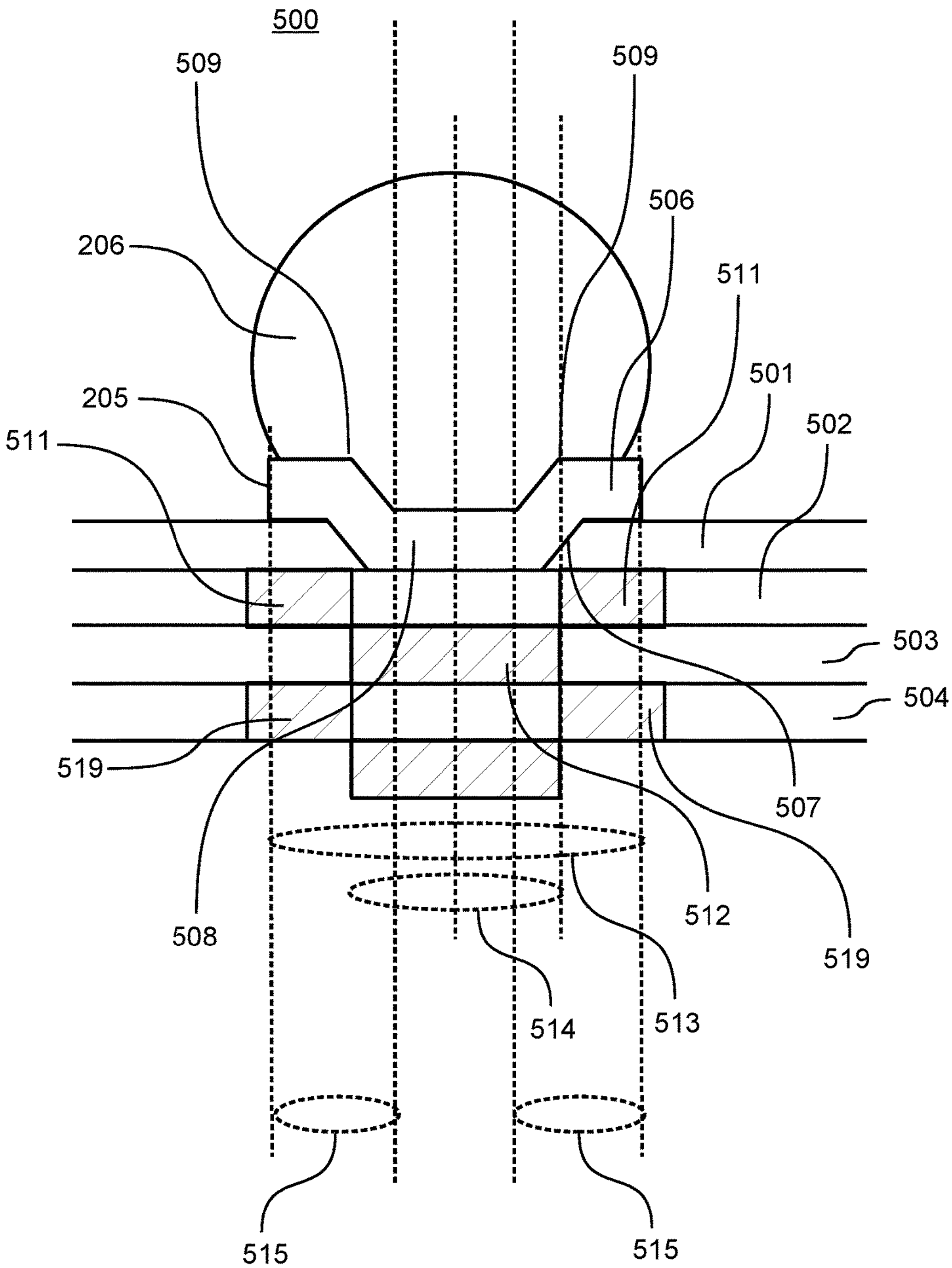
FIG. 5 shows a cross-sectional view of a connection structure.
Figure 6:
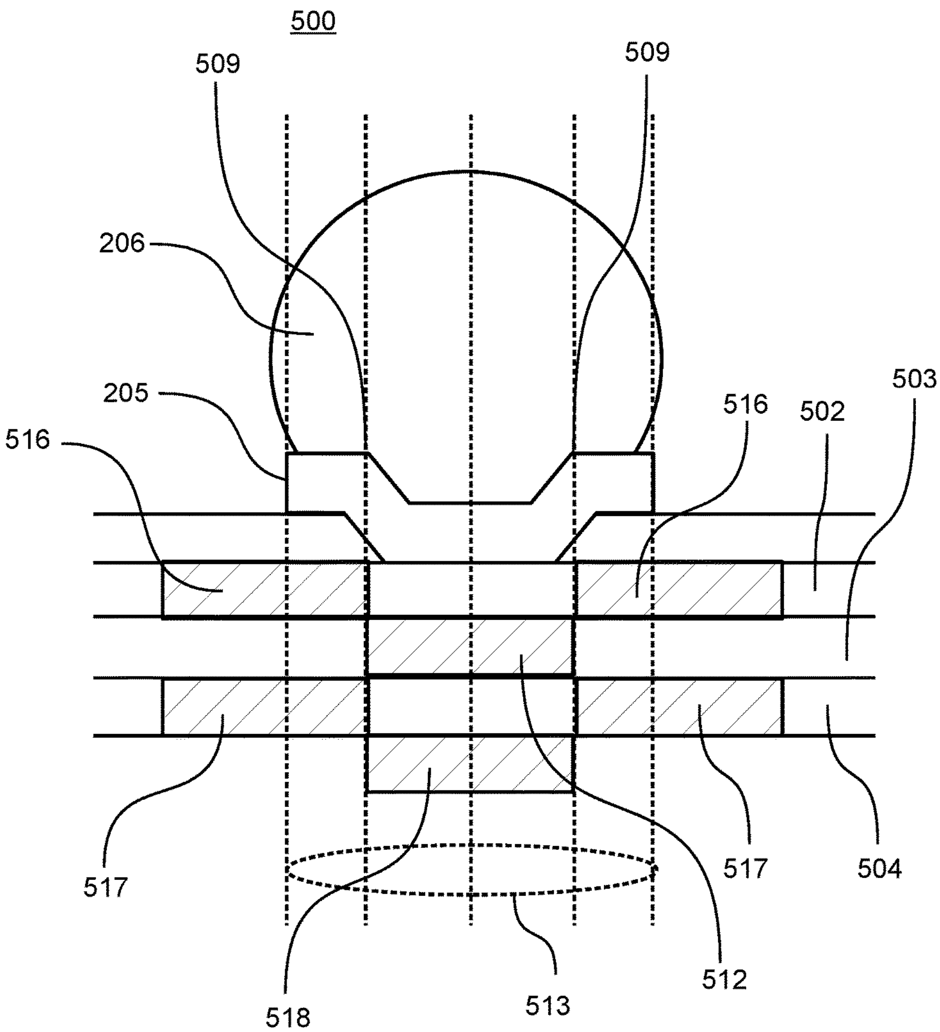
FIG. 6 shows a cross-sectional view of another connection structure.
Figure 7:
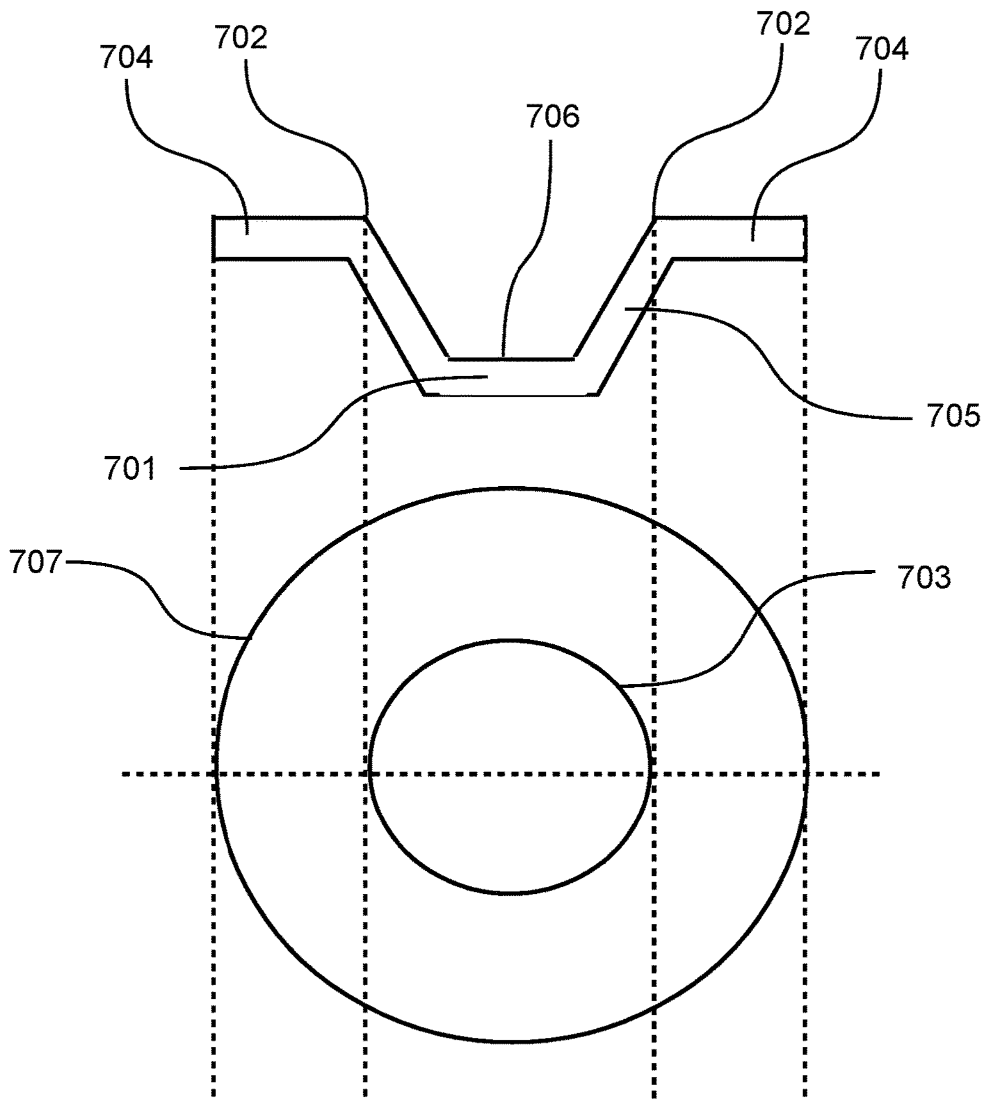
FIG. 7 shows a cross-sectional view and a top view of a via.
Figure 8:
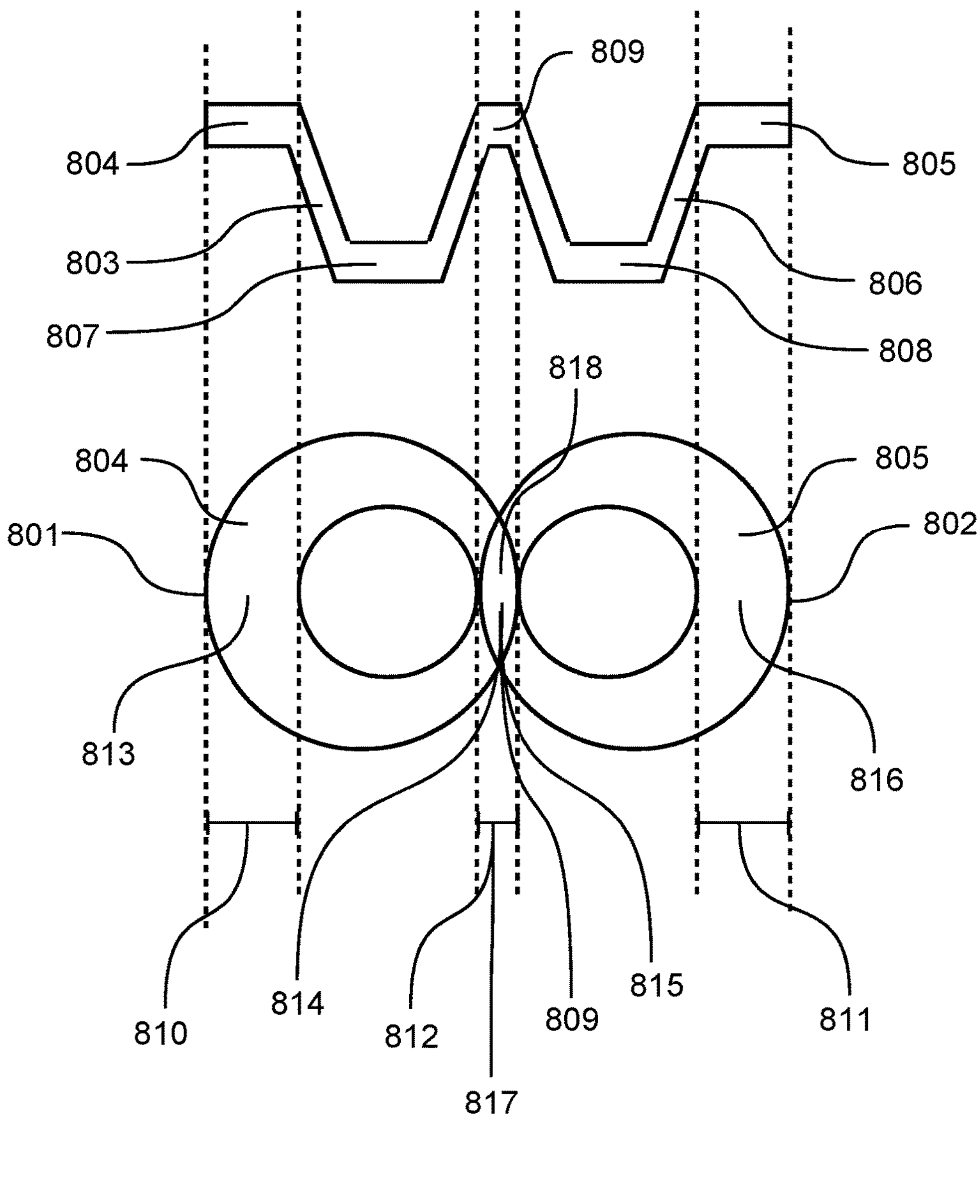
FIG. 8 shows a cross-sectional view and a top view of two vias.
Figure 9:
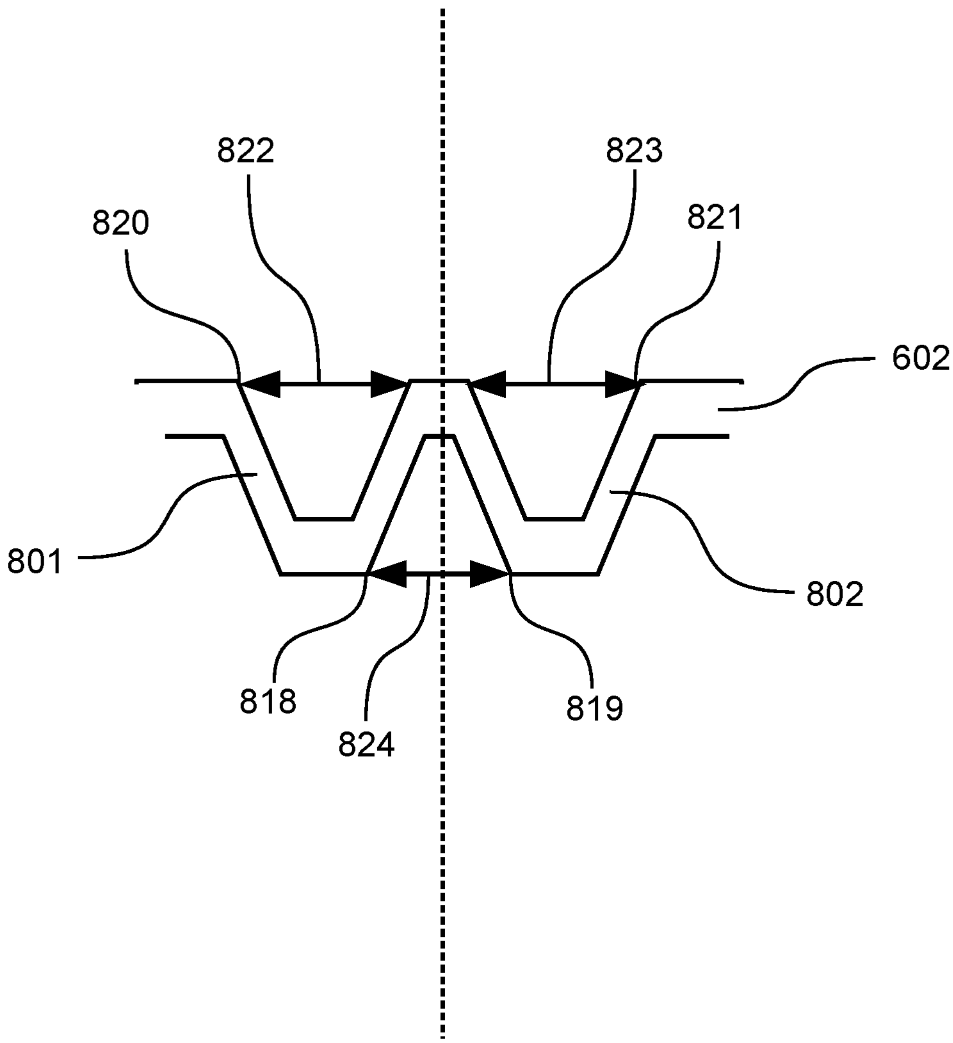
FIG. 9 shows a cross-sectional view of two vias.

FIG. 1 shows an embodiment of a semiconductor device. FIG. 2 shows a cross-sectional view of a redistribution structure. FIG. 3 shows a cross-sectional view of another redistribution structure. FIG. 4 shows an embodiment of a semiconductor device. FIG. 5 shows a cross-sectional view of a connection structure. FIG. 6 shows a cross-sectional view of another connection structure. FIG. 7 shows a cross-sectional view and a top view of a via. FIG. 8 shows a cross-sectional view and a top view of two vias. FIG. 9 shows a cross-sectional view of two vias.

Figure 10:
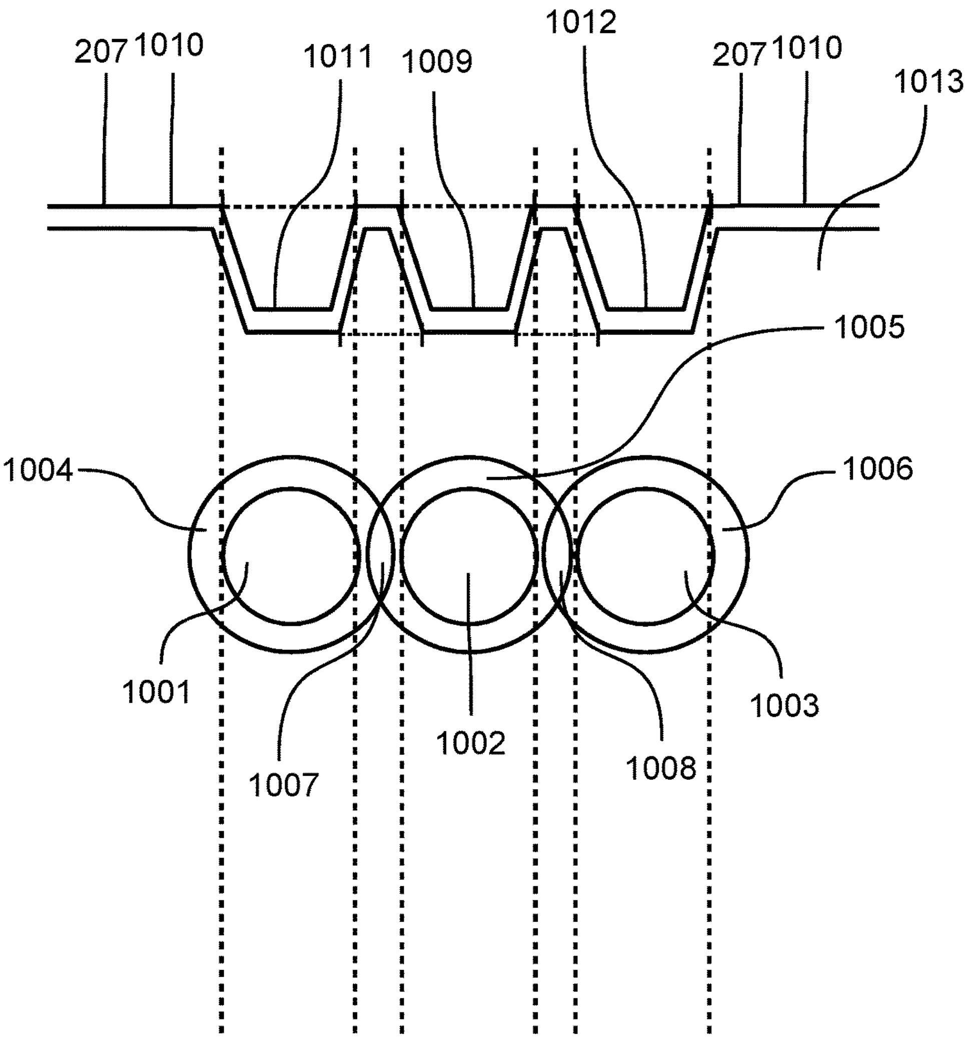
FIG. 10 shows a cross-sectional view and a top view of three vias.
Figure 11:
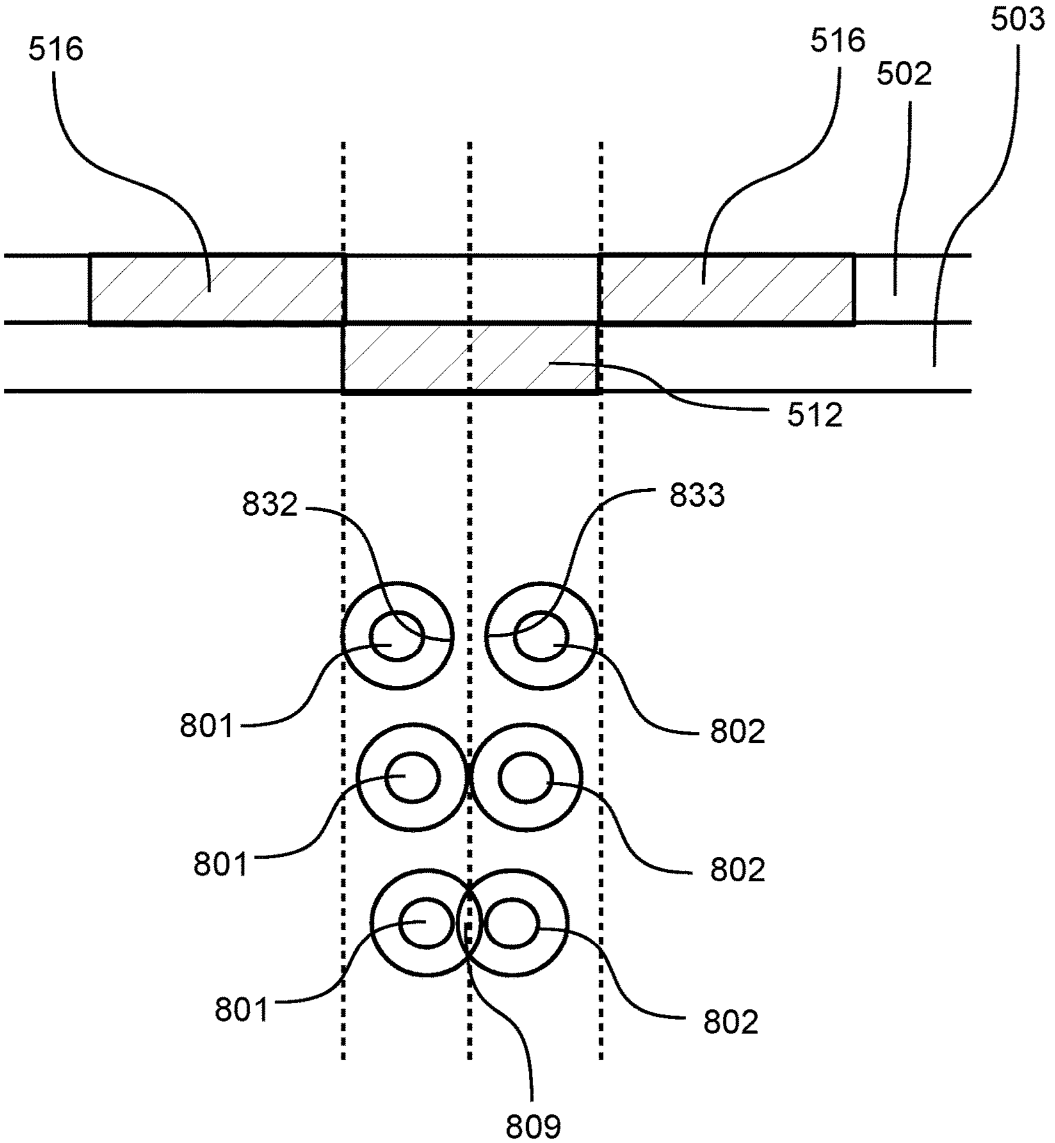
FIG. 11 shows a cross-sectional view of via zones and top views of two vias.
Figure 12:
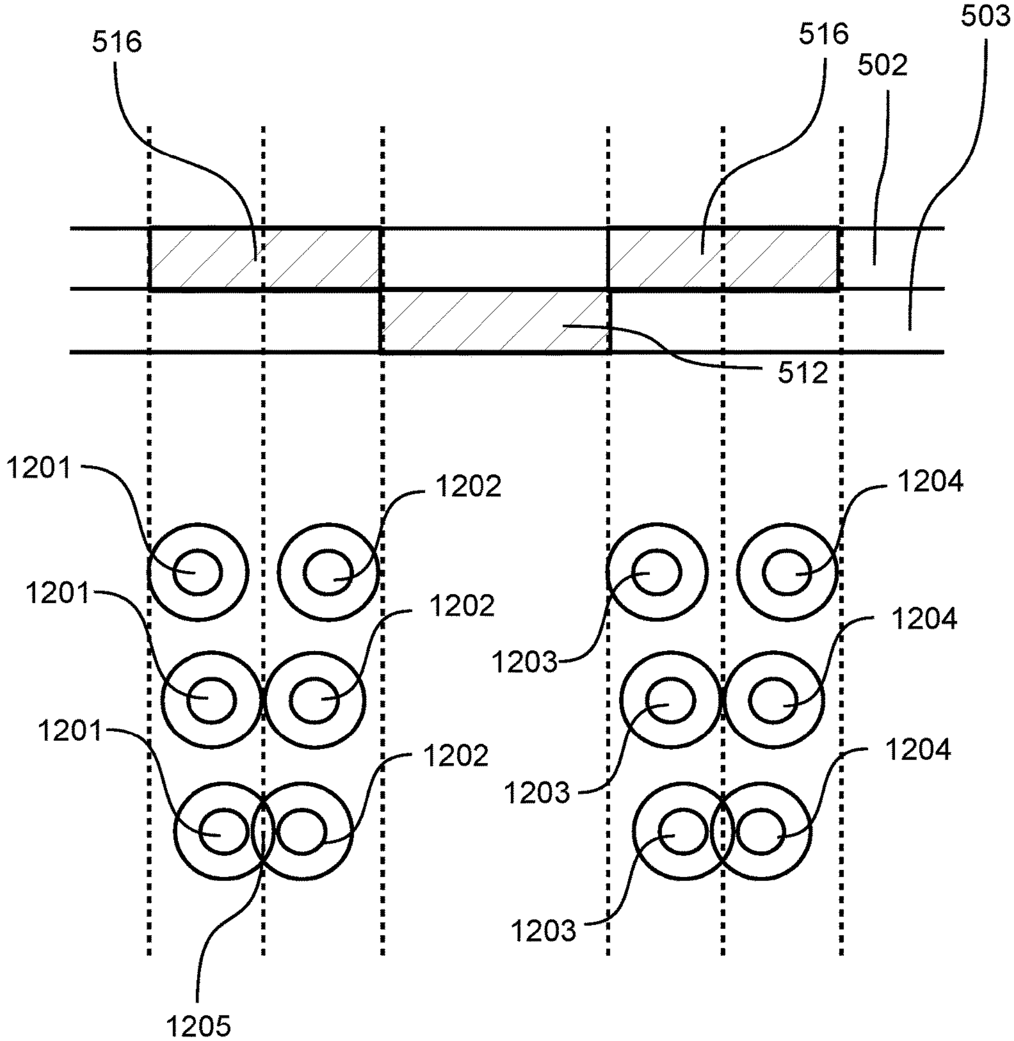
FIG. 12 shows a cross-sectional view of via zones and top views of four vias.
Figure 13:
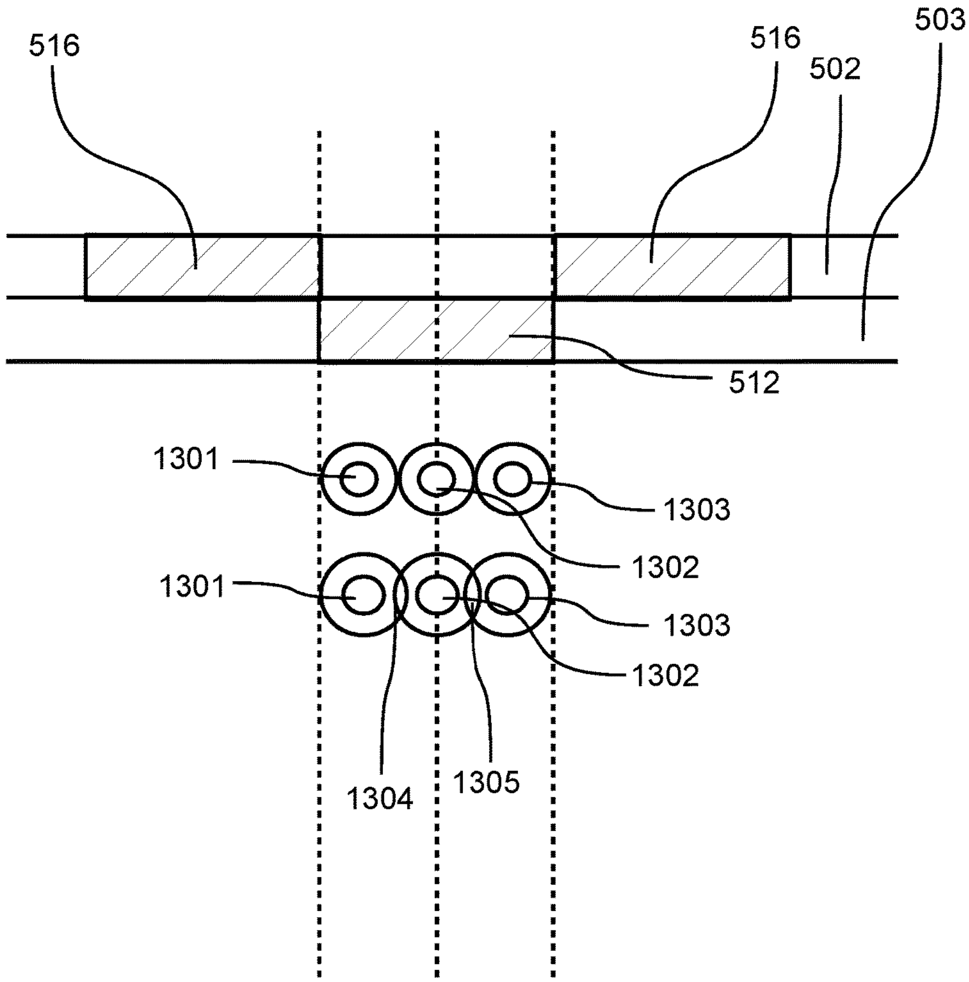
FIG. 13 shows a cross-sectional view of via zones and top views of three vias.
Figure 14:
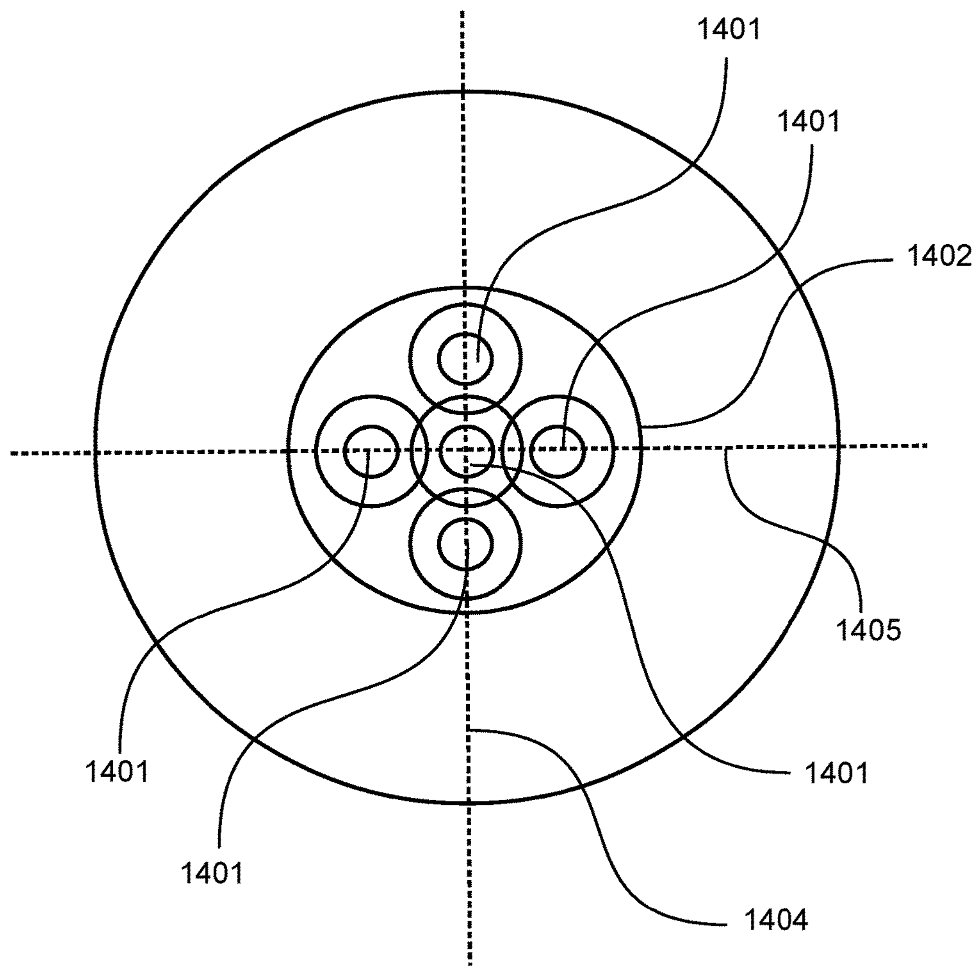
FIG. 14 shows a top view of five vias.
Figure 15:
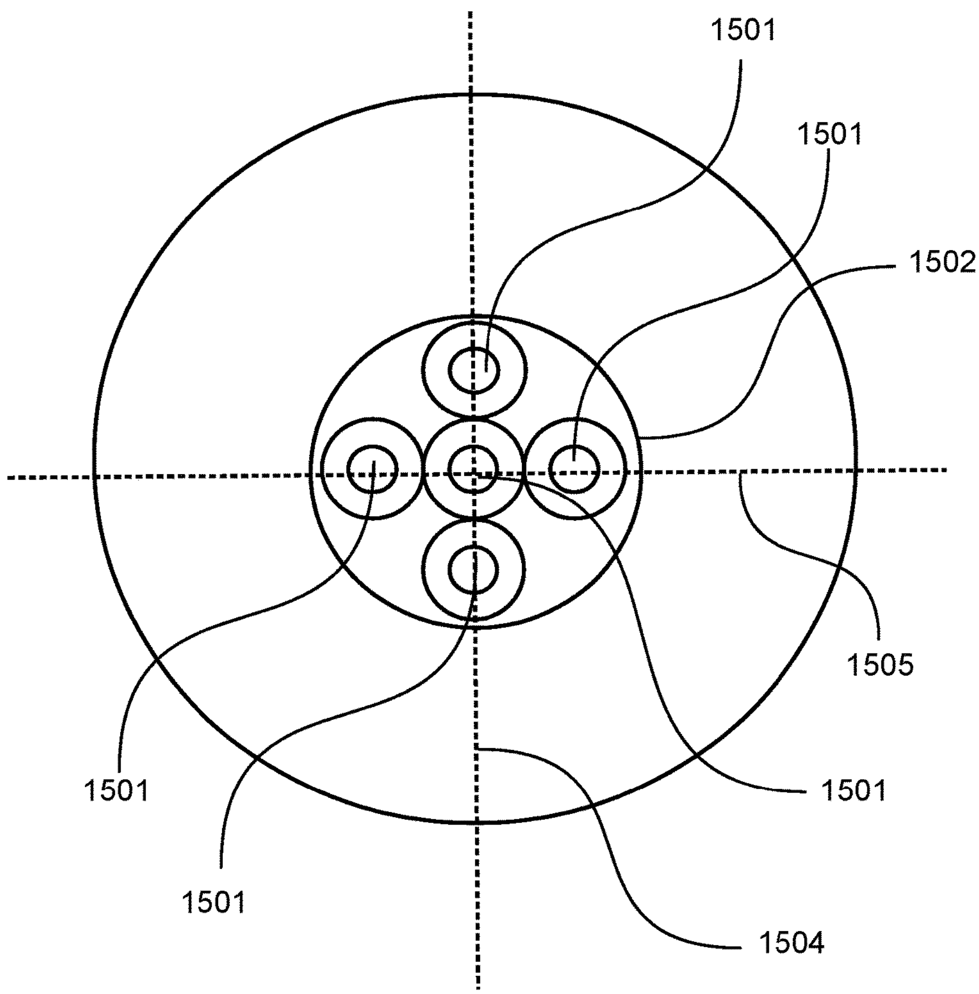
FIG. 15 shows a top view of five vias.
Figure 16:
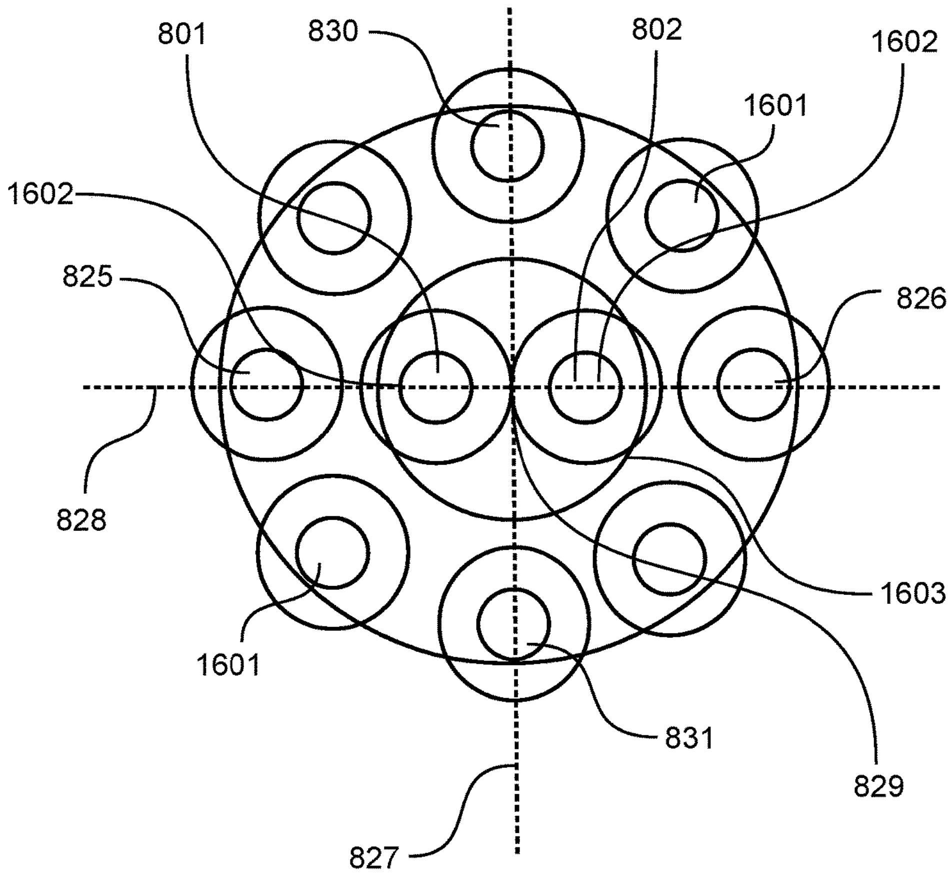
FIG. 16 shows a top view of a plurality of vias.
Figure 17:
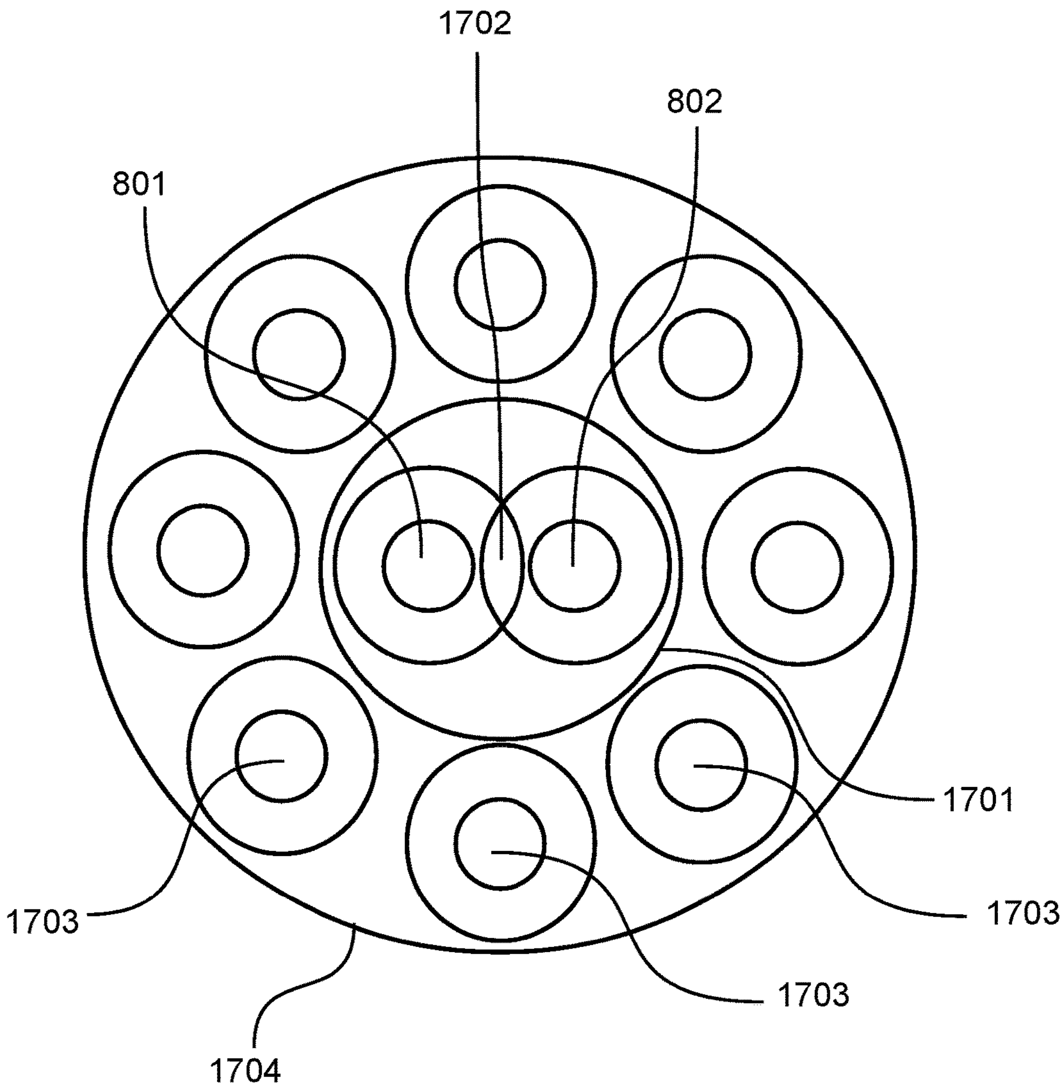
FIG. 17 shows a top view of a plurality of vias.
Figure 18:
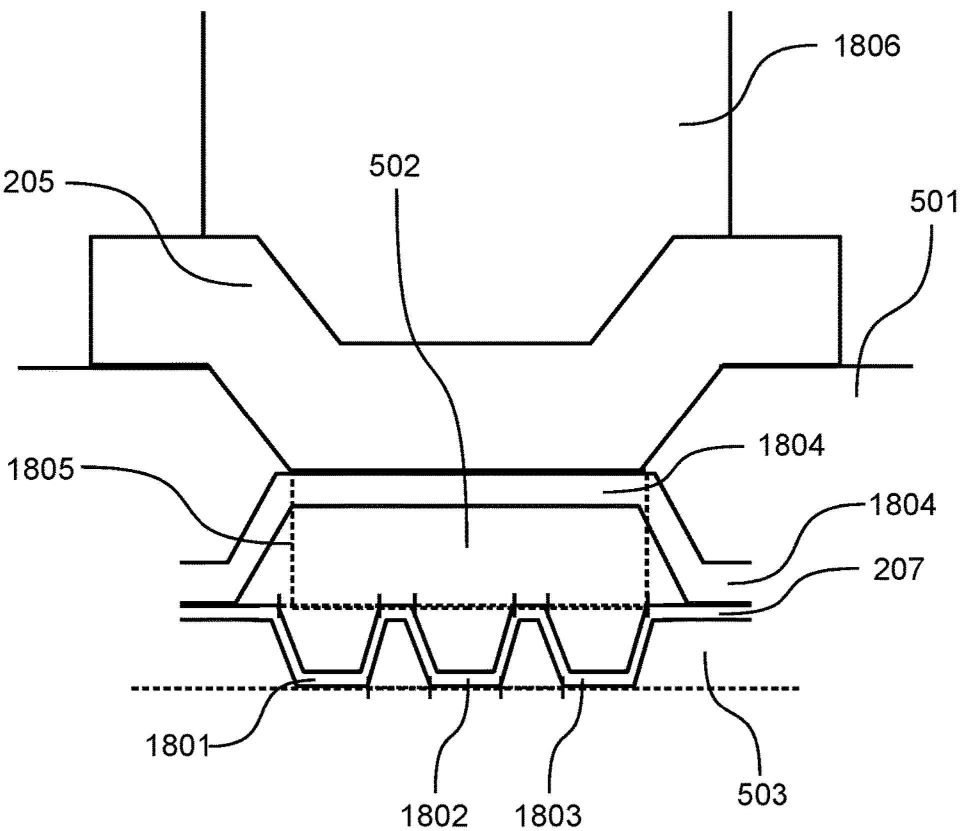
FIG. 18 shows a cross-sectional view of a connection structure.

FIG. 10 shows a cross-sectional view and a top view of three vias. FIG. 11 shows a cross-sectional view of via zones and top views of two vias. FIG. 12 shows a cross-sectional view of via zones and top views of four vias. FIG. 13 shows a cross-sectional view of via zones and top views of three vias. FIG. 14 shows a top view of five vias. FIG. 15 shows a top view of five vias. FIG. 16 shows a top view of a plurality of vias. FIG. 17 shows a top view of a plurality of vias. FIG. 18 shows a cross-sectional view of a connection structure.

According to an embodiment, with reference to FIG. 1 and FIG. 5, a connection structure 500 is disclosed. The connection structure 500 comprises a conductive unit 205, a solder bump 206, a first insulating layer 501, a second insulating layer 502, a third insulating layer 503, and a plurality of vias 1602. The conductive unit 205 has a rim 509. The conductive unit 205 comprises a flange 506, a slanting side wall 507, and a base 508. The solder bump 206 is located on the conductive unit 205. The solder bump 206 is in direct contact with the conductive unit 205. The rim 509 is a curve (viewed from the top of the conductive unit 205) where the flange 506 meets the slanting side wall 507.

The first insulating layer 501 is located under the flange 506. The second insulating layer 502 is located under the base 508 of the conductive unit 205. The third insulating layer 503 is located under the second insulating layer 502. The third insulating layer 503 has a via zone 512. The plurality of vias 1602 are located in the via zone 512. The via zone 512 is within a vertical projection 513 of the conductive unit 205.

The solder bump includes without limitation both lead-based and lead-free solders, such as Pb—Sn compositions for lead-based solder, and lead-free solders including tin, copper, and silver, or "SAC" compositions, and other eutectics that have a common melting point and form conductive solder connections in electrical applications. In some embodiments, the conductive unit 250 includes under bump metal (UBM). In some embodiments, UBM structures include one or more metallic layers, such as layers of titanium and of copper. The UBM can be formed by deposition.

In some embodiments, with reference to FIG. 1, FIG. 5, and FIG. 16, the via zone 512 is a second via zone 512. The second insulating layer 502 has a first via zone 511. The connection structure 500 comprises a plurality of first vias 1601 located in the first via zone 511. The plurality of first vias 1601 are not located beneath the base 508 of the conductive unit 205. In some embodiments, the via zone 512 is within a vertical projection of the rim 509.

In some embodiments, most part of the first via zone 511 is under the base 508 and the slanting side wall 507. That is, most part of the first via zone 511 is under a vertical projection 515 of the base 506 and the slanting side wall 507. A via zone is where vias are allowed to be implemented. In some embodiments, vias are not allowed to be implemented outside a via zone. In some embodiments, the vertical projection 515 is a ring shape from a top view.

With reference to FIG. 5 and FIG. 6, a via zone 516 is twice as large as the first via zone 511 from the cross sectional view. It means that the via zone 516 has more space for implementing vias. A via zone 517 that is the same as the via zone 516 is formed in a fourth insulating layer 504. That is, the via zone 517 allows the same number of vias as the via zone 516 to implement therein. In some embodiments, the number of vias in the via zone 516 is the same as the number of vias in the via zone 507. In some embodiments, each of the vias in the via zone 516 has a corresponding via in the via zone 517. In some embodiments, the corresponding vias in the via zone 516 and the via zone 517 are aligned vertically.

The insulating layers 501, 502, 503, and 504 can be polyimide, BCB (Benzocyclobutene), PBO (PolyBenzobisOxazole), or other material having similar insulating properties.

In some embodiments, the redistribution structure 102 further has a via zone 518. The via zone 518 is the same size as the via zone 512 and allows the same number of vias to be implemented. That is, when the via zone 512 can allow 4 vias to implement, the via zone 518 can also allow 4 vias to implement. In some embodiments, each via in the via zone 512 has a corresponding via in the via zone 518. In some embodiments, the corresponding vias in the via zone 512 and the via zone 518 are aligned vertically.

With reference to FIG. 7, a via 701 comprises a flange 704, a slanting side wall 705, and a base 706. The via 701's corresponding top view can be represented by two rings. The inner ring 703 represents a top view of a rim 702. The rim 702 is a curve where a flange 704 meets the slanting side wall 705. The outer ring 707 is a top view of a circular edge of the via 701.

In some embodiments, with reference to FIG. 8, the plurality of vias 1602 comprises a first via 801 and a second via 802. The first via 801 comprises a first via flange 804, a first via slanting wall 803, and a first via base 807. The second via 802 comprises a second via flange 805, a second via slanting wall 806, and a second via base 808. The first via flange 804 and the second via flange 805 have an overlapped area 809. In some embodiments, the first via flange 804 is an annular flange with a uniform width. In some embodiments, the first via flange 804 is an annular flange with a nonuniform width.

In some embodiments, the first via flange 804 has a first width 810 at a first location 813 and a second width 812 at a second location 814. The second location 814 is closer to a central point 815 of the overlapped area 809 than the first location 813. In some embodiments, the second via flange 805 is an annular flange with a uniform width. In some embodiments, the second via flange 805 is an annular flange with a nonuniform width. In some embodiments, the second via flange 805 has a first width 811 at a first location 816 and a second width 817 at a second location 818. The second location 818 is closer to a central point 815 of the overlapped area 809 than the first location 816.

According to another embodiment, with reference to FIG. 1, FIG. 2, FIG. 4, and FIG. 5, a semiconductor device 100 is disclosed. The semiconductor device 100 comprises a die 101, a redistribution structure 102, a printed circuit board 401, and a nonvolatile memory module 402. The die 101 has an active side 103 and a back side 104.

The redistribution structure 102 has a front surface 201 and a back surface 202. The front surface 201 is connected to the active side 103 of the die 101 through a set of metal pillars 204. The redistribution structure 102 comprises a conductive unit 205, a first solder bump 206, a first insulating layer 501, a second insulating layer 502, a third insulating layer 503, and a plurality of vias 1602. The conductive unit 205 has a rim 509. The metal pillars 204 can be aluminum (Al), copper (Cu), tin (Sn), nickel (Ni), gold (Au), or silver (Ag), or other suitable electrically conductive material.

The conductive unit 205 comprises a flange 506, a slanting side wall 507, and a base 508. The back surface 202 is a surface of the first insulating layer 501. The first solder bump 206 is located on the conductive unit 205. The first solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502. The third insulating layer 503 has a via zone 512. The plurality of vias 1602 are located in the via zone 512. The via zone 512 is within a vertical projection 513 of the conductive unit 205.

The redistribution structure 102 is connected to the printed circuit board 401 through the solder bumps 206. The nonvolatile memory module 402 is connected to the printed circuit board 401 through a plurality of second solder bumps 403. A DRAM (Dynamic Random Access Memory) module 405 is connected to the redistribution structure 102 through a plurality of third solder bumps 406 and a plurality of metal posts 107. The metal posts 107 can be formed by plating. The material for the metal post 107 can be Cu, Al, W, Au, solder, or other suitable electrically conductive material.

In some embodiments, the metal posts 107 are connected to the redistribution structure 102 and the solder bumps 406. Electrical signals can be transmitted between the redistribution structure 102 and the DRAM module 405 through the metal posts 107. In some embodiments, the nonvolatile memory module 402 is a Flash memory module.

In some embodiments, an adhesive layer 106 is located on the back side 104 of the die 101. A molding material 105 is filled between the die 101 and the metal posts 107. The molding material 105 is in direct contact with the redistribution structure 102. The adhesive layer 106 can be a die attach film (DAF), or the like. The molding material 105 can be a polymer composite material, such as epoxy resin with filler, epoxy acrylate with filler, or polymer with proper filler.

In some embodiments, with reference to FIG. 2, the redistribution structure 102 further comprises a fourth insulating layer 504 and a fifth insulating layer 505. Metal traces 207 are formed on surfaces of the second insulating layer 502, the third insulating layer 503, the fourth insulating layer 504, and the fifth insulating layer 505 to form proper connections between vias. The metal traces 207 can be aluminum (Al), copper (Cu), tin (Sn), nickel (Ni), gold (Au), or silver (Ag), or other suitable electrically conductive material.

In some embodiments, with reference to FIG. 2 and FIG. 3, the conductive unit 205 is not needed. The solder bump 206 is directly connected to the trace 207. In some embodiments, there are four or more than four insulating layers in the redistribution structure 102. The thickness of metal trace for each insulating layer can be different. For example, the thickness of metal trace in an upper insulating layer can be greater than the thickness of metal trace in a lower insulating layer. The thickness difference between metal traces of adjacent insulating layers can also be different. For example, a first thickness difference is defined as the difference between the thickness of metal trace in the first insulating layer 501 and the thickness of metal trace in the second insulating layer 502. A second thickness difference is defined as the difference between the thickness of metal trace in the second insulating layer 502 and the thickness of metal trace in the third insulating layer 503, and so on. Then we can have a first thickness difference, a second thickness difference, a third thickness difference, and so on, depending on the number of insulating layers. In some embodiments, the first thickness difference, the second thickness difference, the third difference are substantially the same. In some embodiments, the first thickness difference is smaller than the the second thickness difference and the second thickness difference is greater than the third thickness difference. That is, there can be a more significant thickness difference of metal traces between adjacent insulating layers in the middle of the redistribution structure. This case can have advantages. For example, using similar metal trace thickness in a first group of insulating layers and then changing into another metal trace thickness in a second group of insulating layers can save the complexity of adjusting metal trace thickness for each insulating layer.

In some embodiments, the via zone 512 is a second via zone 512. The second insulating layer 502 has a first via zone 511. With reference to FIG. 16, the semiconductor device 100 further comprises a plurality of first vias 1601 located in the first via zone 511. The plurality of first vias 1601 are not located beneath the base 506 of the conductive unit 205.

According to another embodiment, with reference to FIG. 1, FIG. 5, and FIG. 9, a connection structure 500 comprises a conductive unit 205, a solder bump 206, a first insulating layer 501, a second insulating layer 502, a third insulating layer 503, a first via 801, and a second via 802. The conductive unit 205 has a rim 509. The conductive unit 205 comprises a flange 506, a slanting side wall 507, and a base

508. The solder bump 206 is located on the conductive unit 205. The solder bump 206 is in direct contact with the conductive unit 205.

The first insulating layer 501 is located under the flange 506. The second insulating layer 502 is located under the base 508 of the conductive unit 205. The third insulating layer 503 is located under the second insulating layer 502.

The first via 801 has a first via rim 820. The first via rim 820 has a first via rim diameter 822. The first via 801 has a first via bottom edge 818. The first via 801 is within a vertical projection of the conductive unit 205. The second via 802 has a second via rim 821. The second via rim 821 has a second rim diameter 823. The second via 802 has a second via bottom edge 819. The second via 802 is within the vertical projection of the conductive unit 205. A bottom edge distance 824 is a distance between the first via bottom edge 818 and the second via bottom edge 819. The first rim diameter 822 is greater than the bottom edge distance 824.

With reference to FIG. 5, FIG. 6, and FIG. 10, in some embodiments, three vias 1001, 1002, and 1003 are implemented within the via zone 511. The three vias 1001, 1002, and 1003 are within the vertical projection of the conductive unit 205. In some embodiments, the three vias 1001, 1002, and 1003 are located within the vertical projection of the rim 509. The via 1001 has a flange 1004. The via 1002 has a flange 1005. The via 1003 has a flange 1006. The flange 1004 and the flange 1005 have an overlapped area 1007. The flange 1005 and the flange 1006 have an overlapped area 1008.

With the overlapped areas 1007 and 1008, the three vias 1001, 1002, and 1003 are located more closely. The closely located vias 1001, 1002, 1003 have the function of reducing stress. For the via 1002, the existence of the via 1001 and the via 1003 makes a surface 1010 rugged on both sides of the via 1001, so that the stress applied onto a base 1009 of the via 1002 is reduced. The surface 1010 is a surface formed by the vias 1001, 1003, and traces 207 on an insulating layer 1013. Similarly, the stress applied onto a base 1011 of the via 1001 is reduced. The stress applied onto a base 1012 of the via 1003 is also reduced.

In some embodiments, with reference to FIG. 16, the connection structure 500 further comprises a plurality of vias 1601 located within the second insulating layer 502. No via of the second insulating layer 502 is located beneath the base 508 of the conductive unit 205. In some embodiments, the first via 801 and the second via 802 are within a vertical projection of the rim 509.

In some embodiments, with reference to FIG. 8, the first via 801 comprises a first via flange 804, a first via slanting wall 803, and a first via base 807. The second via 802 comprises a second via flange 805, a second via slanting wall 806, and a second via base 808. The first via flange 804 and the second via flange 805 have an overlapped area 809.

In some embodiments, the first via flange 804 is an annular flange with a uniform width. In some embodiments, the first via flange 804 is an annular flange with a nonuniform width. In some embodiments, the first via flange 804 has a first width 810 at a first location 813 and a second width 812 at a second location 814. The second location 814 is closer to a central point 815 of the overlapped area 809 than the first location 813.

According to another embodiment, with reference to FIG. 1, FIG. 4, FIG. 5, and FIG. 9, a semiconductor device 100 comprises a die 101, a redistribution structure 102, a printed circuit board 401, a nonvolatile memory module 402, and a DRAM module 405.

The die 101 has an active side 103 and a back side 104. The redistribution structure 102 has a front surface 201 and a back surface 202. The front surface 201 is connected to the active side 103 of the die 101 through a set of metal pillars 204. The redistribution structure 102 comprises a conductive unit 205, a solder bump 206, a first insulating layer 501, a second insulating layer 502, a third insulating layer 503, a first via 801, and a second via 802. The back surface 202 is a surface of the first insulating layer 501.

The conductive unit 205 has a rim 509. The conductive unit 205 comprises a flange 506, a slanting side wall 507, and a base 508. The solder bump 206 is located on the conductive unit 205. The solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502.

With reference to FIG. 5 and FIG. 9, the first via 801 has a first via rim 820. The first via 801 and the second via 802 are implemented in the via zone 512. The first via rim 820 has a first via rim diameter 822. The first via 801 has a first via bottom edge 818. The first via 801 is within a vertical projection of the conductive unit 205. The second via 802 has a second via rim 821. The second via rim 821 has a second rim diameter 823. The second via 802 has a second via bottom edge 819. The second via 802 is within the vertical projection of the conductive unit 205. A bottom edge distance 824 is a distance between the first via bottom edge 818 and the second via bottom edge 819. The first rim diameter 822 is greater than the bottom edge distance 824.

With reference to FIG. 4, the redistribution structure 102 is connected to the printed circuit board 401 through the solder bumps 206. The nonvolatile memory module 402 is connected to the printed circuit board 401 through a plurality of second solder bumps 403. With reference to FIG. 1 and FIG. 4, the DRAM module 405 is connected to the redistribution structure 102 through a plurality of third solder bumps 406 and a plurality of metal posts 107. In some embodiments, no via of the second insulating layer 502 is located beneath the base 508 of the conductive unit 205.

According to another embodiment, with reference to FIG. 1, FIG. 5, and FIG. 9, and FIG. 16, a connection structure 500 comprises a conductive unit 205, a solder bump 206, a first insulating layer 501, a second insulating layer 502, a third insulating layer 503, a first via 801, a second via 802, a third via 825, and a fourth via 826.

The conductive unit 205 has a rim 509. The conductive unit 205 comprises a flange 506, a slanting side wall 507, and a base 508. The solder bump 206 is located on the conductive unit 205. The solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502.

The first via 801 is located in the third insulating layer 503. More than half of the first via 801 is within a vertical projection of the rim 509 of the conductive unit 205. The second via 802 is located in the third insulating layer 503. More than half of the second via 802 is within the vertical projection of the rim 509 of the conductive unit 205.

The third via 825 is located in the second insulating layer 502. More than half of the third via 825 is within a vertical projection of the flange 506 and the slanting side wall 507 of the conductive unit 205. The fourth via 826 is located in the second insulating layer 502. More than half of the fourth via 826 is within the vertical projection of the flange 506 and the slanting side wall 507 of the conductive unit 205.

In some embodiments, the first via 801, the second via 802, the third via 825, and the fourth via 826 are symmetric with respect to a first axis 827. In some embodiments, the first via 801, the second via 802, the third via 825, and the fourth via 826 are lined up along a second axis 828. In some embodiments, the connection structure 500 further comprises a fifth via 830 and a sixth via 831. More than half of the fifth via 830 is within the vertical projection of the flange 506 and the slanting side wall 507 of the conductive unit 205. More than half of the sixth via 831 is within the vertical projection of the flange 506 and the slanting side wall 507. The vias 801, 802, 825, 826, 830, and 831 can be aluminum, copper, tungsten, gold, silver, or other suitable electrically conductive material. The method of forming the metal vias can be plating.

With reference to FIG. 5 and FIG. 16, in some embodiments, a plurality of vias are implemented in a via zone 519 of an insulating layer 504. The insulating layer 504 is located beneath the insulating layer 503. In some embodiments, the vias in the via zone 519 are corresponding to the vias in the via zone 511. In some embodiments, the vias in the via zone 511 are vertically aligned with the vias in the via zone 519. In some embodiments, the number of vias in the via zone 511 is the same as the number of vias in the via zone 519.

In some embodiments, the vias in the via zone 519 have the same arrangement as the vias in the via zone 511. In some embodiments, a thickness of bases of vias in the via zone 519 is smaller than a thickness of bases of vias in the via zone 511. In some embodiments, with reference to FIG. 2 and FIG. 5, the conductive unit 205, all vias in the via zone 511, all vias in the via zone 512, all vias in the via zone 519 are electrically connected through metal traces 207 in each insulating layer.

In some embodiments, with reference to FIG. 16, the third via 825, the fourth via 826, the fifth via 830, and the sixth via 831 are symmetric with respect to a central point 829. In some embodiments, with reference to FIG. 8, the first via 801 comprises a first via flange 804, a first via slanting wall 803, and a first via base 807. The second via 802 comprises a second via flange 805, a second via slanting wall 806, and a second via base 808, and the first via flange 804 and the second via flange 805 have an overlapped area 809.

In some embodiments, the via 801 and the via 802 are implemented in the insulating layer 503. The via 825 and the via 826 are implemented in the insulating layer 502. With reference to FIG. 8 and FIG. 16, the via 830 and the via 831 are implemented in the insulating layer 502. The vias belonging to two adjacent layers are not aligned vertically. That is, the vias belonging to two adjacent layers are shifted with respect to each other. In some embodiments, the via 801, the via 802, the via 825, the via 826, the via 830, the via 831, and the conductive unit 205 are all electrically connected through metal traces 207.

In some embodiments, the first via 801 comprises a first via flange 804, a first via slanting wall 803, and a first via base 807. The second via 802 comprises a second via flange 805, a second via slanting wall 806, and a second via base 808. With reference to FIG. 11, a first edge 832 of the first via flange 804 touches a second edge 833 of the second via flange 805.

With reference to FIG. 9 and FIG. 11, the via 801 and the via 802 are within the via zone 512. In some embodiments, the edge 832 does not touch the edge 833. A distance between the edge 832 and the edge 833 is smaller than the diameter of the rim 820 of the via 801. The distance between the edge 832 and the edge 833 is smaller than the diameter of the rim 821 of the via 802. In some embodiments, the edge 832 touches the edge 833 at one point. In some embodiments, the flange of the via 801 is overlapped with the flange of the via 802 and an overlapped area 809 is formed.

Placing the via 801 and the via 802 closely helps to reduce the stress applied on the base of the via 801 and on the base of the via 802. For the via 801, the adjacent via 802 forms a rugged metal surface on one side. It helps to reduce the stress transmitted from that side. For the via 802, the adjacent via 801 forms a rugged metal surface on one side. It helps to reduce the stress transmitted from that side. Placing two or more vias under the conductive unit 205 helps to increase conductivity from the conductive unit 205 to the lower vias and at the same time helps to reduce stress.

With reference to FIG. 12, in some embodiments, two vias 1201 and 1202 are located within the left side via zone 516. Two other vias 1203 and 1204 are located within the right side via zone 516. The via zone 516 forms a ring shape from a top view. The via zone 512 forms a circle shape from a top view. In some embodiments, the via 1201 and the via 1202 are separated from a distance smaller than a diameter of a rim of the via 1201. The distance is also smaller than a diameter of the rim of the via 1202. In some embodiments, the via 1201 touches the via 1202 at one point. In some embodiments, the via 1201 and the via 1202 have an overlapped area 1205.

With reference to FIG. 13, in some embodiments, three vias 1301, 1302, and 1303 are implemented within the via zone 512. In some embodiments, the via 1301 touches the via 1302 at one point. The via 1302 touches the via 1303 at one point. In some embodiments, the via 1301 and the via 1302 have an overlapped flange area 1304. The via 1302 and the via 1303 have an overlapped flange area 1305.

With reference to FIG. 5 and FIG. 14, in some embodiments, five vias 1401 are implemented within a vertical projection 1402 of the rim 509 of the conductive unit 205. In some embodiments, three of the vias 1401 are implemented along an axis 1404. In some embodiments, three of the vias 1401 are implemented along an axis 1405. In some embodiments, all the vias 1401 are about the same size. In some embodiments, each of the vias 1401 has an overlapped flange area with an adjacent via 1401.

With reference to FIG. 5 and FIG. 15, in some embodiments, five vias 1501 are implemented within a vertical projection 1502 of the rim 509 of the conductive unit 205. In some embodiments, three of the vias 1501 are implemented along an axis 1504. In some embodiments, three of the vias 1501 are implemented along an axis 1505. In some embodiments, all the vias 1501 are about the same size. In some embodiments, each of the vias 1501 touches an adjacent via 1501 at one point.

With reference to FIG. 5 and FIG. 16, the via 801 and the via 802 are within a vertical projection 1603 of the rim 509. In some embodiments, a small portion of the via 801 is outside the vertical projection 1603 of the rim 509 and a large portion of the via 801 is within the vertical projection 1603. In some embodiments, a small portion of the via 802 is outside the vertical projection 1603 of the rim 509 and a large portion of the via 802 is within the vertical projection 1603. In some embodiments, the via 801, the via 802, the via 825, and the via 826 are implemented along an axis 828. In some embodiments, the via 830 and the via 831 are implemented along an axis 827.

With reference to FIG. 5 and FIG. 17, in some embodiments, the via 801 and the via 802 are located within a vertical projection 1701 of the rim 509. The via 801 and the via 802 have an overlapped flange area 1702. In some embodiments, a plurality of vias 1703 are implemented within a vertical projection 1704 of the conductive unit 205.

According to another embodiment, with reference to FIG. 1, FIG. 4, FIG. 5, and FIG. 9, and FIG. 16, a semiconductor device 100 comprises a die 101, a redistribution structure 102, a printed circuit board 401, a nonvolatile memory module 402, and a DRAM module 405.

The die 101 has an active side 103 and a back side 104. The redistribution structure 102 has a front surface 201 and a back surface 202. The front surface 201 is connected to the active side 103 of the die 101 through a set of metal pillars 204. The redistribution structure 102 comprises a conductive unit 205, a solder bump 206, a first insulating layer 501, a second insulating layer 502, a third insulating layer 503, a first via 801, a second via 802, a third via 825, and a fourth via 826. The conductive unit 205 has a rim 509. The conductive unit 205 comprises a flange 506, a slanting side wall 507, and a base 508.

The solder bump 206 is located on the conductive unit 205. The solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502. The first via 801 is located in the third insulating layer 503.

More than half of the first via 801 is within a vertical projection of the rim 509 of the conductive unit 205. The second via 802 is located in the third insulating layer 503. More than half of the second via 802 is within the vertical projection of the rim 509 of the conductive unit 205. The third via 825 is located in the second insulating layer 502. More than half of the third via 825 is within a vertical projection of the flange 506 and the slanting side wall 507 of the conductive unit 205. The fourth via 826 is located in the second insulating layer 502. More than half of the fourth via 826 is within the vertical projection of the flange 506 and the slanting side wall 507 of the conductive unit 205.

The redistribution structure 102 is connected to the printed circuit board 401 through the solder bump 206. The nonvolatile memory module 402 is connected to the printed circuit board 401 through a plurality of second solder bumps 403. The DRAM module 405 is connected to the redistribution structure 102 through a plurality of third solder bumps 406 and a plurality of metal posts 107. In some embodiments, the first via 801, the second via 802, the third via 825, and the fourth via 826 are symmetric with respect to a first axis 827.

With reference to FIG. 5 and FIG. 18, a via 1801, a via 1802, and a via 1803 are implemented within a vertical projection of the conductive unit 205. A metal layer 1804 is implemented beneath the conductive unit 205. The metal layer 1804 is in direct contact with the base of the conductive unit 205. In some embodiments, the metal layer 1804 has an area that is about the same size of the base of the conductive unit 205.

In some embodiments, the metal layer 1804 has an area that is larger than the size of the base of the conductive unit 205. The area of the metal layer 1804 is just beneath the base of the conductive unit 205 so that it provides good and full contact with the base of the conductive unit 205. In some embodiments, no via is implemented in a zone 1805. The zone 1805 is beneath the base of the conductive unit 205. In some embodiments, the metal layer 1804 is connected to the metal trace 207 so that the metal layer 1804, the metal trace 207, the via 1801, the via 1802, and the via 1803 are all electrically connected. In some embodiments, a metal post 1806 is located on top of the conductive unit 205. In some embodiments, the metal post 1806 is replaced by a solder bump.

One objective of the embodiments is to provide a connection structure that can help to reduce stress in a semiconductor package. Another objective of the embodiments is to provide arrangements of vias below a conductive unit of a redistribution structure so that a better conductivity is achieved. Still another objective of the embodiments is to provide a connection structure that is symmetric with respect to a central point so that a balance of stress is achieved.

Figure 19:
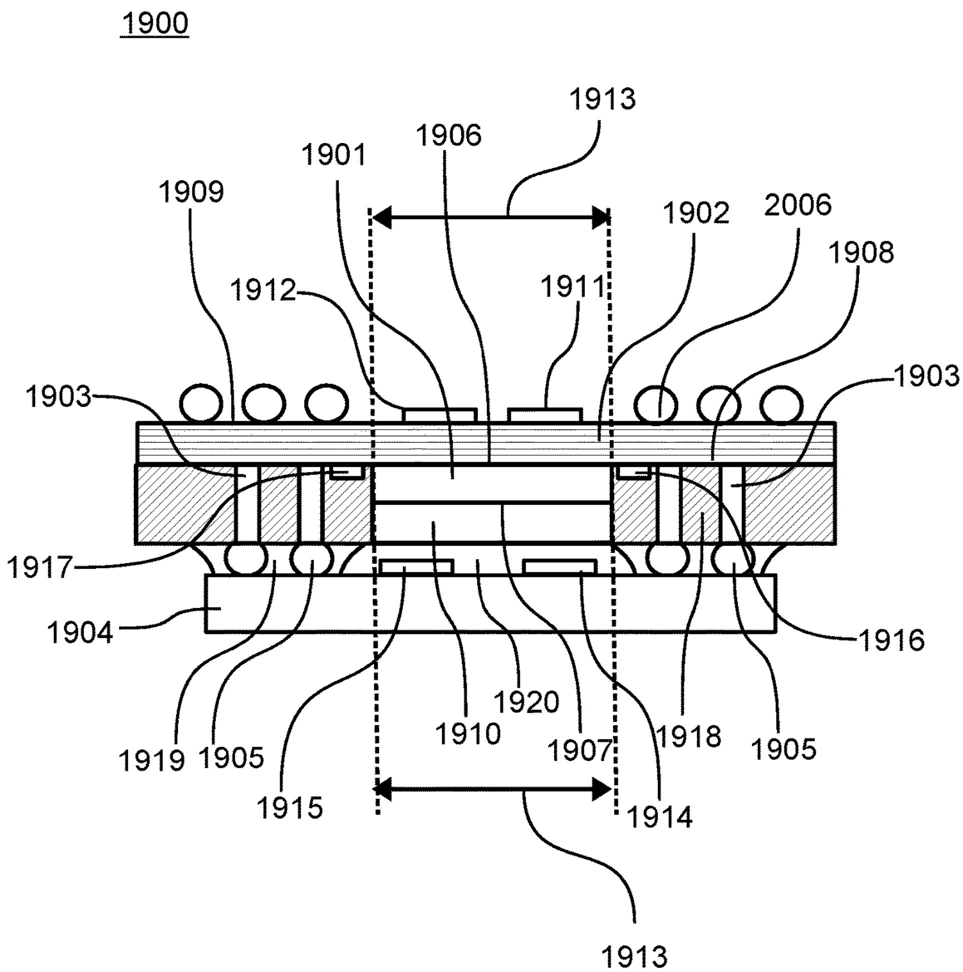
FIG. 19 shows a semiconductor device with a DRAM module.
Figure 20:
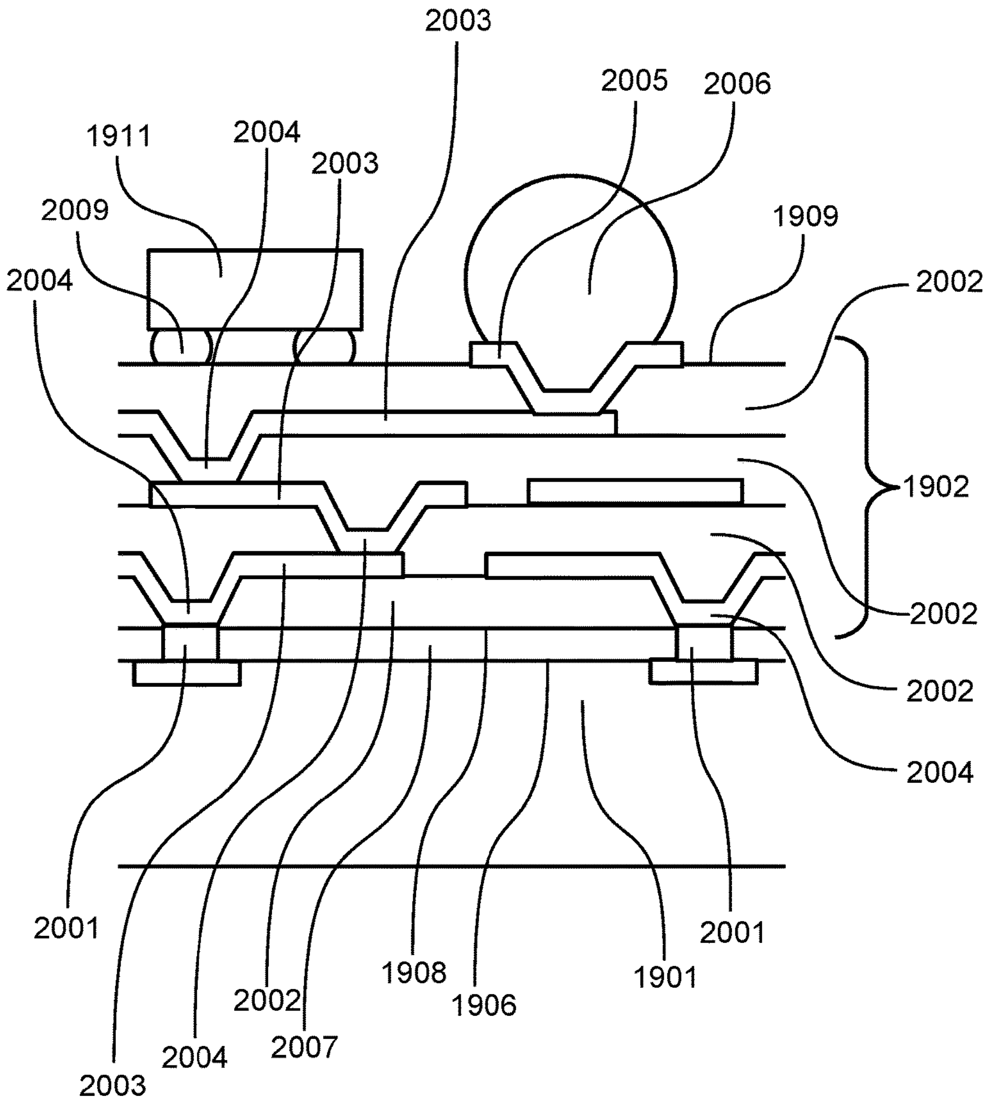
FIG. 20 shows a part of a redistribution structure.

With reference to FIG. 19 and FIG. 20, according to an embodiment, a semiconductor device 1900 is disclosed. The semiconductor device 1900 comprises a die 1901, a redistribution structure 1902, a plurality of conductive posts 1903, a DRAM module 1904, and a plurality of solder bumps 1905. The die 1901 has an active side 1906 and a back side 1907. The redistribution structure 1902 has a front surface 1908 and a back surface 1909. The redistribution structure 1902 is connected to the die 1901 through a plurality of conductive pillars 2001.

In some embodiments, the redistribution structure 1902 has a plurality of sublayers 2002. The sublayers 2002 are insulating layers. Each of the sublayers 2002 comprises metal traces 2003 and vias 2004. Electrical signals and power/ground levels are connected through the metal traces 2003 and the vias 2004. In some embodiments, the redistribution structure 1902 comprises a plurality of conductive units 2005 and a plurality of solder bumps 2006. Each solder bump 2006 is located on its corresponding conductive unit 2005. In some embodiments, the conductive units are UBM (under-bump metallization) layers.

In some embodiments, the semiconductor device 1900 comprises an adhesive layer 1910. The adhesive layer 1910 is a DAF (Die Attach Film). In some embodiments, the semiconductor device 1900 comprises a passive device 1911 and a passive device 1912. The passive device 1911 is a capacitor. The passive device 1912 is a capacitor. In some embodiments, the passive device 1911 is an inductor. The passive device 1912 is an inductor. In some embodiments, the passive device 1911 and the passive device 1912 are within a vertical projection 1913 of the die 1901. From a top view, the projection 1913 is rectangular in shape because the die 1901 is rectangular.

In some embodiments, the passive device 1911 is connected to the back surface 1909 of the redistribution structure 1902 through solder bumps 2009. In some embodiments, the passive device 1911 is an IPD (Integrated Passive Device). In some embodiments, the semiconductor device 1900 comprises a passive device 1914 and a passive device 1915. The passive device 1914 is a capacitor. The passive device 1915 is a capacitor. In some embodiments, the passive device 1914 is an inductor. The passive device 1915 is an inductor. In some embodiments, the passive device 1914 and the passive device 1915 are within a vertical projection 1913 of the die 1901.

In some embodiments, the semiconductor device 1900 comprises a passive device 1916 and a passive device 1917. In some embodiments, the passive device 1916 is a capacitor. The passive device 1917 is a capacitor. In some embodiments, the passive device 1916 is an inductor. The passive device 1917 is an inductor. The passive device 1916 and the passive device 1917 are located on the front surface 1908 of the redistribution structure 1902.

In some embodiments, the passive device 1916 and the passive device 1917 are located beside the die 1901. In some embodiments, the passive device 1916 and the passive device 1917 are located closer to the die 1901 than any of the conductive posts 1903. In some embodiments, an underfill material 1919 surrounds the solder bumps 1905. In some embodiments, a space 1920 is formed under between the DRAM module 1904 and the adhesive layer 1910. In some embodiments, the space 1920 is not filled by the underfill material 1919. In some embodiments, the space 1920 is also filled with the underfill material 1919.

In some embodiments, the semiconductor device 1900 comprises a molding material 1918 filling a space between one of the conductive posts 1903 and the die 1901. In some embodiments, the molding material 1918 surrounds all conductive posts 1903. In some embodiments, the semiconductor device 1900 comprises an insulating layer 2007 between the front surface 1908 of the redistribution structure 1902 and the active side 1906 of the die 1901. In some embodiments, the insulating layer 2007 is a polymer layer. In some embodiments, the insulating layer 2007 is a polyimide layer. In some embodiments, the insulating layer 2007 has the same material as the molding material 1918. In some embodiments, the insulating layer 2007 surrounds each conductive pillar 2001 between the redistribution structure 1902 and the die 1901.

Figure 24:
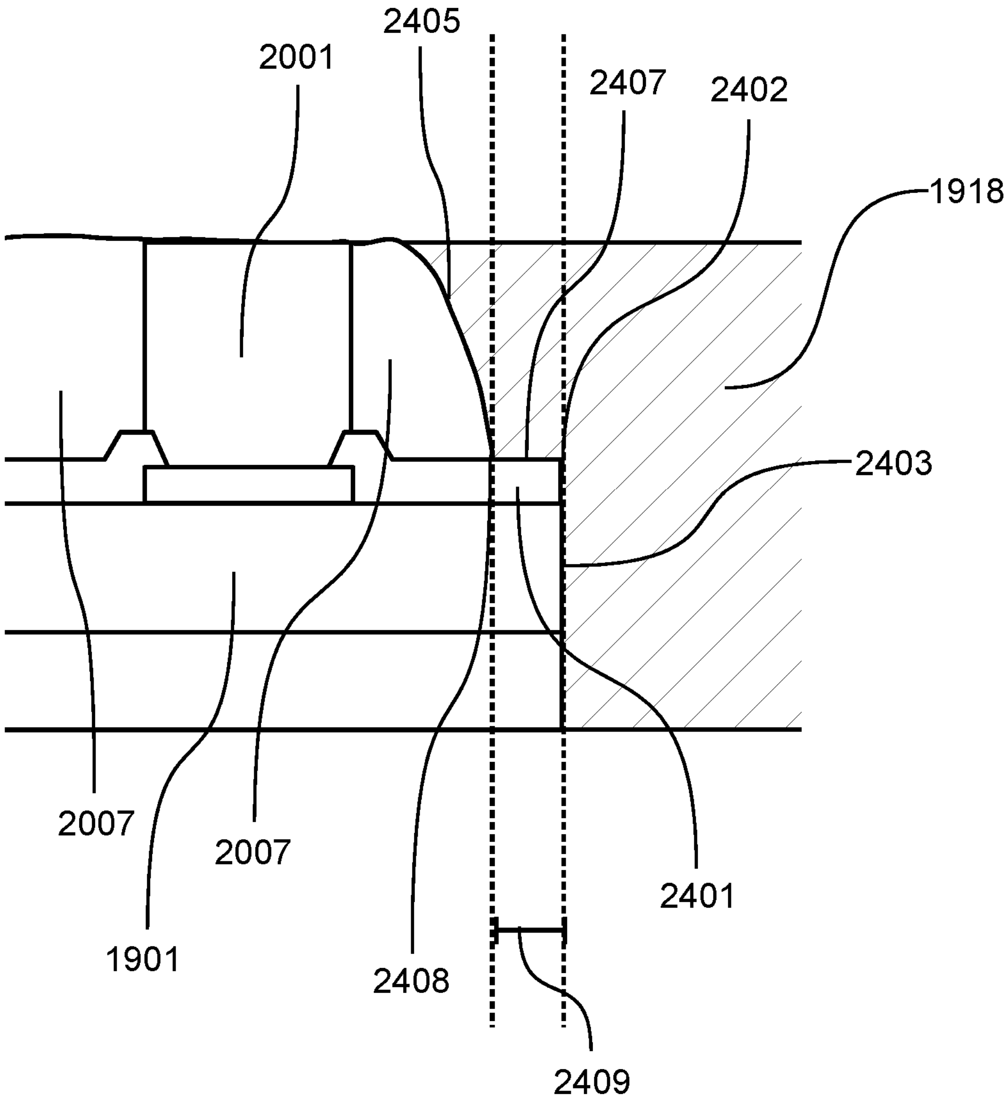
FIG. 24 shows another example of a connection structure between a die and a redistribution structure.

In some embodiments, the insulating layer 2007 does not provide for routing of signal traces. That is, the insulating layer 2007 does not have any redistribution function. No metal traces are formed on the insulating layer 2007 for any routing purposes. With reference to FIG. 20 and FIG. 24, in some embodiments, no redistribution of metal traces is provided below the front surface 1908 of the redistribution structure 1902 and above the passivation layer 2401.

Figure 22:
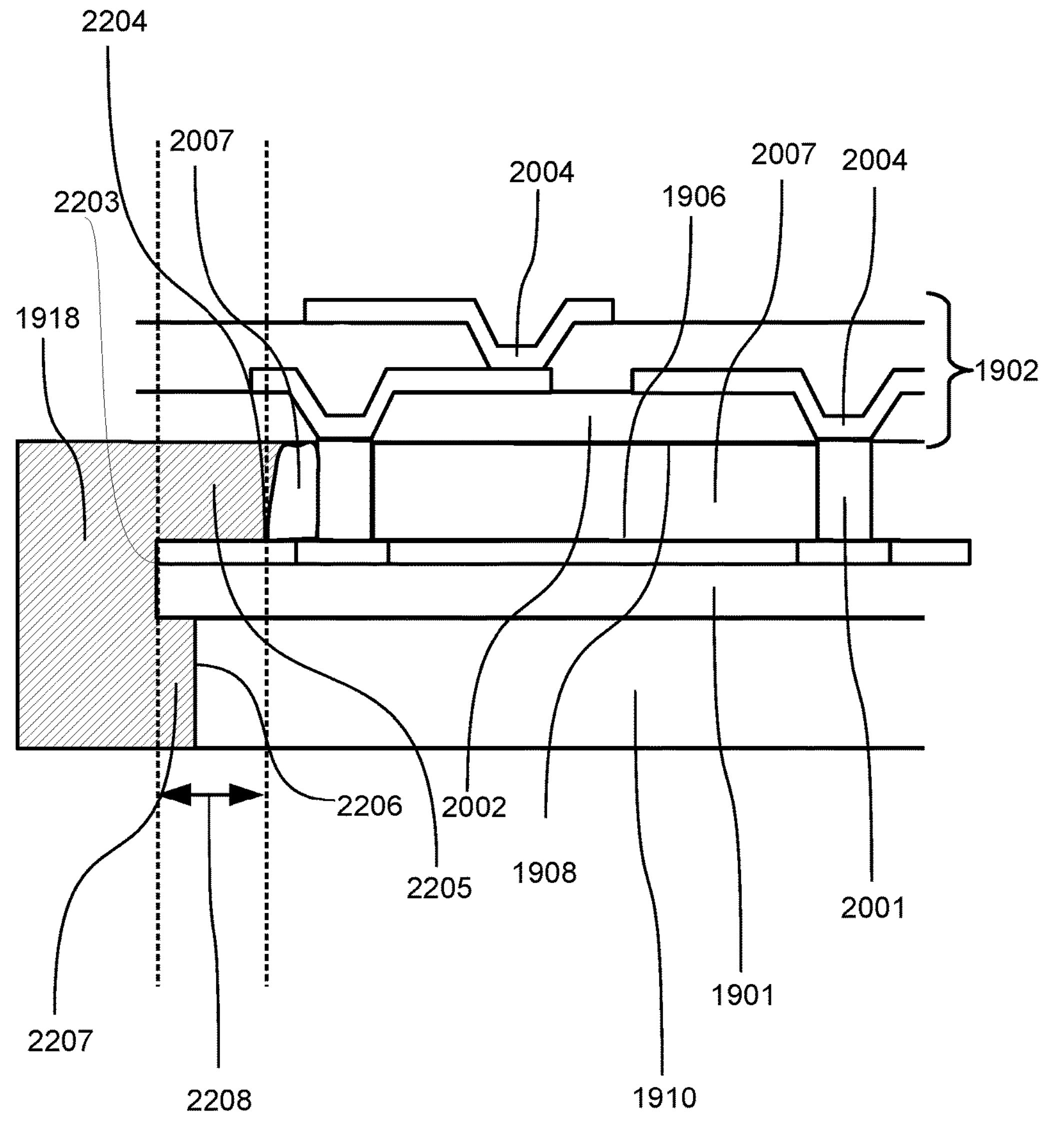
FIG. 22 shows an example of a connection structure between a die and a redistribution structure.

With reference to FIG. 22, in some embodiments, the insulating layer 2007 is located between the active side 1906 of the die 1901 and the front surface 1908 of the redistribution structure 1902. In some embodiments, the insulating layer 2007 comprises polyimide. In some embodiments, the insulating layer 2007 is in direct contact with the front surface 1908 of the redistribution structure 1902. In some embodiments, the insulating layer 2007 is in direct contact with the active side 1906 of the die 1901.

With reference to FIG. 22, the die 1901 has a die edge 2203. The insulating layer 2007 has an outer edge 2204. The die edge 2203 is not aligned with the outer edge 2204 of the insulating layer 2007 vertically. There is a horizontal shift 2208 between the die edge 2203 and the outer edge 2204 of the insulating layer 2007.

The reason for the horizontal shift 2208 is that during a dicing process of a wafer, the presence of a polymer insulating layer 2007 at scribe lines of the wafer causes problems. If the insulating layer 2007 is formed on top of the scribe lines before a dicing process is performed, the insulating layer 2007 may not be easily cut during the dicing process because it has different chemical and physical characteristics compared with the die 1901. In some cases, the insulating layer 2007 may be peeled off by the dicing process and the structure of the semiconductor device 1900 is destructed. Therefore, it is better to form the insulating layer 2007 which keeps a distance from the edge 2203 of the die 1901. That is, the insulating layer 2007 is better not located near the scribe line area.

With reference to FIG. 22, a recess 2205 is formed between the redistribution structure 1902 and the die 1901. In some embodiment, the recess 2205 is filled by the molding material 1918. In some embodiments, the adhesive layer 1910 has an edge 2206. The edge 2206 of the adhesive layer 1910 is aligned vertically with the die edge 2203. In some embodiments, the molding material 1918 covers the die edge 2203 and the edge 2206 of the adhesive layer 1910. In some embodiments, the edge 2206 of the adhesive layer is not vertically aligned with the die edge 2203. The edge 2206 of the adhesive layer 1910 creates a recess 2207 under the die 1901. In some embodiments, the molding material 1918 filled the recess 2207.

With reference to FIG. 22, the conductive pillars 2001 are surrounded by the insulating layer 2007. The conductive pillars 2001 are connected to the vias 2004 of the redistribution structure 1902. The conductive pillars 2001 are also connected to the active side 1906 of the die 1901. The conductive pillars 2001 can be used to transmit electrical signals between the redistribution structure 1902 and the die 1901. In some embodiments, the insulating layer 2002 uses the same material as that used in the insulating layer 2007. In this case, the insulating layer 2007 and the insulating layer 2002 have the same chemical and physical characteristics so that there are no mismatches between the two layers. For example, the insulating layer 2007 and the insulating layer 2002 have the same coefficient of thermal expansion so when environment temperature changes, there is no warpage caused by the changes.

Figure 23:
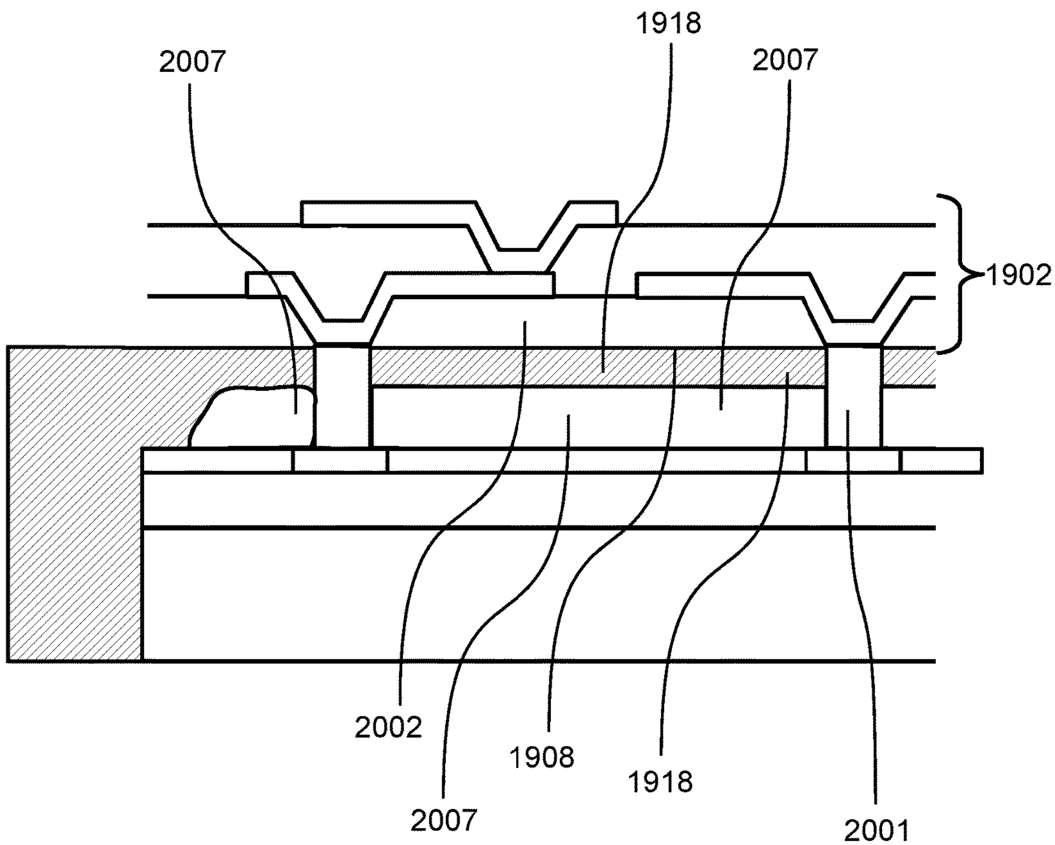
FIG. 23 shows another example of a connection structure between a die and a redistribution structure.

With reference to FIG. 23, in some embodiments, the insulating layer 2007 is not in direct contact with the insulating layer 2002. A molding material 1918 is filled between the front surface 1908 of the redistribution structure 1902. The molding material 1918 surrounds upper portions of the conductive pillars 2001. The insulating layer 2007 surrounds lower portions of the conductive pillars 2001.

With reference to FIG. 24, the die 1901 comprises a passivation layer 2401. The passivation layer 2401 has an edge 2402. The edge 2402 is aligned vertically with an edge 2403 of the die 1901. In some embodiments, the insulating layer 2007 has an outwardly curved surface 2405. An upper surface 2407 of the passivation layer 2401 is in direct contact with the molding material 1918. In some embodiments, the insulating layer 2007 has an edge 2408. The edge 2408 is not vertically aligned with the edge 2402. There is a horizontal shift 2409 between the edge 2408 and the edge 2402.

Figure 25:
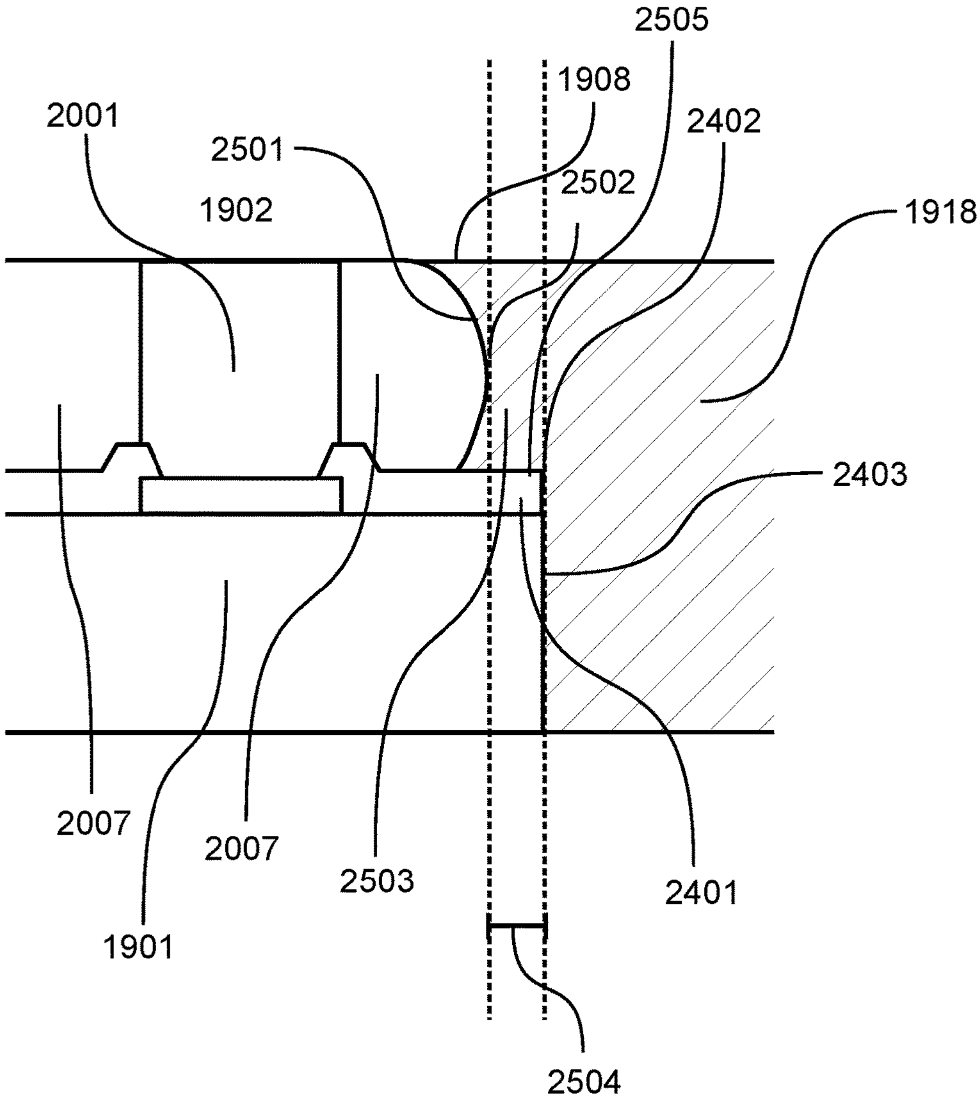
FIG. 25 shows another example of a connection structure between a die and a redistribution structure.

With reference to FIG. 25, in some embodiments, the insulating layer 2007 has an outwardly curved surface 2501. The outwardly curved surface 2501 is in direct contact with the molding material 1918. The outwardly curved surface 2501 has an outermost point 2502. The outermost point 2502 is not located on an interface between the insulating layer 2007 and the passivation layer 2401. The outermost point 2502 is not located on an interface the insulating layer 2007 and the front surface 1908 of the redistribution structure 1902. The outermost point 2502 is not vertically aligned with the edge 2402 of the passivation layer 2401. The front surface 1908, the outwardly curved surface 2501, and the passivation layer 2401 form a recess 2503.

In some embodiments, the recess 2503 is filled by the molding material 1918. There is a horizontal shift 2504 between the outermost point 2502 and the edge 2402 of the passivation layer 2401. In some embodiments, a part of an upper surface 2505 of the passivation layer 2401 is in direct contact with the molding material 1918.

Figure 26:
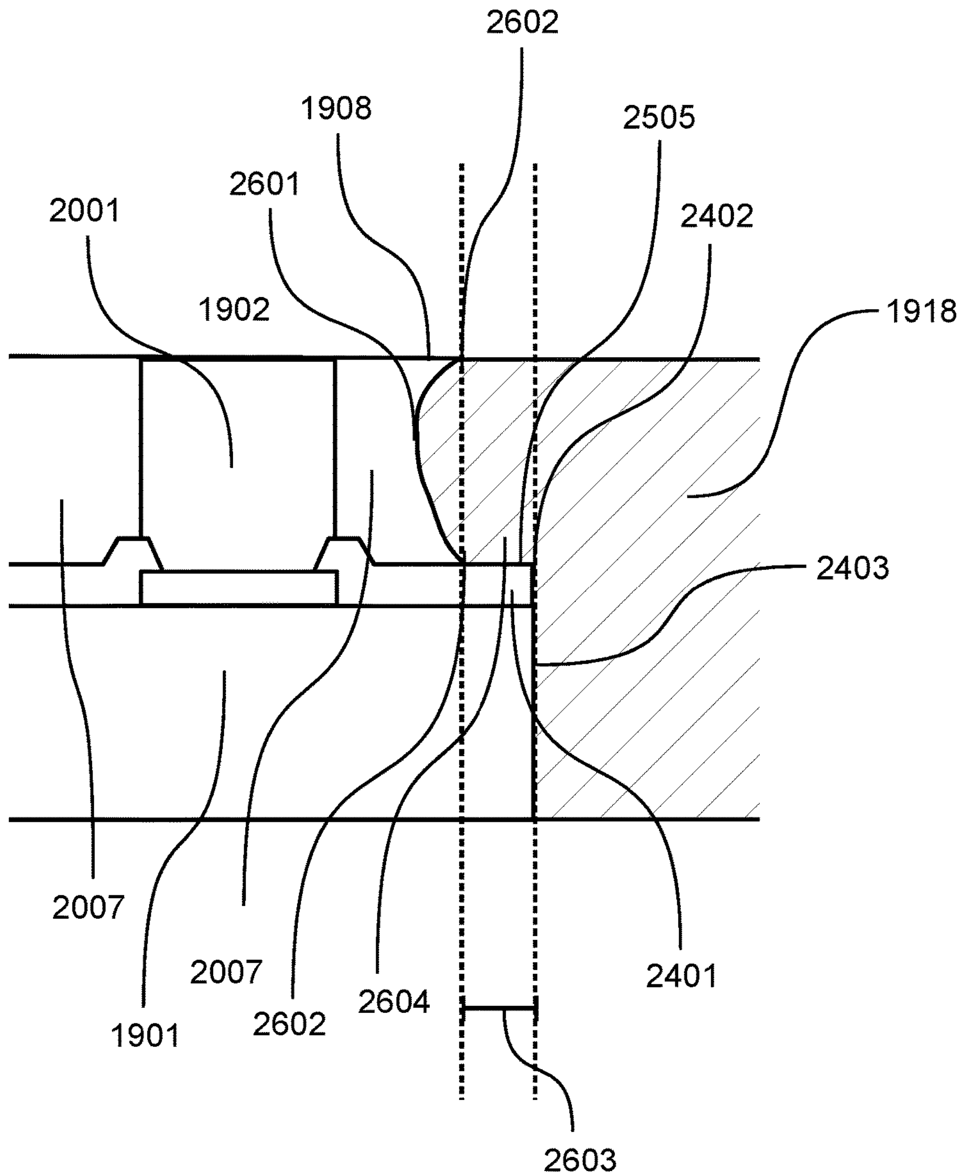
FIG. 26 shows another example of a connection structure between a die and a redistribution structure.

With reference to FIG. 26, in some embodiments, the insulating layer 2007 has an inwardly curved surface 2601. The inwardly curved surface 2601 has an outermost point 2602. The outermost point 2602 is located on a boundary between the inwardly curved surface 2601 and the upper surface of the passivation layer 2401. There is a horizontal shift 2603 between the outermost point 2602 and the edge 2402 of the passivation layer 2401.

A recess 2604 is formed by the front surface 1908 of the redistribution structure 1902, the inwardly curved surface 2601, and the passivation layer 2401. In some embodiments, the recess 2604 is filled by the molding material 1918. In some embodiments, the outermost point 2602 is located on a boundary between the inwardly curved surface 2601 and the front surface 1908 of the redistribution structure. In this case, there is a horizontal shift 2603 between the outermost point 2602 and the front surface 1908 of the redistribution structure. In this case, a part of the upper surface 2505 of the passivation layer 2401 is in direct contact with the molding material 1918.

Figure 27:
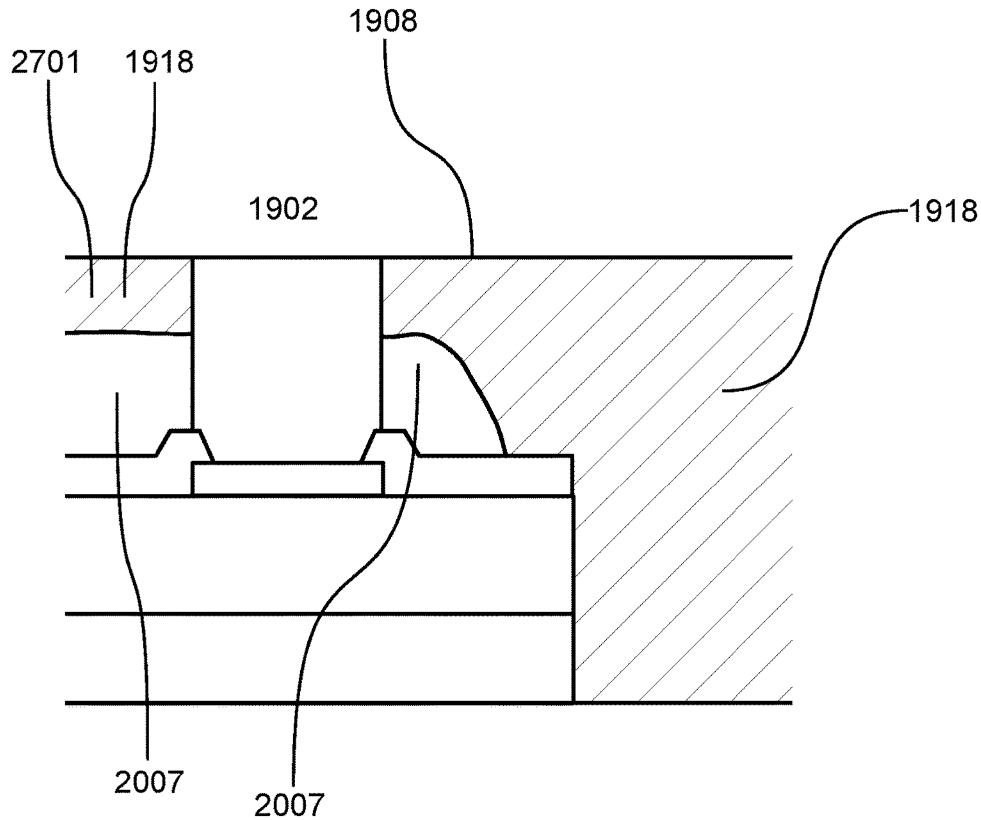
FIG. 27 shows another example of a connection structure between a die and a redistribution structure.

With reference to FIG. 27, in some embodiments, the insulating layer 2007 is not in direct contact with the front surface 1908 of the redistribution structure 1902. There is a gap 2701 between the front surface 1908 and the insulating layer 2007. In some embodiments, the molding material 1918 is filled in the gap 2701.

Figure 28:
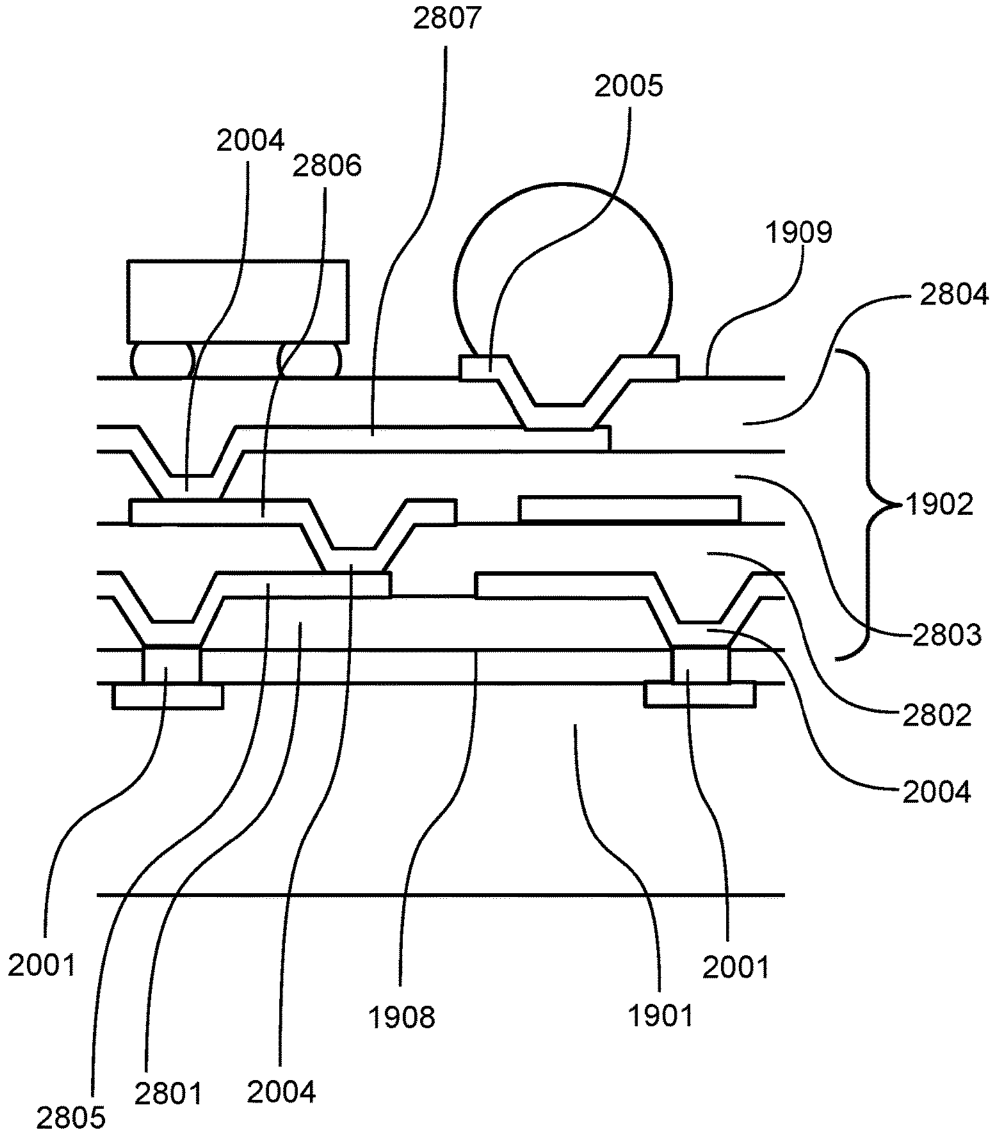
FIG. 28 shows a part of a redistribution structure.

With reference to FIG. 28, in some embodiments, the redistribution structure 1902 comprises an insulating layer 2801, an insulating layer 2802, an insulating layer 2803, and an insulating layer 2804. The redistribution structure 1902 comprises a metal layer 2805, a metal layer 2806, and a metal layer 2807. The metal layer 2805 is on top of the insulating layer 2801. The metal layer 2806 is on top of the insulating layer 2802. The metal layer 2807 is on top of the insulating layer 2803. A plurality of conductive units 2005 are formed on top of the insulating layer 2804. The metal layer 2805 is connected to the conductive pillars 2001 through vias 2004. The metal layer 2806 is connected to the metal layer 2805 through vias 2004. The metal layer 2807 is connected to the metal layer 2806 through vias 2004.

With reference to FIG. 28, the metal layer 2805 comprises metal traces that transmit signals and metal traces for power and ground. The metal layer 2806 comprises metal traces that transmit signals and metal traces for power and ground. The metal layer 2807 comprises metal traces that transmit signals and metal traces for power and ground. The metal layer 2806, being between the metal layer 2805 and the metal layer 2807, has a relatively larger portion of metal traces designed for power and ground. That is, the metal layer 2806 has more power and ground areas compared with the metal layer 2805 and the metal layer 2807.

The metal layer 2805 has longer total length of signal routing metal traces than the metal layer 2806. The metal layer 2807 has longer total length of signal routing metal traces than the metal layer 2806. The metal layer 2806 has longer power ground traces or metal areas than the metal layer 2805. The metal layer 2806 has longer power ground traces or metal areas then the metal layer 2807. By placing large areas of power and ground in the middle, the metal layer 2806 help maintain good signal integrity for the signals transmitted by the metal layer 2805 and the metal layer 2807.

Figure 29:
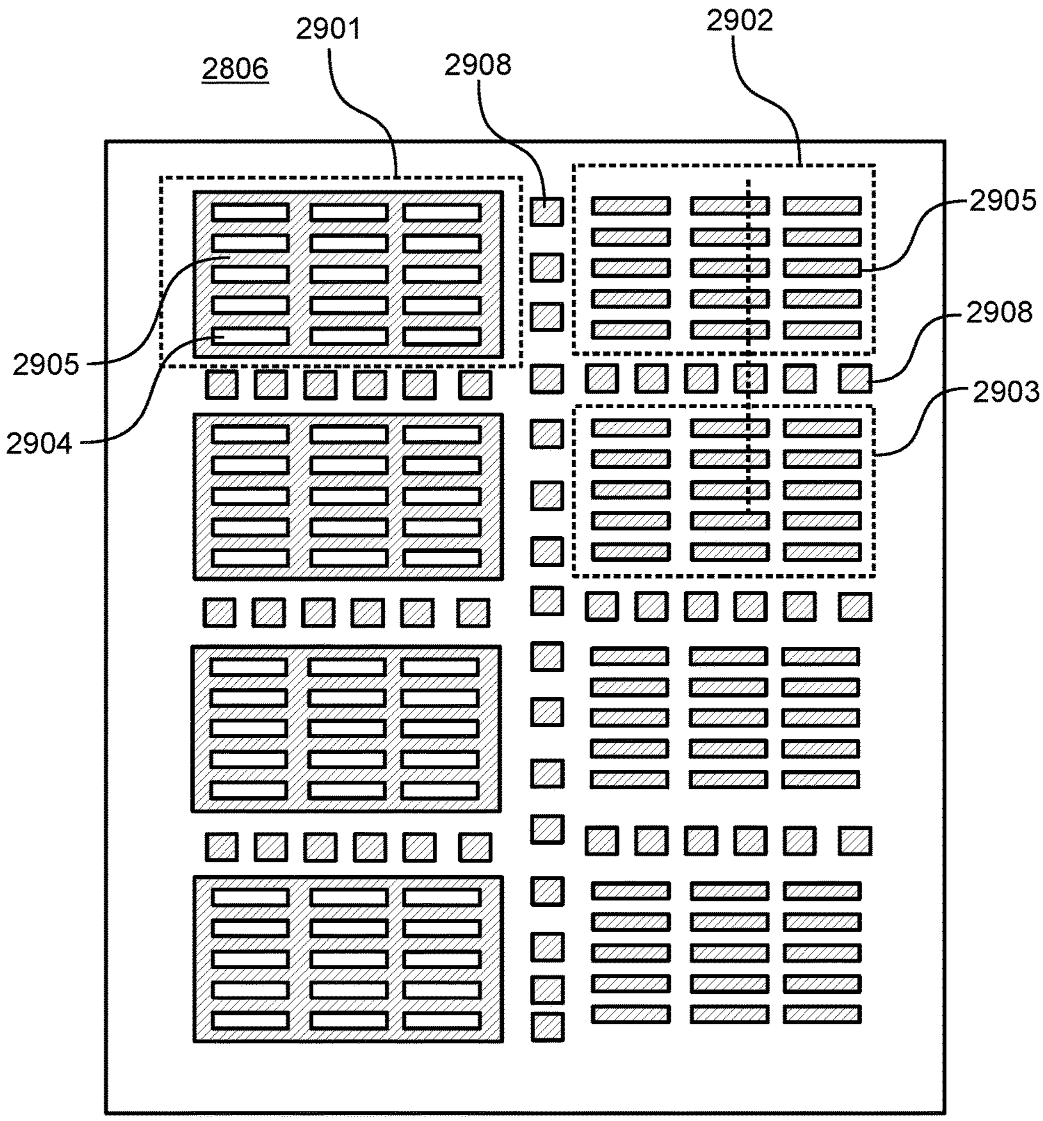
FIG. 29 shows an example of a metal layer in a redistribution structure.

With reference to FIG. 28 and FIG. 29, the metal layer 2806 has a power ground area 2901, a power ground area 2902, and a power ground area 2903. In some embodiments, the power ground areas 2901 is formed by a mesh type metal layer. The power ground area 2901 has a metal plane with a plurality of holes 2904 or slits 2904. A width of the holes 2904 is generally greater than a width of the metal traces 2905. The metal traces 2905 from the boundary line of the power ground area 2901. The metal traces 2905 also form inner lines among the plurality of holes 2904. The power ground area 2901 is connected to a power level or a ground level.

With reference to FIG. 28 and FIG. 29, in some embodiments, the power ground area 2902 are formed by a plurality of metal traces 2905. There is no closed boundary formed by the metal traces 2905 for the power ground area 2902. The metal traces 2905 are metal islands connected to the same power level or to the same ground level. In some embodiments, the metal layer 2806 comprises electrically isolated metal islands implemented between two power ground areas. For example, a plurality of metal islands 2908 are implemented between the power ground area 2901 and the power ground area 2902. A plurality of metal islands 2908 are implemented between the power ground area 2902 and a power ground area 2903. The metal islands 2908 are electrically isolated so that they are not connected vertically with another metal layer.

In some embodiments, a metal layer containing greater portion of power ground area can be placed between two metal layers having greater portion of signal metal traces. For example, with reference to FIG. 28, the metal layer 2806 can have more ground area compared with the metal layer 2807. The metal layer 2806 can have more ground area compared with the metal layer 2805. By placing a metal layer with significant ground area between two metal layers with significant signal metal traces can help to prevent signal crosstalk and keep signal integrity.

Figure 30:
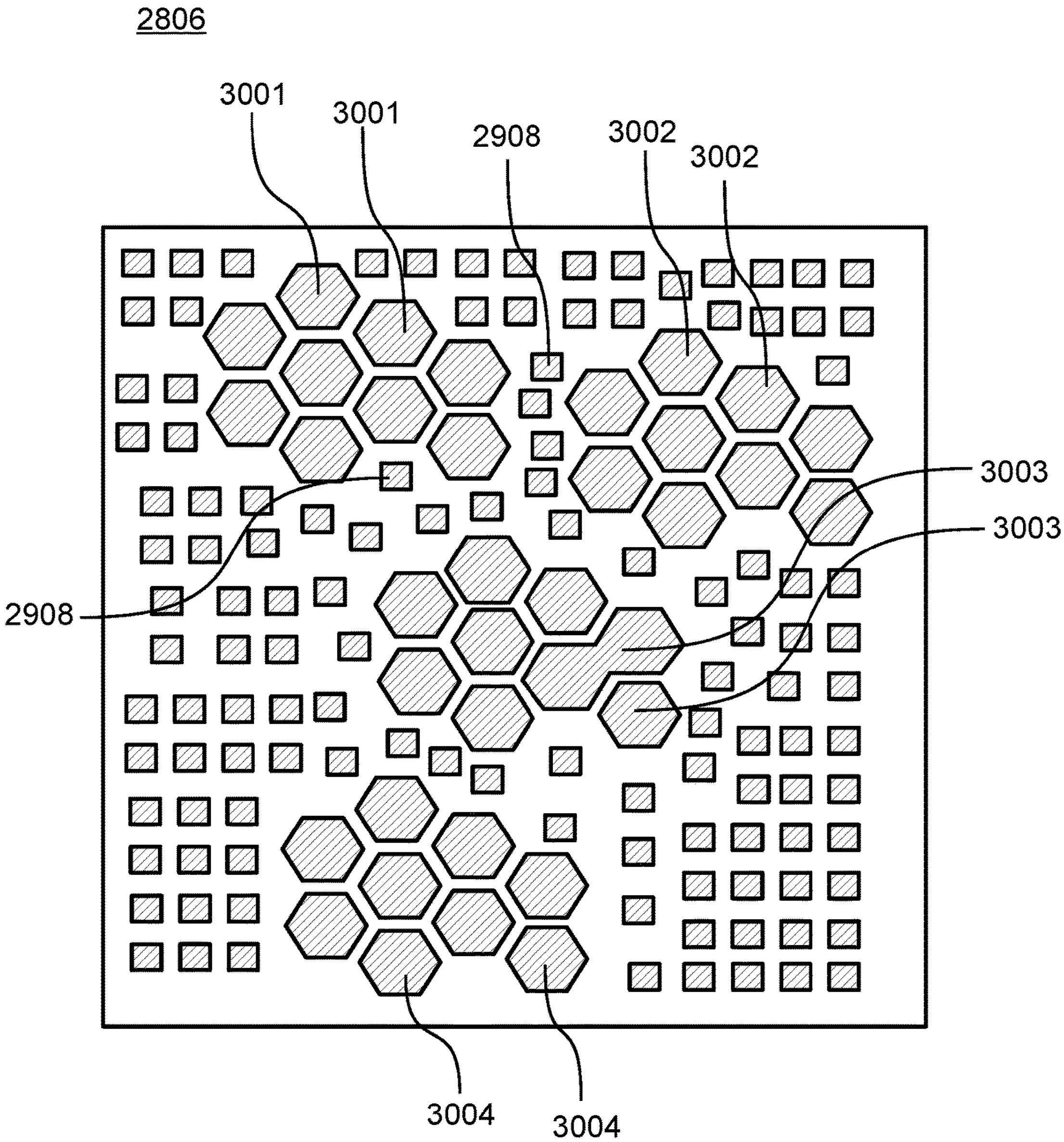
FIG. 30 shows another example of a metal layer in a redistribution structure.

With reference to FIG. 30, in some embodiments, the metal layer 2806 comprises a plurality of power ground areas. For example, one of the power ground areas is formed by metal components 3001. One of the power ground areas is formed by metal components 3002. One of the power ground areas is formed by metal components 3003. One of the power ground areas is formed by metal components 3004. In some embodiments, each of the metal components 3001 is a polygon. In some embodiments, the metal components 3001 are hexagons. In some embodiments, more than half of the internal angles of each polygon are about 120 degrees. In some embodiments, the metal layer 2806 comprises a plurality of metal islands 2908 between two power ground areas.

In some embodiments, not each metal component has the same size. For example, one of the metal components 3003 has twice the size of neighboring metal components 3003. The reason for implementing metal islands 2908 between two power ground areas is that the metal islands 2908 can at some degree prevent accidental short between two power ground areas that have two different voltage levels. The metal islands 2908 are smaller in size compared with the metal components.

In some embodiments, the metal islands 2908 can be implemented surrounding a signal trace. In some embodiment, the metal islands 2908 can be implemented between two adjacent signal traces. In some embodiments, the metal islands 2908 can be implemented between a signal trace and a power ground area. In some embodiments, the metal islands 2908 can be implemented between a signal trace and another signal trace.

In some embodiments, the metal islands 2908 are electrically isolated and are not connected to other power level or signal traces. A reason for implementing the metal islands around a signal trace is that it provides certain degree of shielding and isolation effect so that the signal trace being surrounded can have better signal integrity. Another reason for implementing the metal islands 2908 is to make the density of metal in the metal layer 2806 more uniform to get a better package quality.

Figure 31:
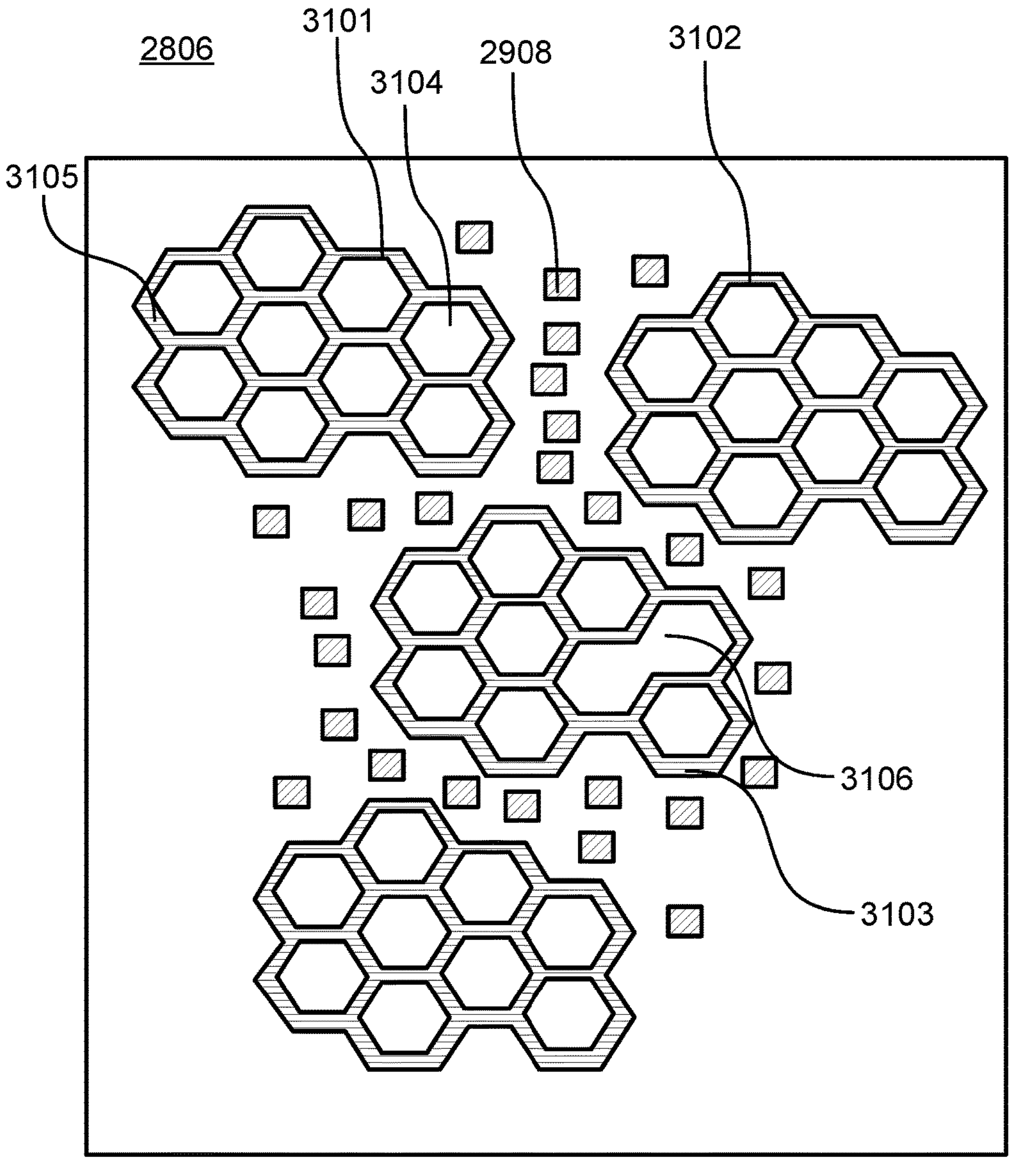
FIG. 31 shows another example of a metal layer in a redistribution structure.
Figure 32:
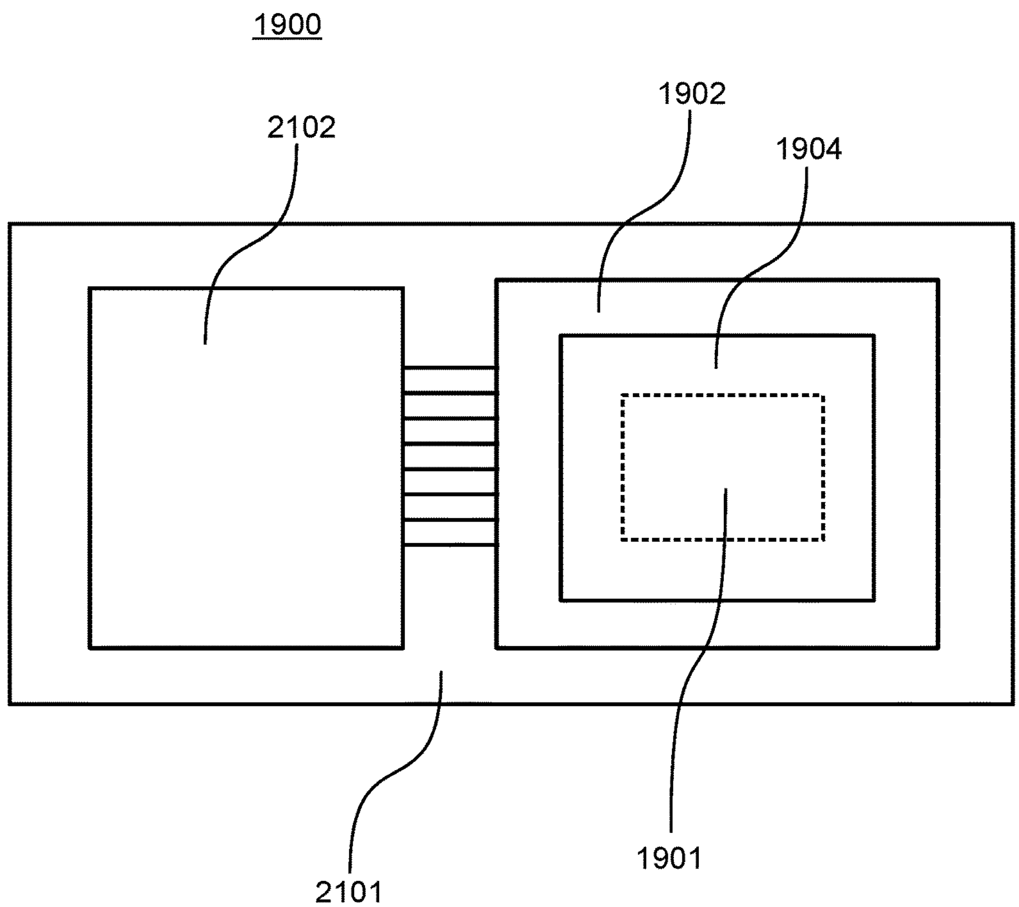
FIG. 32 shows a top view of a semiconductor device.

With reference to FIG. 31, in some embodiments, the metal layer 2806 comprises a power ground area 3101, a power ground area 3102, and a power ground area 3103. The power ground area 3101 has a plurality of holes 3104. The width or diameter of most of the holes 3104 are greater than the width of metal traces 3105. The metal traces 3105 form boundaries and inner lines of each of the power ground areas. In some embodiments, the holes are not of the same size. For example, a hole 3106 is twice the size of neighboring holes.

Figure 21:
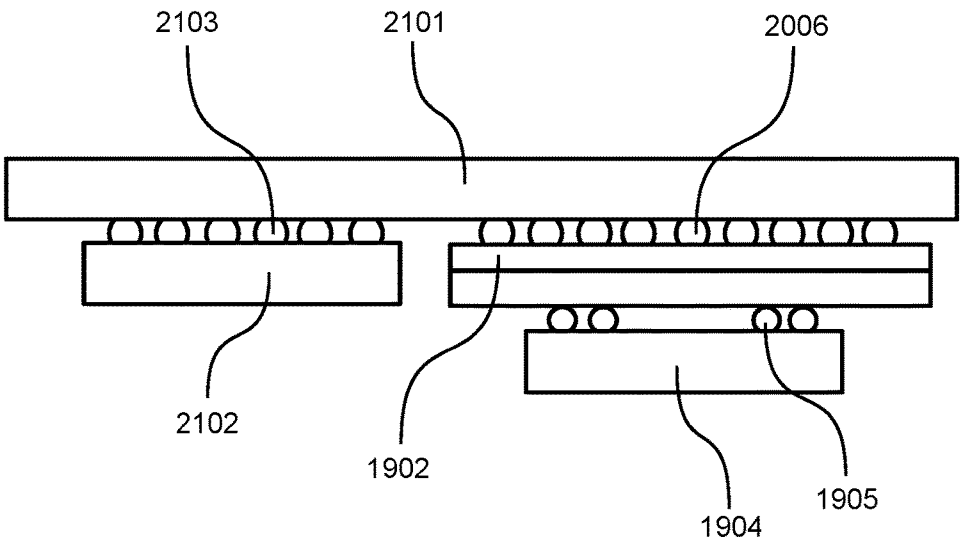
FIG. 21 shows a side view of a semiconductor device.

With reference to FIG. 19, FIG. 20, and FIG. 21, according to another embodiment, a semiconductor device 1900 is disclosed. The semiconductor device 1900 comprises a redistribution structure 1902, a die 1901, a DRAM module 1904, a printed circuit board 2101, and a non-volatile memory module 2102. The DRAM module 1904 is connected to the redistribution structure 1902 through solder bumps 1905 and conductive posts 1903. The die 1901 is connected to the redistribution structure 1902 through conductive pillars 2001. The redistribution structure 1902 is connected to the printed circuit board 2101 through the solder bumps 2006. The non-volatile memory module 2102 is connected to the printed circuit board 2101 through solder bumps 2103.

In some embodiments, the semiconductor device 1900 comprises a DRAM module 1904, a die 1901, a redistribution structure 1902, a printed circuit board 2101, and a non-volatile memory module 2102. The die 1901 is located between the redistribution structure 1902 and the DRAM module 1904. An area of the DRAM module 1904 is greater than an area of the die 1901. An area of the redistribution structure is greater than an area of the DRAM module 1904. The redistribution structure 1902 is connected to the printed circuit board 2101. The non-volatile memory module 2102 is connected to the printed circuit board 2101. The redistribution structure 1902 is electrically connected to the non-volatile memory module 2102 through the printed circuit board 2101.

With reference to FIG. 24, the passivation layer 2401 can have single or multiple layers of silicon nitride (Si3N4), silicon dioxide (SiO2), silicon oxynitride (SiON), SiO2/Si3N4, or other material having dielectric properties. With reference to FIG. 20 and FIG. 28, the insulating layers 2002, 2801, 2802, 2803, and 2804 can be polyimide, BCB (Benzocyclobutene), PBO (PolyBenzobisOxazole), or other material having similar insulating properties. With reference to FIG. 20, the solder bump 2006 and the solder bumps 2006 include without limitation both lead-based and lead-free solders, such as Pb—Sn compositions for lead-based solder, and lead-free solders including tin, copper, and silver, or "SAC" compositions, and other eutectics that have a common melting point and form conductive solder connections in electrical applications.

With reference to FIG. 20, the conductive unit 2005 includes under bump metal (UBM). In some embodiments, UBM structures include one or more metallic layers, such as layers of titanium and of copper. The UBM can be formed by deposition. The conductive pillars 2001 can be aluminum (Al), copper (Cu), tin (Sn), nickel (Ni), gold (Au), or silver (Ag), or other suitable electrically conductive material. The molding material 1918 can be a polymer composite material, such as epoxy resin with filler, epoxy acrylate with filler, or polymer with proper filler. With reference to FIG. 20 and FIG. 28, the metal traces 2003, the vias 2004, the metal layers 2805, 2806, and 2807 can be aluminum (Al), copper (Cu), tin (Sn), nickel (Ni), gold (Au), or silver (Ag), or other suitable electrically conductive material.

Figure 33:
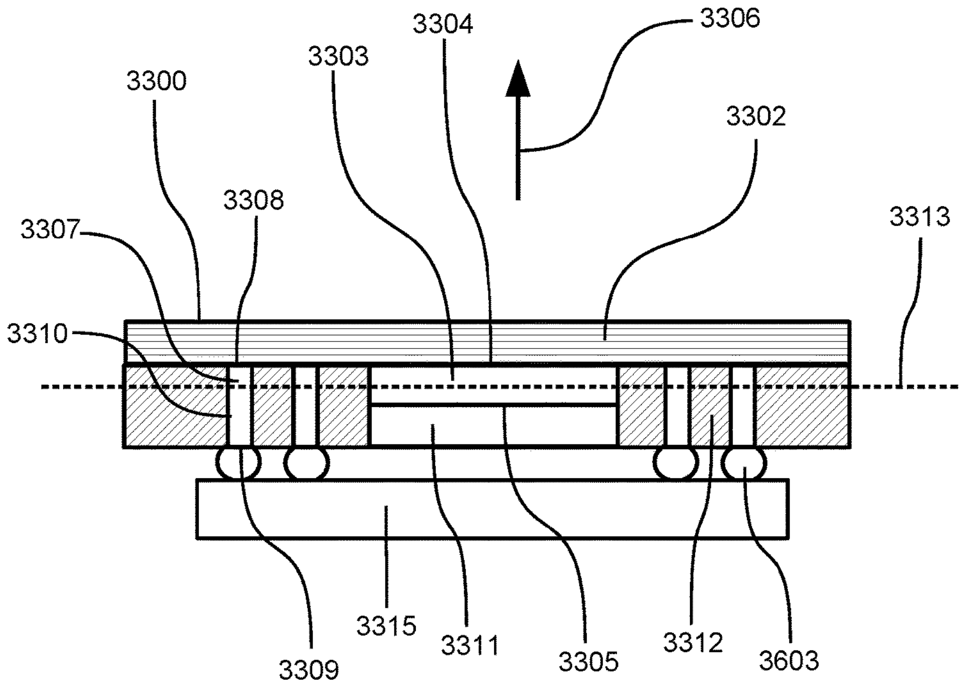
FIG. 33 shows a semiconductor package with a DRAM module.
Figure 34:
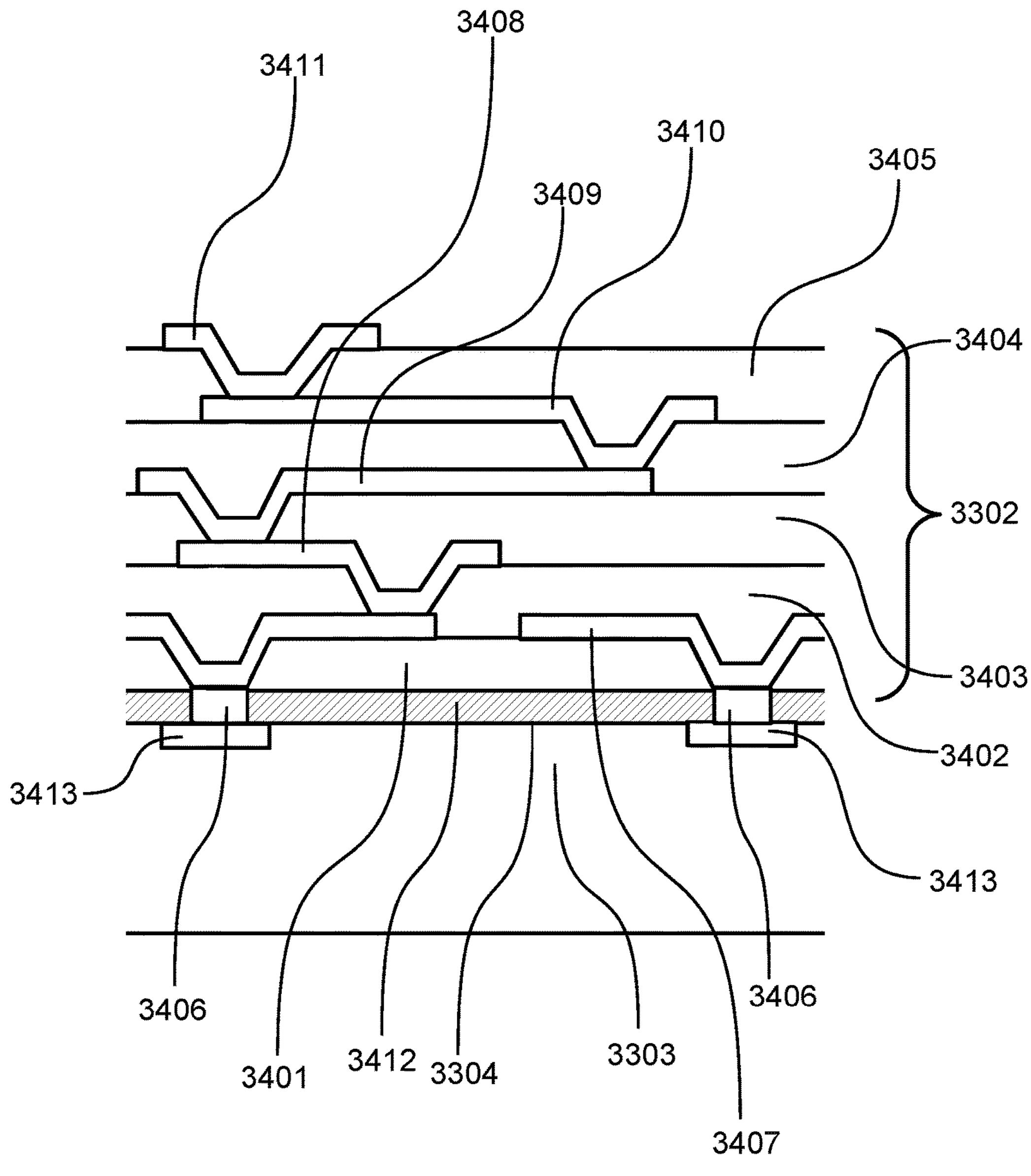
FIG. 34 shows a detailed redistribution structure.
Figure 35:
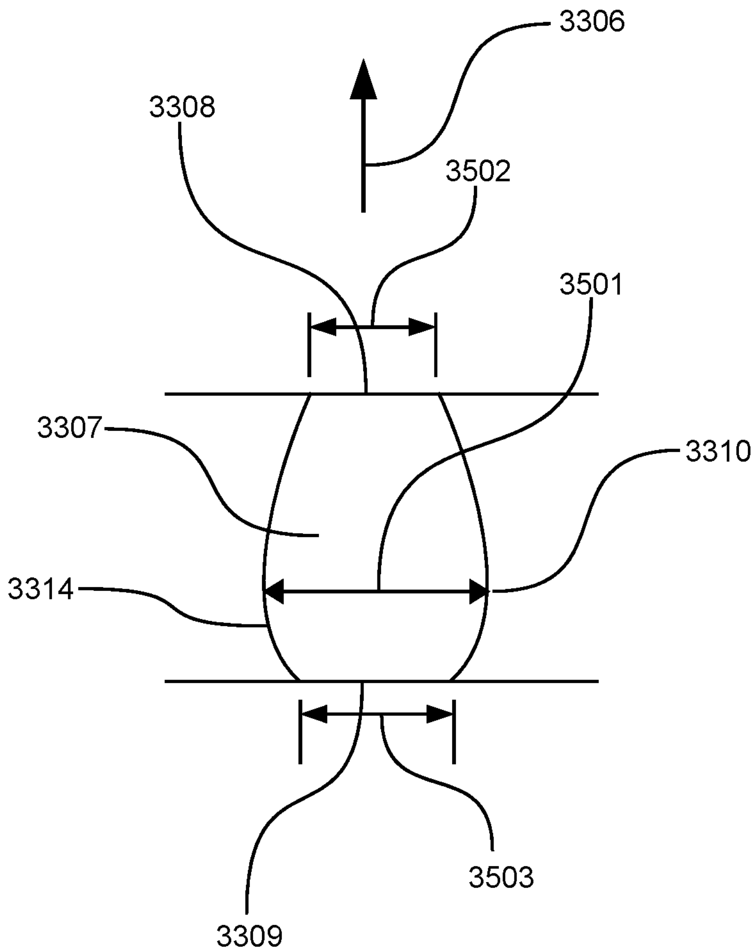
FIG. 35 shows an example of a metal post.
Figure 36:
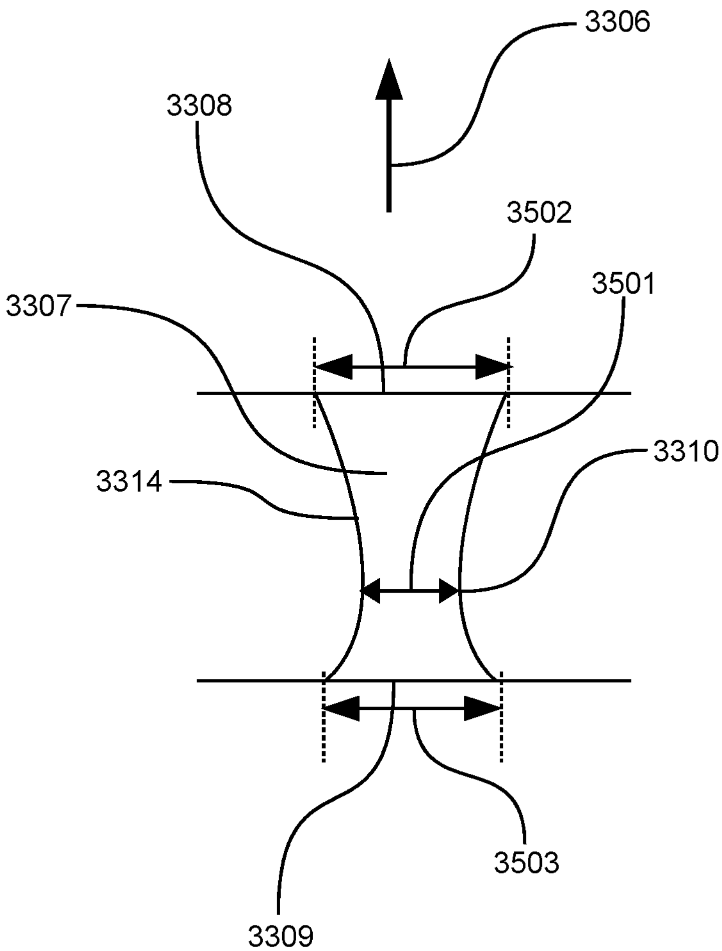
FIG. 36 shows another example of a metal post.
Figure 37:
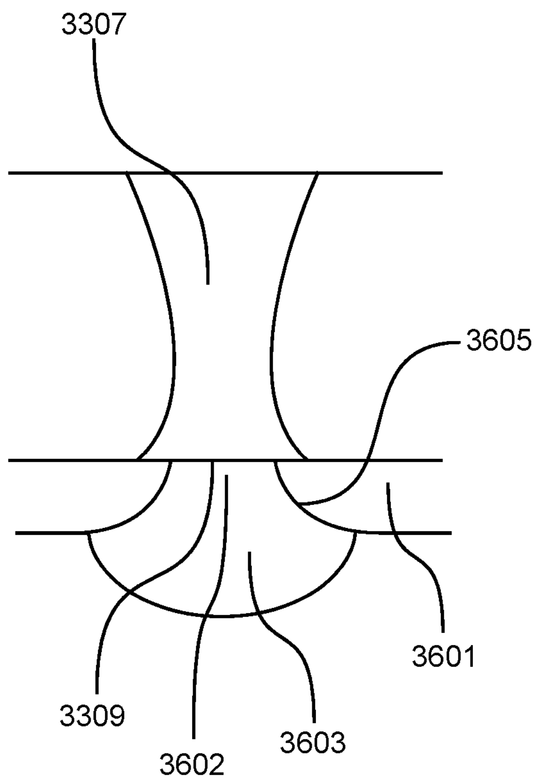
FIG. 37 shows a solder bump at an end of a metal post.
Figure 38:
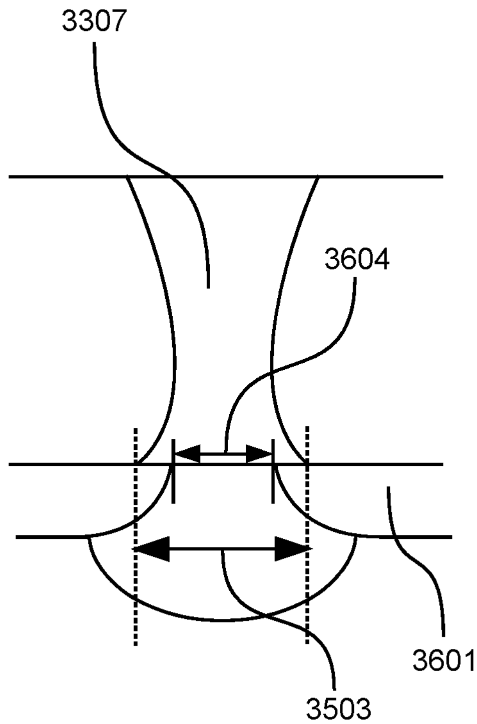
FIG. 38 shows a solder bump at an end of a metal post.
Figure 39:
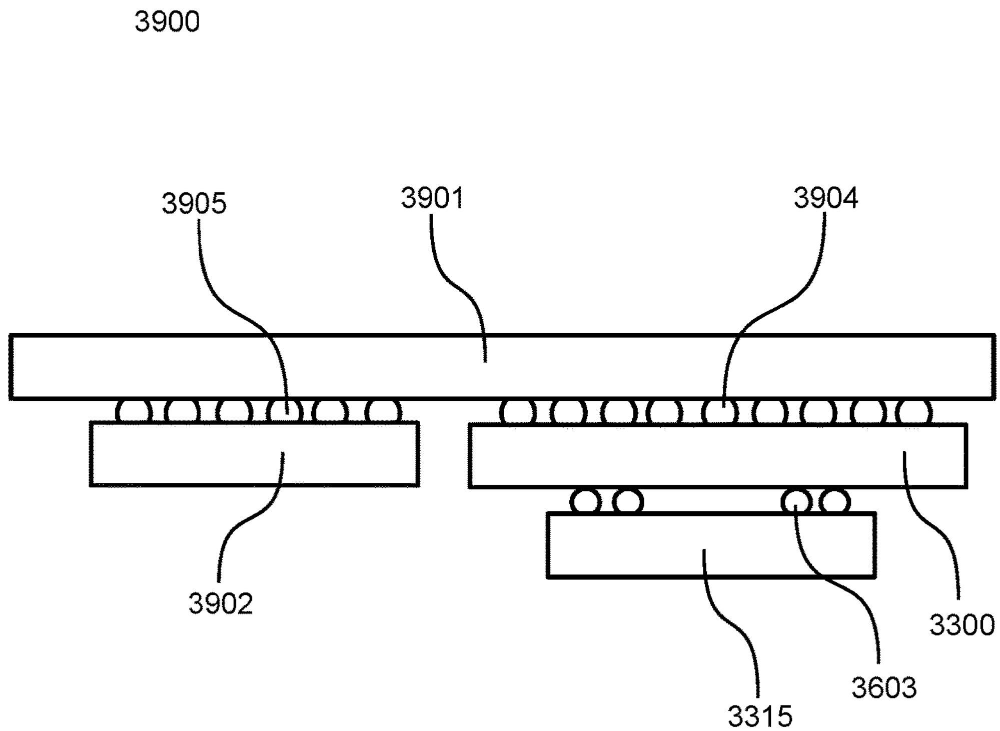
FIG. 39 shows a semiconductor device.

FIG. 33 shows a semiconductor package with a DRAM module. FIG. 34 shows a detailed redistribution structure. FIG. 35 shows an example of a metal post. FIG. 36 shows another example of a metal post. FIG. 37 shows a solder bump at an end of a metal post. FIG. 38 shows a solder bump at an end of a metal post. FIG. 39 shows a semiconductor device.

According to an embodiment, with reference to FIG. 33, FIG. 34, and FIG. 36, a semiconductor package 3300 comprises a redistribution structure 3302, a processor die 3303, and a metal post 3307. A length of the metal post 3307 is greater than a thickness of the processor die 3303. The metal post 3307 is placed beside the processor die 3303. The processor die 3303 has an active side 3304 and a back side 3305. The active side 3304 faces a first direction 3306. The active side 3304 of the processor die 3303 is connected to the redistribution structure 3302.

The metal post 3307 has a first end 3308, and a second end 3309. The metal post 3307 is connected to the redistribution structure 3302 at the first end 3308. The first end 3308 faces the first direction 3306. The first end 3308 has a first width 3502. The second end 3309 has a second width 3503. The first width 3502 is greater than the second width 3503. The metal post 3307 has a side surface 3314. The side surface 3314 is inwardly curved.

The metal post 3307 can be formed by plating. The material for the metal post 3307 can be Cu, Al, W, Au, solder, or other suitable electrically conductive material. In some embodiments, the material in the metal post 3307 is uniformed distributed. That is, the metal post 3307 does not include a non-uniform distribution of a mixture of two different metal materials. The processor die 3303 comprises at least a GPU (graphics processing unit).

With reference to FIG. 36, the structure of the metal post 3307 can provide a wider connection areas at both ends. The process of forming electrical connections at the ends of the metal post 3307 become easier because of the wider connection areas.

In some embodiments, with reference to FIG. 34, the semiconductor package 3300 further comprises a set of metal vias 3406. The set of metal vias 3406 are connected between the active side 3304 of the processor die 3303 and the redistribution structure 3302. The method of forming the metal vias 3406 can be plating. The material of the metal vias 3406 can be copper or aluminum, or the like.

With reference to FIG. 37, in some embodiments, the semiconductor package 3300 further comprises an insulating layer 3601 on a surface of the semiconductor package 3300. The insulating layer 3601 having at least an opening 3602. The insulating layer 3601 has an outwardly curved surface 3605 around the opening 3602. The insulating layer 3601 can be polyimide, BCB (Benzocyclobutene), PBO (PolyBenzobisOxazole), or other material having similar insulating properties.

With reference to FIG. 37, in some embodiments, the semiconductor package 3300 further comprises a solder bump 3603 located on the opening 3602. In some embodiments, the insulating layer 3601 is a polyimide layer. In some embodiments, with reference to FIG. 38, the opening 3602 has an opening width 3604. The opening width 3604 is smaller than the second width 3503 of the metal post 3307. In some embodiments, with reference to FIG. 33, the semiconductor package 3300 further comprises an adhesive layer 3311 located on the back side 3305 of the processor die 3303. The adhesive layer 3311 can be a die attach film (DAF), or the like.

According to another embodiment, with reference to FIG. 33, FIG. 34, and FIG. 36, a semiconductor package 3300 comprises a redistribution structure 3302, a processor die 3303, and a metal post 3307. The metal post 3307 is placed beside the processor die 3303. A length of the metal post 3307 is greater than a thickness of the processor die 3303. The processor die 3303 has an active side 3304 and a back side 3305. The active side 3304 faces a first direction 3306. The active side 3304 of the processor die 3303 is connected to the redistribution structure 3302.

The metal post 3307 has a first end 3308, a second end 3309 and a waist 3310. The metal post 3307 is connected to the redistribution structure 3302 at the first end 3308. The first end 3308 faces the first direction 3306. The first end 3308 has a first width 3502. The second end 3309 has a second width 3503. The waist 3310 has a waist width 3501. The first width 3502 is greater than the waist width 3501. The second width 3503 is greater than the waist width 3501. The metal post 3307 has a side surface 3314. The side surface 3314 is inwardly curved.

In some embodiments, with reference to FIG. 33, the semiconductor package 3300 further comprises a molding material 3312 filled between the processor die 3303 and the metal post 3307. The molding material 3312 can be a polymer composite material, such as epoxy resin with filler, epoxy acrylate with filler, or polymer with proper filler.

In some embodiments, no solder material is located between the processor die 3303 and the redistribution structure 3302. In some embodiments, an imaginary plane 3313 parallel with the redistribution structure 3302 and across a side surface of the processor die 3303 does not intercept with a solder material.

In some embodiments, with reference to FIG. 34, the redistribution structure 3302 further comprises a first sublayer 3401, a second sublayer 3402, and a third sublayer 3403. In some embodiments, the redistribution structure 3302 further comprises a fourth sublayer 3404, and a fifth sublayer 3405. The material of the first sublayer 3401, the second sublayer 3402, the third sublayer 3403, the fourth sublayer 3404, and the fifth sublayer 3405 can be polyimide, BCB (Benzocyclobutene), PBO (PolyBenzobisOxazole), or other material having similar insulating properties.

In some embodiments, the semiconductor package 3300 further comprises an insulating layer 3601 on a surface of the semiconductor package 3300. The insulating layer 3601 has at least an opening 3602. The insulating layer 3601 has an outwardly curved surface 3605 around the opening 3602. In some embodiments, the semiconductor package further comprises a solder bump 3603 located on the opening 3602.

According to another embodiment, with reference to FIG. 33, the semiconductor package 3300 comprises a redistribution structure 3302, a processor die 3303, and a metal post 3307. The metal post 3307 is placed beside the processor die 3303. A length of the metal post 3307 is greater than a thickness of the processor die 3303. The processor die 3303 has an active side 3304 and a back side 3305. The active side 3304 faces a first direction 3306. The active side 3304 of the processor die 3303 is connected to the redistribution structure 3302.

With reference to FIG. 36, the metal post 3307 has a first end 3308, a second end 3309 and a waist 3310. The metal post 3307 is connected to the redistribution structure 3302 at the first end 3308. The first end 3308 faces the first direction 3306. The first end 3308 has a first width 3502. The second end 3309 has a second width 3503. The waist 3310 has a waist width 3501. The first width 3502 is greater than the second width 3503. The second width 3503 is greater than the waist width 3501. The metal post 3307 has a side surface 3314. The side surface 3314 is inwardly curved.

In some embodiments, the semiconductor package 3300 further comprises a molding material 3312. The molding material 3312 surrounds the metal post 3307. In some embodiments, the metal post 3307 is a copper post. In some embodiments, the metal post 3307 is in direct contact with the molding material 3312 and no insulating layer is located between the molding material 3312 and the metal post 3307. The metal post 3307 does not go through a silicon substrate.

In some embodiments, with reference to FIG. 34, the redistribution structure 3302 further comprises a first sublayer 3401, a second sublayer 3402, and a third sublayer 3403. In some embodiments, the first sublayer 3401 comprises a set of first metal traces 3407. The second sublayer 3402 comprises a set of second metal traces 3408. The third sublayer 3403 comprises a set of third metal traces 3409. In some embodiments, the redistribution structure 3302 further comprises a fourth sublayer 3404 and a fifth sublayer 3405.

In some embodiments, the fourth sublayer 3404 comprises a set of fourth metal traces 3410, and the fifth sublayer 3405 comprises a set of fifth metal traces 3411. The material of the first traces 3407, the second traces 3408, the third traces 3409, the fourth traces 3410, and the fifth traces 3411 can be aluminum (Al), copper (Cu), tin (Sn), nickel (Ni), gold (Au), or silver (Ag), or other suitable electrically conductive material.

In some embodiments, with reference to FIG. 34, the semiconductor package 3300 further comprises a molding material 3412 filled between the processor die 3303 and the first sublayer 3401. In some embodiments, the semiconductor package 3300 further comprises a set of metal vias 3406 connected between the redistribution structure 3302 and the processor die 3303. In some embodiments, the processor die 3303 further comprises a set of metal pads 3413. The set of metal pads 3413 are connected to the set of metal vias 3406.

According to an embodiment, with reference to FIG. 33, FIG. 34, FIG. 36, FIG. 37, and FIG. 39, a semiconductor device 700 comprises a redistribution structure 3302, a processor die 3303, a metal post 3307, a DRAM module 3315, a printed circuit board 3901, and a flash memory 3902. The metal post 3307 is placed beside the processor die 3303. A length of the metal post 3307 is greater than a thickness of the processor die 3303. The processor die 3303 has an active side 3304 and a back side 3305. The active side 3304 faces a first direction 3306. The active side 3304 of the processor die 3303 is connected to the redistribution structure 3302.

The metal post 3307 has a first end 3308, and a second end 3309. The metal post 3307 is connected to the redistribution structure 3302 at the first end 3308. The first end 3308 faces the first direction 3306. The first end 3308 has a first width 3502. The second end 3309 has a second width 3503. The first width 3502 is greater than the second width 3503. The metal post 3307 has a side surface 3314. The side surface 3314 is inwardly curved.

The DRAM module 3315 is connected to the semiconductor package 3300 through a set of first solder bumps 3603. The printed circuit board 3901 is connected to the redistribution structure 3302 through a set of second solder bumps 3904. The flash memory 3902 is connected to the printed circuit board 3901 through a set of third solder bumps 3905.

In some embodiments, a first size of the first solder bump 3603 is smaller the a second size of the second solder bump 3904. In some embodiments, the first size of the first solder bump 3603 is smaller than a third size of the third solder bump 3905.

The material of the first solder bump 3603, the second solder bump 3904, and the third solder bump 3905 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

According to another embodiment, with reference to FIG. 33, FIG. 34, and FIG. 35, the semiconductor package 3300 comprises a redistribution structure 3302, a processor die 3303, and a metal post 3307. The processor die 3303 has an active side 3304 and a back side 3305. The active side 3304 faces a first direction 3306. The active side 3304 of the processor die 3303 is connected to the redistribution structure 3302.

The metal post 3307 has a first end 3308, a second end 3309 and a waist 3310. The metal post 3307 is connected to the redistribution structure 3302 at the first end 3308. The first end 3308 faces the first direction 3306. The first end 3308 has a first width 3502. The second end 3309 has a second width 3503. The waist 3310 has a waist width 3501. The first width 3502 is smaller than the waist width 3501. The second width 3503 is smaller than the waist width 3501. The metal post 3307 has a side surface 3314. The side surface 3314 is outwardly curved.

With reference to FIG. 35, in some embodiments, the material of the metal post 3307 can be a solder material. The space for placing the solder material can be formed by laser drill or photolithography. In some embodiments, the material of the metal post 3307 can be aluminum (Al), copper (Cu), tin (Sn), nickel (Ni), gold (Au), or silver (Ag), or other suitable electrically conductive material.

Some embodiments of the semiconductor package 3300 can provide a metal post 3307 with wider connection areas at both ends. Some embodiments of the semiconductor package 3300 can provide a metal post 3307 capable of connecting to a DRAM module 3315 through a molding material 3312. Some embodiments of the semiconductor package 3300 can provide a metal post 3307 with a wider connection area at an end connecting to a redistribution structure 3302.

Figure 40:
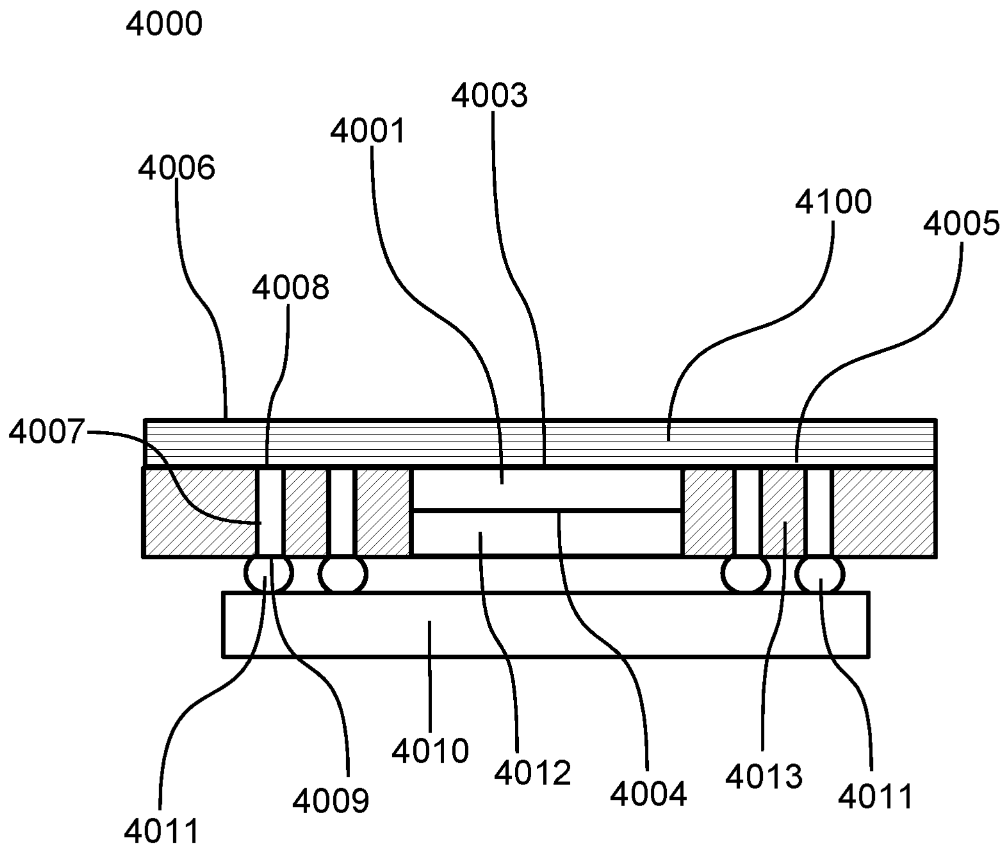
FIG. 40 shows a semiconductor device.
Figure 41:
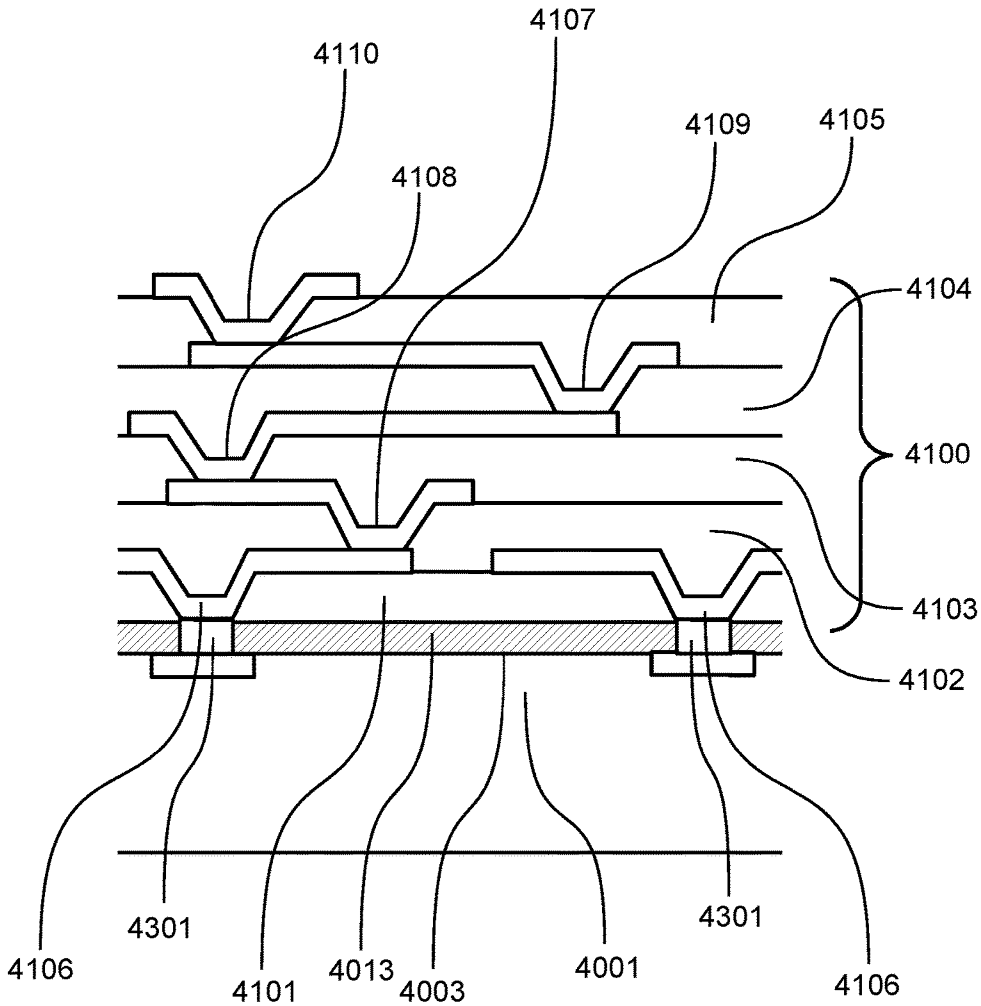
FIG. 41 shows a detailed redistribution structure.
Figure 42:
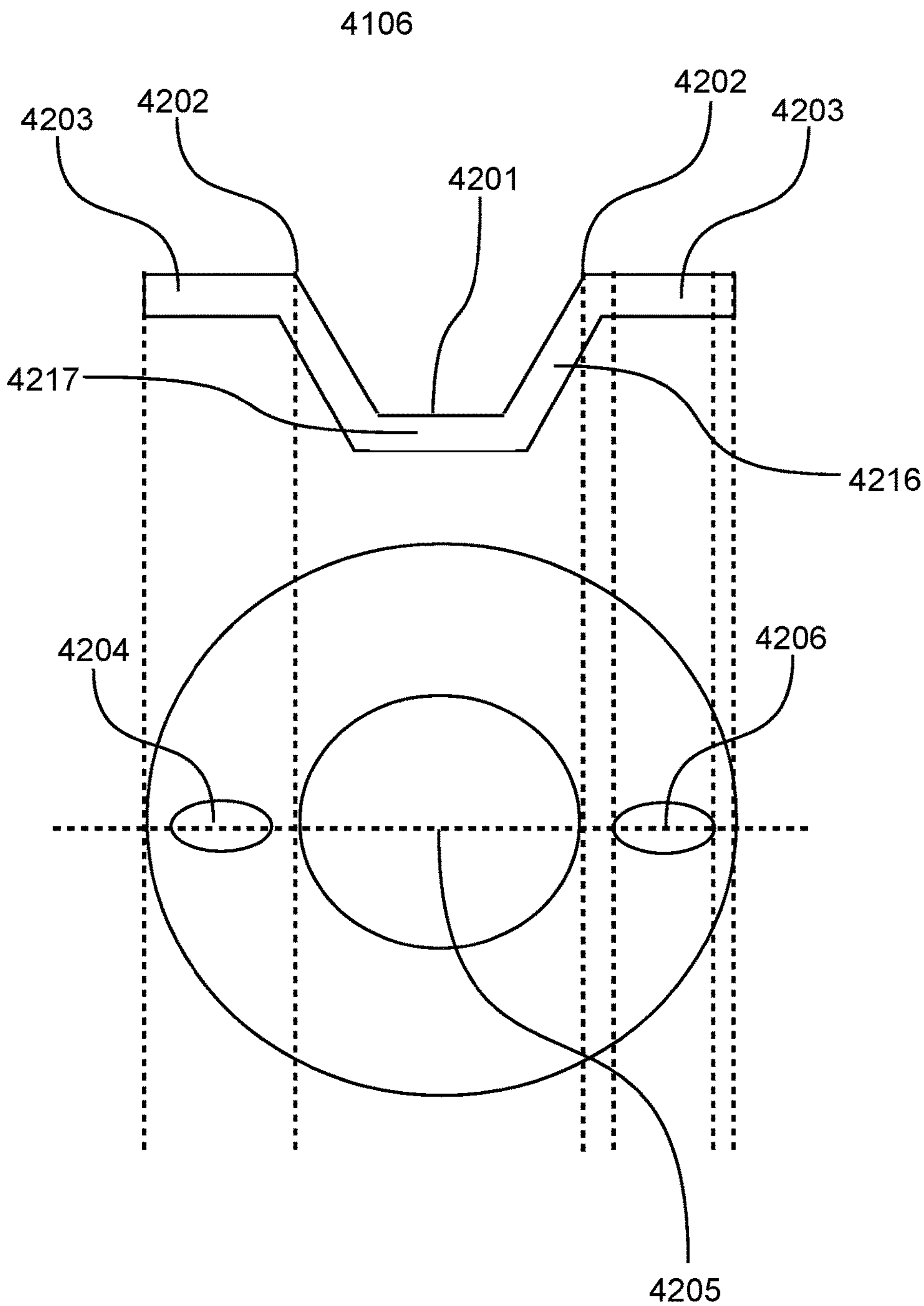
FIG. 42 shows a top view and a cross-sectional view of a conductive via.
Figure 43:
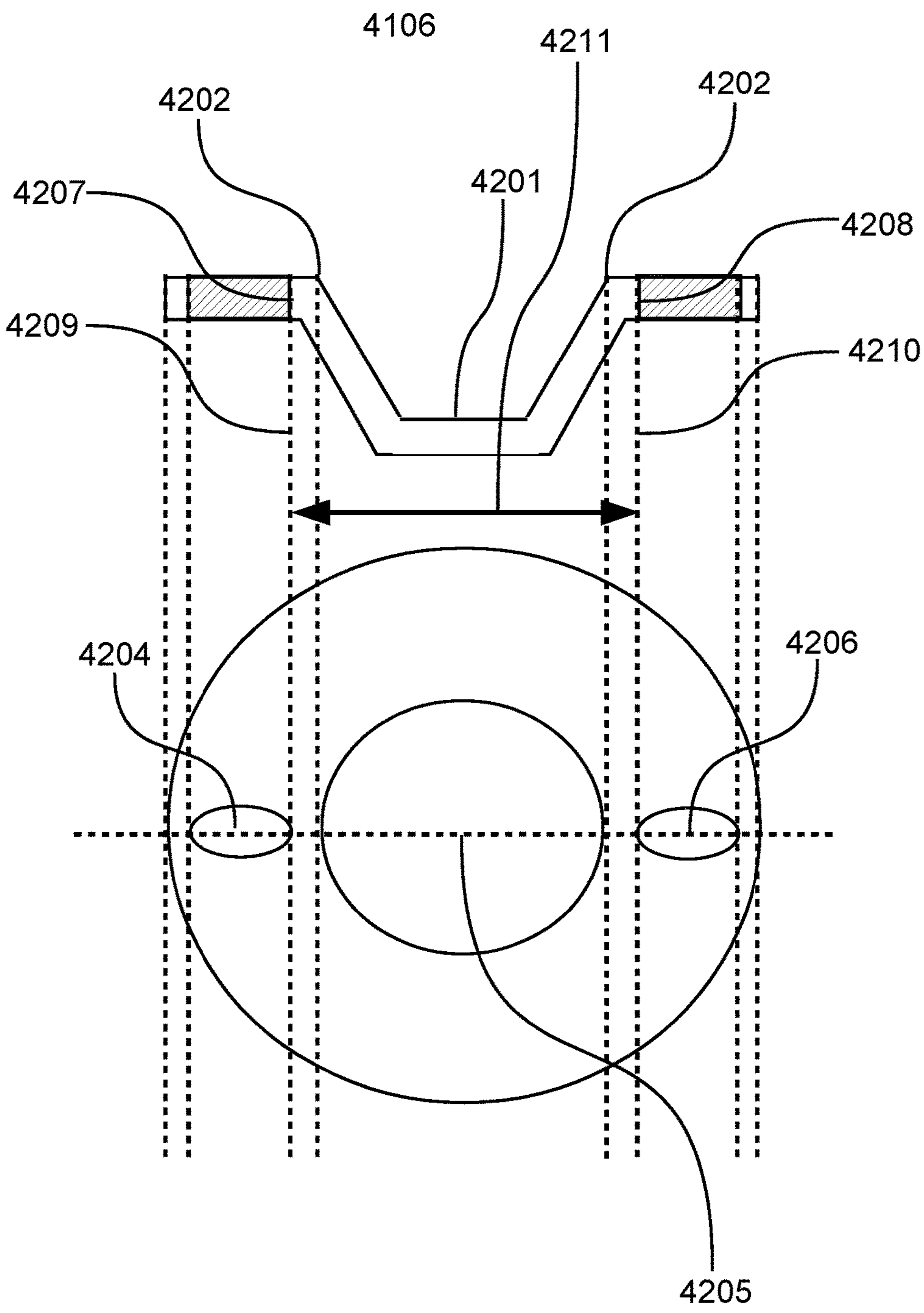
FIG. 43 shows a top view and a cross-sectional view of a conductive via.
Figure 44:
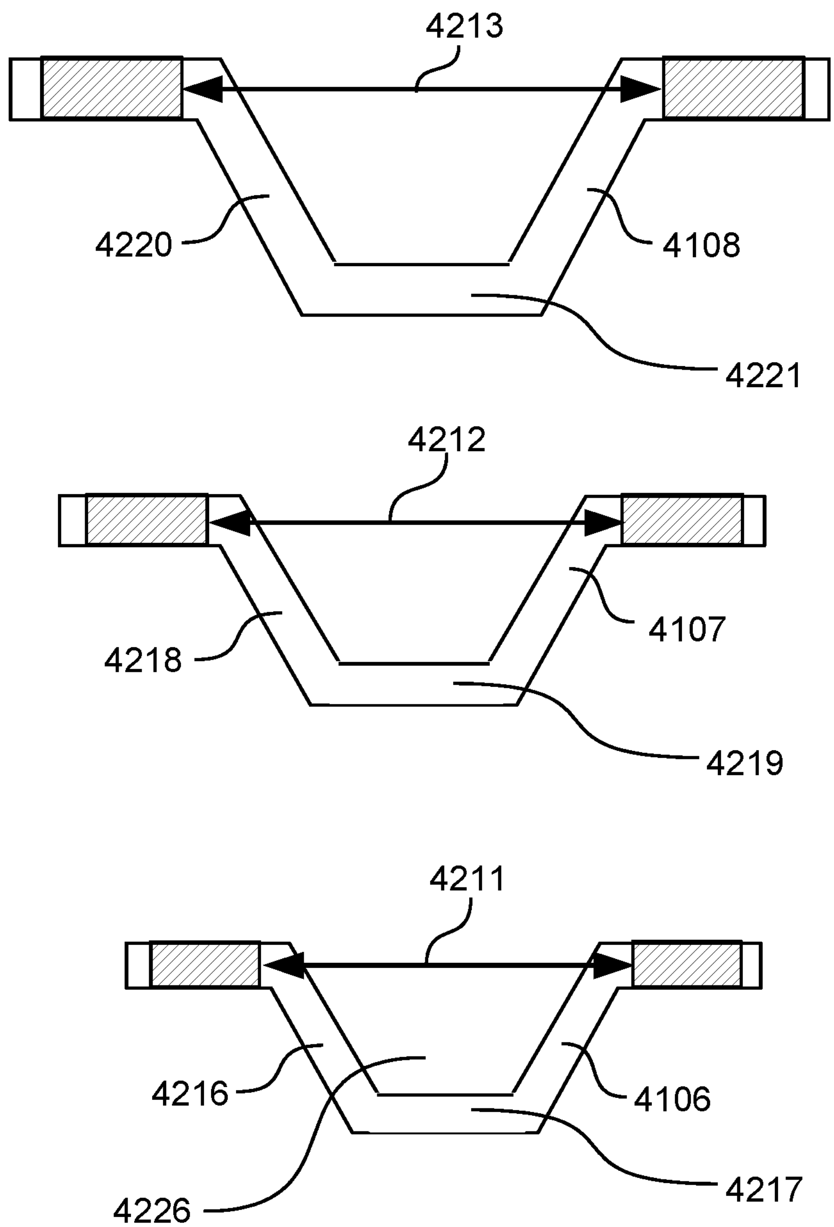
FIG. 44 shows cross-sectional views of conductive vias.
Figure 45:
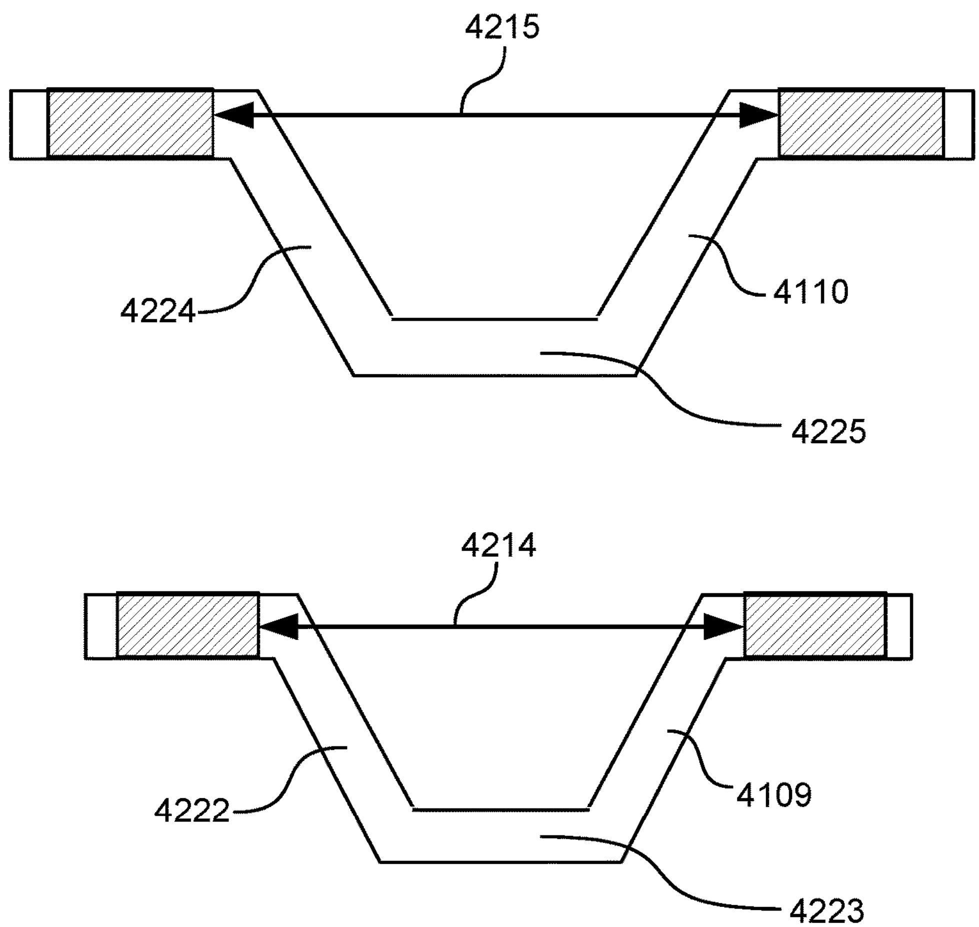
FIG. 45 shows cross-sectional views of conductive vias.
Figure 46:
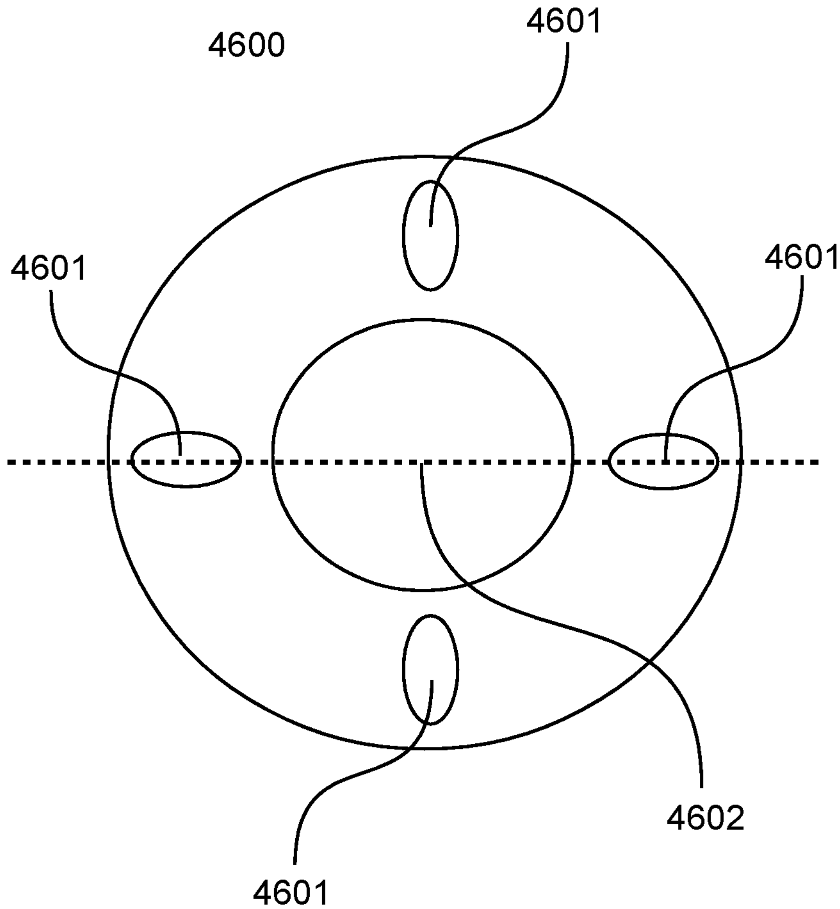
FIG. 46 shows a top view of a conductive via.
Figure 47:
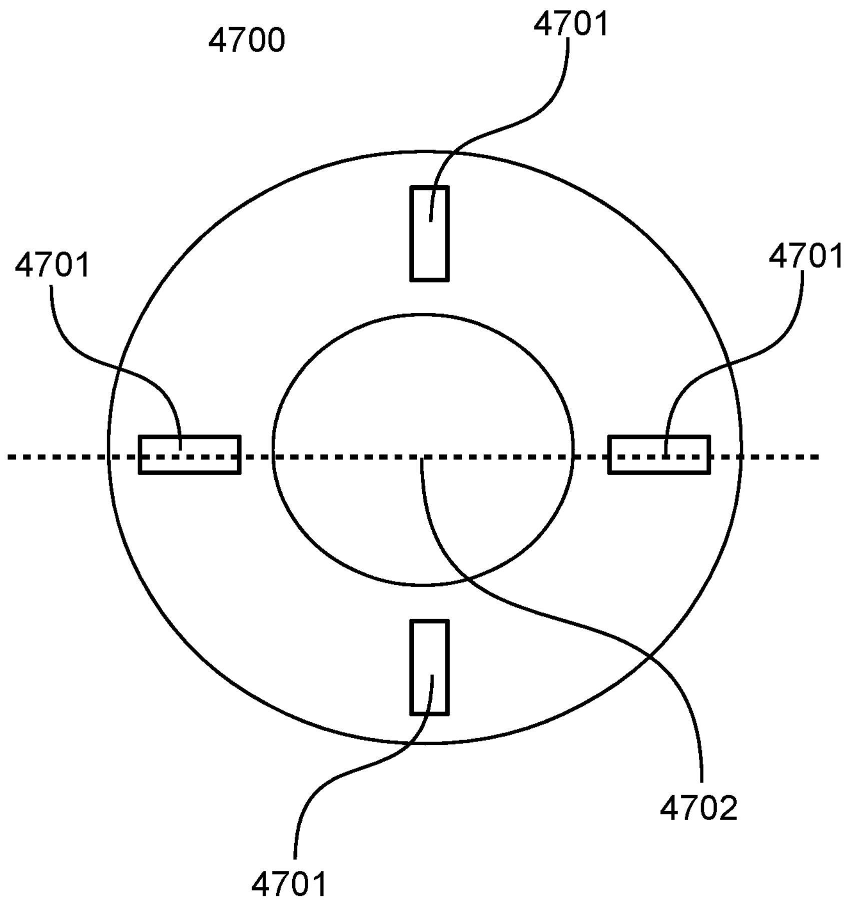
FIG. 47 shows a top view of a conductive via.
Figure 48:
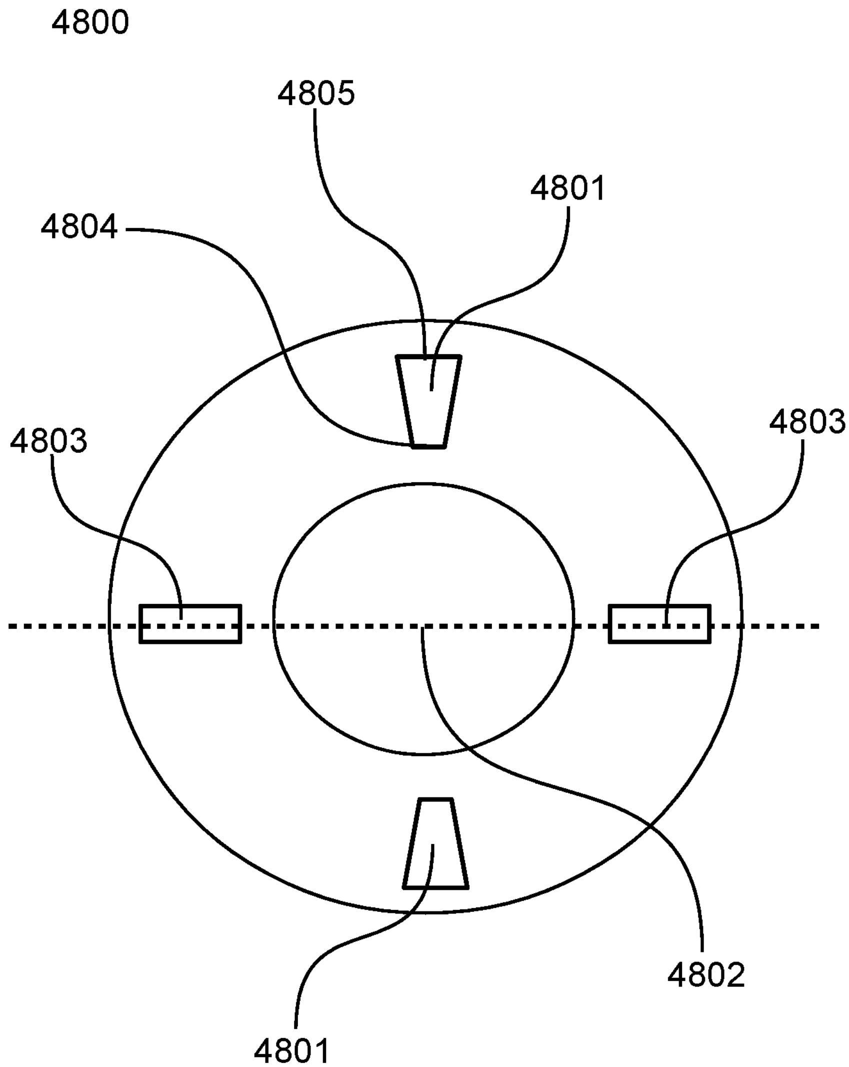
FIG. 48 shows a top view of a conductive via.
Figure 49:
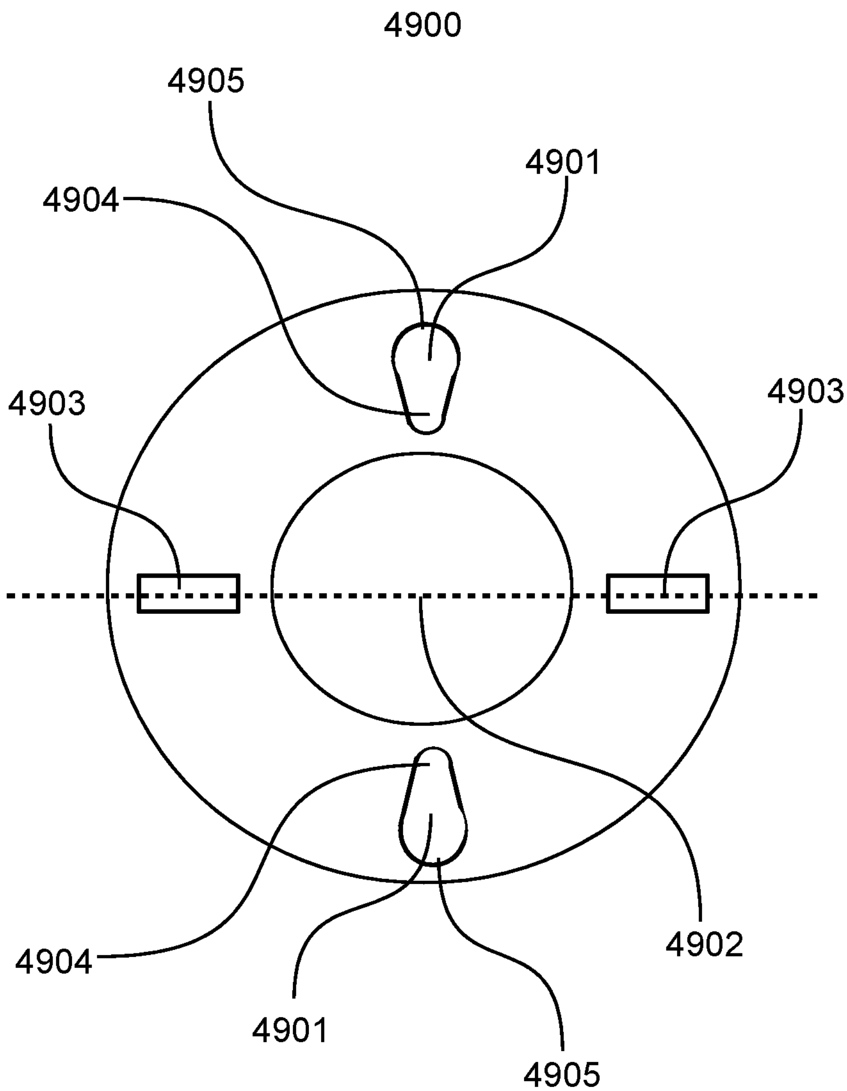
FIG. 49 shows a top view of a conductive via.

FIG. 40 shows a semiconductor device. FIG. 41 shows a detailed redistribution structure. FIG. 42 shows a top view and a cross-sectional view of a conductive via. FIG. 43 shows a top view and a cross-sectional view of a conductive via. FIG. 44 shows cross-sectional views of conductive vias. FIG. 45 shows cross-sectional views of conductive vias. FIG. 46 shows a top view of a conductive via. FIG. 47 shows a top view of a conductive via. FIG. 48 shows a top view of a conductive via. FIG. 49 shows a top view of a conductive via.

According to an embodiment, with reference to FIG. 42, a conductive via 4106 comprises a base 4201 and an annular flange 4203. The base 4201 is cup-shaped. The base 4201 has a rim 4202. The annular flange 4203 is connected to the rim 4202 of the base 4201. The annular flange 4203 has a first opening 4204.

In some embodiments, the conductive via 4106 further comprises a second opening 4206. The first opening 4204 and the second opening 4206 are symmetric with respect to a central point 4205 of the base 4201. In some embodiments, the conductive via 4106 is a copper via.

According to another embodiment, with reference to FIG. 41, FIG. 42, and FIG. 43, a redistribution structure 4100 comprises a first sublayer 4101, and a second sublayer 4102. The first sublayer 4101 comprises a first conductive via 4106.

The second sublayer 4102 is located on the first sublayer 4101. The second sublayer 4102 comprises a second conductive via 4107. The second conductive via 4107 is similar to the first conductive via 4106 in shape and structure. The second conductive via 4107 comprises a base 4201 and an annular flange 4203. The base 4201 is cup-shaped. The base has a rim 4202. The annular flange 4203 is connected to the rim 4202 of the base 4201. The annular flange 4203 has at least an opening 4204.

In some embodiments, the first conductive via 4106 comprises a base 4201 and an annular flange 4203. The base 4201 is cup-shaped. The base has a rim 4202. The annular flange 4203 is connected to the rim 4202 of the base 4201. The annular flange 4203 has at least an opening 4204.

In some embodiments, with reference to FIG. 41 and FIG. 42, the redistribution structure 4100 further comprises a third sublayer 4103. The third sublayer 4103 comprises a third conductive via 4108. The third conductive via 4108 is similar to the first conductive via 4106, which comprises a base 4201 and an annular flange 4203. The base 4201 is cup-shaped. The base 4201 has a rim 4202. The annular flange 4203 is connected to the rim 4202 of the base 4201. The annular flange 4203 has at least an opening 4204.

With reference to FIG. 43, the first opening 4204 has a first inner edge 4207. The second opening has a second inner edge 4208. The first inner edge 4207 is along a first axis 4209. The second inner edge 4208 is along a second axis 4210. The conductive via 4106 has an inner edge distance 4211 between the first axis 4209 and the second axis 4210.

In some embodiments, with reference to FIG. 43, FIG. 44, and FIG. 45, the first conductive via 4106 has a first inner edge distance 4211. The second conductive via 4107 has a second inner edge distance 4212. The third conductive via 4108 has a third inner edge distance 4213. In some embodiments, the first inner edge distance 4211 is smaller than the third inner edge distance 4213.

In some embodiments, with reference to FIG. 41 and FIG. 42, the redistribution structure 4100 further comprises a fourth sublayer 4104. The fourth sublayer 4104 comprises a fourth conductive via 4109. The fourth conductive via 4109 is similar to the first conductive via 4106, which comprises a base 4201 and an annular flange 4203. The base 4201 is cup-shaped. The base 4201 has a rim 4202. The annular flange 4203 is connected to the rim 4202 of the base 4201. The annular flange 4203 has at least an opening 4204.

In some embodiments, with reference to FIG. 41 and FIG. 42, the redistribution structure 4100 further comprises a fifth sublayer 4105. The fifth sublayer 4105 comprises a fifth conductive via 4110. The fifth conductive via 4110 is similar to the first conductive via 4106, which comprises a base 4201 and an annular flange 4203. The base 4201 is cup-shaped. The base 4201 has a rim 4202. The annular flange 4203 is connected to the rim 4202 of the base 4201. The annular flange 4203 has at least an opening 4204.

In some embodiments, with reference to FIG. 43, FIG. 44, and FIG. 45, the fourth conductive via 4109 has a fourth inner edge distance 4214. The fifth conductive via 4110 has a fifth inner edge distance 4215. In some embodiments, the first inner edge distance 4211 is smaller than the second inner edge distance 4212. In some embodiments, the second inner edge distance 4212 is smaller than the third inner edge distance 4213. In some embodiments, the third inner edge distance 4213 is smaller than the fourth inner edge distance 4214. In some embodiments, the fourth inner edge distance 4214 is smaller than the fifth inner edge distance 4215.

In some embodiments, with reference to FIG. 41 and FIG. 46, at least one of the first conductive 4106, the second conductive via 4107, the third conductive via 4108, the fourth conductive via 4109, and the fifth conductive via 4110 is a conductive via 4600. The conductive via 4600 has openings 4601. The openings 4601 are symmetric with respect to a central point 4602.

In some embodiments, with reference to FIG. 41 and FIG. 47, any one of the first conductive 4106, the second conductive via 4107, the third conductive via 4108, the fourth conductive via 4109, and the fifth conductive via 4110 can be a conductive via 4700. The conductive via 4700 has openings 4701. The openings 4701 are symmetric with respect to a central point 4702. The openings 4702 are rectangular in shape.

In some embodiments, any one of the first conductive 4106, the second conductive via 4107, the third conductive via 4108, the fourth conductive via 4109, and the fifth conductive via 4110 can be a conductive via 4800. The conductive via 4800 has openings 4801 and openings 4803. The openings 4801 and openings 4803 are symmetric with respect to a central point 4802. The openings 4803 are rectangular in shape. The openings 4801 are trapezoid in shape.

In some embodiments, with reference to FIG. 41 and FIG. 49, any one of the first conductive 4106, the second conductive via 4107, the third conductive via 4108, the fourth conductive via 4109, and the fifth conductive via 4110 can be a conductive via 4900. The conductive via 4900 has openings 4901 and openings 4903. The openings 4901 and openings 4903 are symmetric with respect to a central point 4902. The openings 4903 are rectangular in shape.

According to another embodiment, with reference to FIG. 40, FIG. 41, FIG. 42, and FIG. 46, a semiconductor device 4000 comprises a die 4001, a redistribution structure 4100, a metal post 4007, and a memory module 4010. The die 4001 has an active side 4003 and a back side 4004.

The redistribution structure 4100 has a front side 4005 and a back side 4006. The front side 4005 of the redistribution structure 4100 is connected to the active side 4003 of the die 4001 through a set of metal pillars 4301. The redistribution structure 4100 comprises a conductive via 4600. The conductive via 4600 has at least an opening 4601.

The metal post 4007 has a first end 4008 and a second end 4009. The metal post 4007 is connected to the front side 4005 of the redistribution structure 4100 at the first end 4008. The memory module 4010 is connected to the metal post 4007 through a solder bump 4011.

In some embodiments, with reference to FIG. 47, FIG. 48, and FIG. 49, the redistribution structure 4100 comprises a conductive via 4700. The conductive via 4700 has at least an opening 4701. In some embodiments, the redistribution structure 4100 comprises a conductive via 4800. The conductive via 4800 has at least an opening 4801. In some embodiments, the redistribution structure 4100 comprises a conductive via 4900. The conductive via 4900 has at least an opening 4901.

In some embodiments, with reference to FIG. 49, the opening 4901 has an inner end 4904 and an outer end 4905. The inner end 4904 has a first curvature. The outer end 4905 has a second curvature. The first curvature is larger than the second curvature.

In some embodiments, the opening 4801 has a trapezoid shape. The opening 4801 has an inner side 4804 and an outer side 4805. The inner side 4804 has a first width. The outer side 4805 has a second width. The first width is smaller than the second width.

In some embodiments, with reference to FIG. 41 and FIG. 46, the redistribution structure 4100 comprises a first sublayer 4101. The conductive via 4600 is formed in the first sublayer 4101. In some embodiments, the first sublayer 4101 comprises a polyimide and the polyimide fills the opening 4601. In some embodiments, the redistribution structure 4100 further comprises a second sublayer 4102. The conductive via 4600 is formed in the second sublayer 4102.

In some embodiments, the second sublayer 4102 comprises a polyimide and the polyimide fills the opening 4601. In some embodiments, the redistribution structure 4100 further comprises a third sublayer 4103. The conductive via 4600 is formed in the third sublayer 4103. In some embodiments, the third sublayer 4103 comprises a polyimide and the polyimide fills the opening 4601.

In some embodiments, the redistribution structure 4100 further comprises a fourth sublayer 4104. The conductive via 4600 is formed in the fourth sublayer 4104. In some embodiments, the fourth sublayer 4104 comprises a polyimide and the polyimide fills the opening 4601. In some embodiments, the redistribution structure 4100 further comprises a fifth sublayer 4105. The conductive via 4600 is formed in the fifth sublayer 4105.

In some embodiments, the fifth sublayer 4105 comprises a polyimide and the polyimide fills the opening 4601. In some embodiments, the semiconductor device 4000 further comprises an adhesive layer 4012 located on the back side 4004 of the die 4001. In some embodiments, the semiconductor device 4000 further comprises a molding material 4013 filled between the metal post 4007 and the die 4001.

With reference to FIG. 46, FIG. 47, FIG. 48, FIG. 49, and FIG. 50, any one of the openings 4601, 4701, 4801, 4803, 4901, 4903, and 5001 can be implemented in any one of the first conductive via 4106, the second conductive via 4107, the third conductive via 4108, the fourth conductive via 4109, and the fifth conductive via 4110.

The material of the first sublayer 4101, the second sublayer 4102, the third sublayer 4103, the fourth sublayer 4004, and the fifth sublayer 4005 can be polyimide, BCB (Benzocyclobutene), PBO (PolyBenzobisOxazole), or other material having similar insulating properties.

The material of the first conductive via 4106, the second conductive via 4107, the third conductive via 4108, the fourth conductive via 4109, and the fifth conductive via 4110 can be aluminum (Al), copper (Cu), tin (Sn), nickel (Ni), gold (Au), or silver (Ag), or other suitable electrically conductive material.

The metal post 4007 can be formed by plating. The material for the metal post 4007 can be Cu, Al, W, Au, solder, or other suitable electrically conductive material. In some embodiments, the material in the metal post 4007 is uniformed distributed. That is, the metal post 4007 does not include a non-uniform distribution of a mixture of two different metal materials.

The first conductive via 4106, the second conductive via 4107, the third conductive via 4108, the fourth conductive via 4109, and the fifth conductive via 4110 can be formed by plating. The material for the plating can be Cu, Al, W, Au, solder, or other suitable electrically conductive material.

In some embodiments, any one of the first sublayer 4101, the second sublayer 4102, the third sublayer 4103, the fourth sublayer 4104, and the fifth sublayer 4105 can comprise a conductive via 4700. The conductive via 4700 has openings 4701. The openings 4701 are symmetric with respect to a central point 4702. The openings 4701 are rectangular in shape. A polyimide fills in the openings 4701. In some embodiments, the polyimide can be replaced by BCB (Benzocyclobutene), PBO (PolyBenzobisOxazole), or other material having similar insulating properties.

In some embodiments, any one of the first sublayer 4101, the second sublayer 4102, the third sublayer 4103, the fourth sublayer 4104, and the fifth sublayer 4105 can comprise a conductive via 4800. The conductive via 4800 has openings 4801 and openings 4803. The openings 4801 and openings 4803 are symmetric with respect to a central point 4802. A polyimide fills in the openings 4801 and openings 4803. In some embodiments, the polyimide can be replaced by BCB (Benzocyclobutene), PBO (PolyBenzobisOxazole), or other material having similar insulating properties.

In some embodiments, any one of the first sublayer 4101, the second sublayer 4102, the third sublayer 4103, the fourth sublayer 4104, and the fifth sublayer 4105 can comprise a conductive via 4900. The conductive via 4900 has openings 4901 and openings 4903. The openings 4901 and openings 4903 are symmetric with respect to a central point 4902. A polyimide fills in the openings 4901 and openings 4903. In some embodiments, the polyimide can be replaced by BCB (Benzocyclobutene), PBO (PolyBenzobisOxazole), or other material having similar insulating properties.

Figure 50:
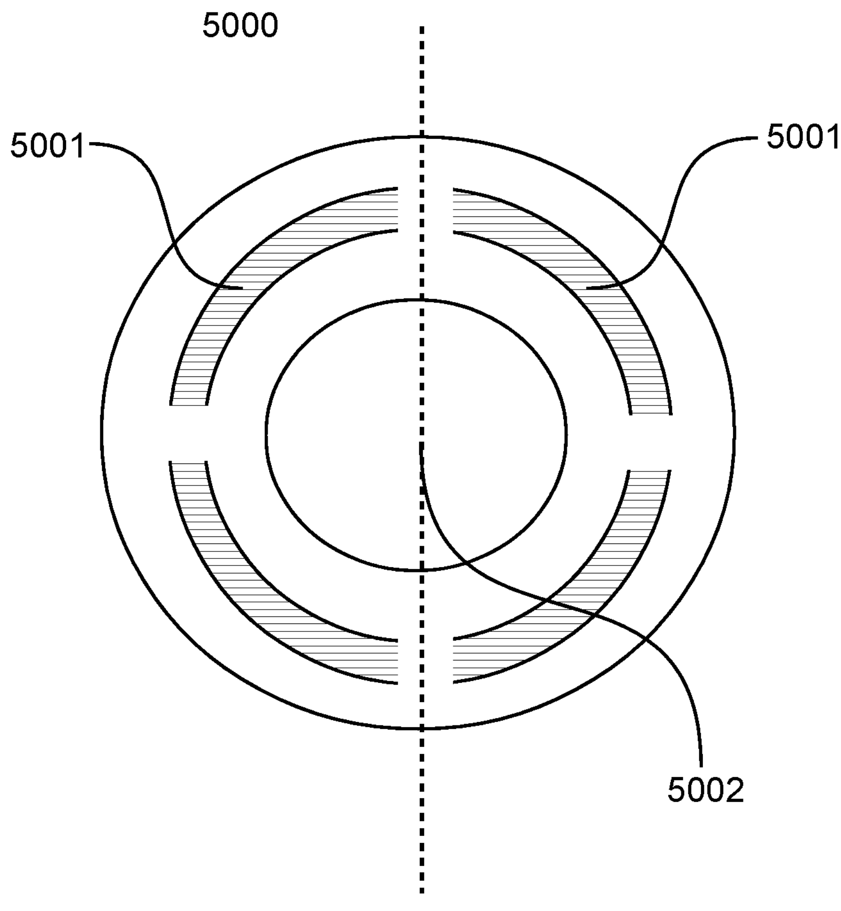
FIG. 50 shows a top view of a conductive via.

In some embodiments, with reference to FIG. 50, any one of the first conductive via 4106, the second conductive via 4107, the third conductive via 4108, the fourth conductive via 4109, and the fifth conductive via 4110 can be a conductive via 5000. The conductive via 5000 has openings 5001. The openings 5001 are symmetric with respect to an axis 5002. The openings 5001 are arc segments in shape.

In some embodiments, with reference to FIG. 42, the conductive via 4106 comprises a base 4201 and an annular flange 4203. The base 4201 is cup-shaped. The base 4201 has a rim 4202, a slanting wall 4216, and a bottom side 4217. The annular flange 4203 is connected to the rim 4202 of the base 4201. The annular flange 4203 has a first opening 4204. In some embodiments, a first thickness of the annular flange 4203 is substantially the same as a second thickness of the bottom side 4217.

In some embodiments, with reference to FIG. 44 and FIG. 45, the conductive via 4107, the conductive via 4108, the conductive via 4109, and the conductive via 4110 have a structure similar to that of the conductive via 4106. The conductive via 4107 has a slanting wall 4218 and a bottom side 4219. The conductive via 4108 has a slanting wall 4220 and a bottom side 4221. The conductive via 4109 has a slanting wall 4222 and a bottom side 4223. The conductive via 4110 has a slanting wall 4224 and a bottom side 4225.

In some embodiments, with reference to FIG. 41 and FIG. 44, an inner portion 4226 of the cup-shaped conductive via 4106 is filled with an insulating material. The insulating material can be a polyimide.

In some embodiments, with reference to FIG. 42, a stress may exist on the bottom side 4217. The source of the stress can be from the flange 4203 and the slanting wall 4216. The stress can be released by the implementation of the openings 4204 and 4206. Stress-induced voiding can also be avoided by the openings. Similarly, with reference to FIG. 46, FIG. 47, FIG. 48, FIG. 49, and FIG. 50, the openings 4601, 4701, 4801, 4803, 4901, 4903, and 5001 can release stresses coming from corresponding flanges and slanting side walls. The openings 4601, 4701, 4801, 4803, 4901, 4903, and 5001 can avoid stress-induced voiding.

What is claimed is:

1. A semiconductor device, comprising:

a redistribution structure;

a processor die, the processor die having an active side and a back side, the active side facing a first direction, the active side of the processor die being connected to the redistribution structure; and a metal post, the metal post being placed beside the processor die, the metal post having a first end, a second end and a waist, the metal post being connected to the redistribution structure at the first end, the first end facing the first direction, the first end having a first width, the second end having a second width, the waist having a waist width, the first width being greater than the waist width, the second width being greater than the waist width, the metal post having a side surface, the side surface being inwardly curved;

wherein the semiconductor device further comprises a passivation layer, an insulating layer, and a plurality of conductive pillars, the passivation layer being located on the active side of the processor die, the insulating layer being located on the passivation layer, the redistribution structure being connected to the processor die through the conductive pillars, the conductive pillars passing through the insulating layer, the redistribution structure having a front surface, the insulating layer having a side surface, the front surface of the redistribution structure, the side surface of the insulating layer, and the passivation layer forming a recess, the recess being filled by a molding material.

2. The semiconductor device of claim 1, wherein the side surface of the insulating layer is outwardly curved.

3. The semiconductor device of claim 1, wherein the side surface of the insulating layer is inwardly curved.

4. The semiconductor device of claim 1, wherein the side surface of the insulating layer has an outermost point, and there is a horizontal shift between the outermost point of the insulating layer and an edge of the processor die.

5. The semiconductor device of claim 1, wherein the redistribution structure comprises a metal layer, the metal layer comprising a plurality of holes, the holes having at least two different sizes.

6. The semiconductor device of claim 5, wherein at least a subset of the holes forms a mesh type area and at least a diameter of one of the holes is greater than a width of inner lines of the mesh type area.

7. A semiconductor device, comprising:

a redistribution structure;

a processor die, the processor die having an active side and a back side, the active side facing a first direction, the active side of the processor die being connected to the redistribution structure; and a metal post, the metal post being placed beside the processor die, the metal post having a first end, a second end and a waist, the metal post being connected to the redistribution structure at the first end, the first end facing the first direction, the first end having a first width, the second end having a second width, the waist having a waist width, the first width being greater than the second width, the second width being greater than the waist width, the metal post having a side surface, the side surface being inwardly curved;

wherein the semiconductor device further comprises a passivation layer, an insulating layer, and a plurality of conductive pillars, the passivation layer being located on the active side of the processor die, the insulating layer being located on the passivation layer, the redistribution structure being connected to the processor die through the conductive pillars, the conductive pillars passing through the insulating layer, the redistribution structure having a front surface, the insulating layer having a side surface, the front surface of the redistribution structure, the side surface of the insulating layer, and the passivation layer forming a recess, the recess being filled by a molding material.

8. The semiconductor device of claim 7, wherein the side surface of the insulating layer is outwardly curved.

9. The semiconductor device of claim 7, wherein the side surface of the insulating layer is inwardly curved.

10. The semiconductor device of claim 7, wherein the side surface of the insulating layer has an outermost point, and there is a horizontal shift between the outermost point of the insulating layer and an edge of the passivation layer.

11. The semiconductor device of claim 7, wherein the redistribution structure comprises a metal layer, the metal layer comprising a plurality of holes, the holes having at least two different sizes.

12. The semiconductor device of claim 11, wherein at least a subset of the holes forms a mesh type area and at least a diameter of one of the holes is greater than a width of inner lines of the mesh type area.

13. A semiconductor device, comprising:

a redistribution structure;

a processor die, the processor die having an active side and a back side, the active side facing a first direction, the active side of the processor die being connected to the redistribution structure;

a metal post, the metal post being placed beside the processor die, the metal post having a first end, and a second end, the metal post being connected to the redistribution structure at the first end, the first end facing the first direction, the first end having a first width, the second end having a second width, the first width being greater than the second width, the metal post having a side surface, the side surface being inwardly curved;

a DRAM module, the DRAM module being connected to the metal post through at least a first solder bump;

a printed circuit board, the printed circuit board being connected to the redistribution structure through a set of second solder bumps; and a flash memory, the flash memory being connected to the printed circuit board through a set of third solder bumps;

wherein the semiconductor device further comprises a passivation layer, an insulating layer, and a plurality of conductive pillars, the passivation layer being located on the active side of the processor die, the insulating layer being located on the passivation layer, the redistribution structure being connected to the processor die through the conductive pillars, the conductive pillars passing through the insulating layer, the redistribution structure having a front surface, the insulating layer having a side surface, the front surface of the redistribution structure, the side surface of the insulating layer, and the passivation layer forming a recess, the recess being filled by a molding material.

14. The semiconductor device of claim 13, wherein the side surface of the insulating layer is outwardly curved.

15. The semiconductor device of claim 13, wherein the side surface of the insulating layer is inwardly curved.

16. The semiconductor device of claim 13, wherein the side surface of the insulating layer has an outermost point, and there is a horizontal shift between the outermost point of the insulating layer and an edge of the passivation layer.

17. The semiconductor device of claim 13, wherein the redistribution structure comprises a metal layer, the metal layer comprising a plurality of holes, the holes having at least two different sizes, at least a subset of the holes forming a mesh type area.

* * * * *